(12) United States Patent
Matsuno et al.

(10) Patent No.: US 11,856,765 B2
(45) Date of Patent: Dec. 26, 2023

(54) THREE-DIMENSIONAL MEMORY DEVICE INCLUDING LOW-K DRAIN-SELECT-LEVEL ISOLATION STRUCTURES AND METHODS OF FORMING THE SAME

(71) Applicant: SANDISK TECHNOLOGIES LLC, Addison, TX (US)

(72) Inventors: Koichi Matsuno, San Jose, CA (US); Masaaki Higashitani, Cupertino, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 303 days.

(21) Appl. No.: 17/317,578

(22) Filed: May 11, 2021

(65) Prior Publication Data
US 2022/0367499 A1 Nov. 17, 2022

(51) Int. Cl.
| | |
|---|---|
| H01L 27/11582 | (2017.01) |
| H10B 41/27 | (2023.01) |
| H10B 41/10 | (2023.01) |
| H10B 41/35 | (2023.01) |
| H10B 43/10 | (2023.01) |
| H10B 43/27 | (2023.01) |
| H10B 43/35 | (2023.01) |

(52) U.S. Cl.
CPC ............ *H10B 41/27* (2023.02); *H10B 41/10* (2023.02); *H10B 41/35* (2023.02); *H10B 43/10* (2023.02); *H10B 43/27* (2023.02); *H10B 43/35* (2023.02)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 9,515,085 B2 | 12/2016 | Rabkin et al. | |
| 10,256,247 B1 | 4/2019 | Kanakamedala et al. | |
| 10,290,643 B1 | 5/2019 | Kai et al. | |
| 10,373,969 B2 | 8/2019 | Zhang et al. | |
| 10,490,564 B2 | 11/2019 | Mushiga et al. | |
| 10,490,569 B2 | 11/2019 | Mushiga et al. | |
| 10,553,599 B1 | 2/2020 | Chen et al. | |
| 10,586,803 B2 | 3/2020 | Mushiga et al. | |

(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Christopher A Johnson
(74) *Attorney, Agent, or Firm* — THE MARBURY LAW GROUP PLLC

(57) ABSTRACT

A three-dimensional memory device includes an alternating stack of insulating layers and electrically conductive layers located over a substrate, an array of memory opening fill structures located within an array of memory openings vertically extending through the alternating stack, and a drain-select-level isolation structure vertically extending through drain-select-level electrically conductive layers between two rows of memory opening fill structures. The drain-select-level isolation structure may comprise a low-k dielectric material or an air gap.

14 Claims, 64 Drawing Sheets

(56) References Cited

U.S. PATENT DOCUMENTS

| | | | |
|---|---|---|---|
| 10,707,233 | B1 | 7/2020 | Cui et al. |
| 10,741,576 | B2 | 8/2020 | Nishikawa et al. |
| 10,777,575 | B1 | 9/2020 | Cui et al. |
| 10,818,542 | B2 | 10/2020 | Cui et al. |
| 10,937,800 | B2 | 3/2021 | Kim et al. |
| 2009/0180324 | A1 | 7/2009 | Ramaswamy et al. |
| 2019/0027489 | A1 | 1/2019 | Orimoto et al. |
| 2019/0326306 | A1 | 10/2019 | Mushiga et al. |
| 2019/0326307 | A1 | 10/2019 | Mushiga et al. |
| 2019/0326313 | A1 | 10/2019 | Cui et al. |
| 2020/0051995 | A1* | 2/2020 | Tanaka .................. H10B 41/50 |
| 2020/0058673 | A1 | 2/2020 | Nishikawa et al. |
| 2020/0098771 | A1 | 3/2020 | Nishikawa et al. |
| 2020/0251488 | A1 | 8/2020 | Iwai et al. |
| 2021/0082806 | A1* | 3/2021 | Hopkins ............. H01L 23/5283 |
| 2023/0016518 | A1 | 1/2023 | Lien et al. |

OTHER PUBLICATIONS

U.S. Appl. No. 16/828,129, filed Mar. 24, 2020, SanDisk Technologies LLC.

U.S. Appl. No. 17/317,479, filed May 11, 2021, SanDisk Technologies LLC.

ISR—Notification of Transmittal of The International Search Report and Written Opinion of the International Searching Authority for International Patent Application No. PCT/US2021/065390, dated Jun. 1, 2022, 11 pages.

USPTO Office Communication, Non-Final Office Action for U.S. Appl. No. 17/317,479, dated Apr. 26, 2023, 15 pages.

\* cited by examiner

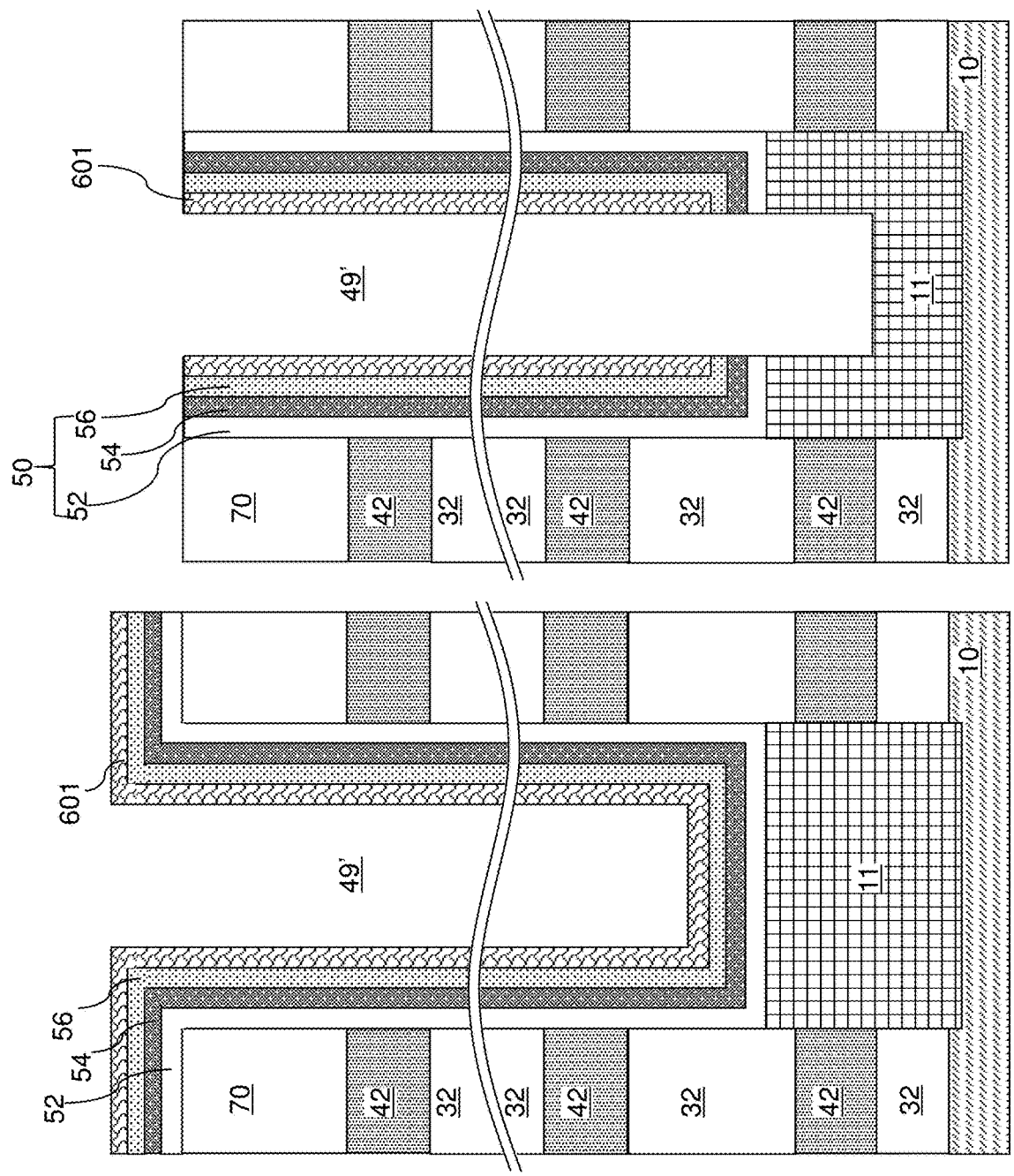

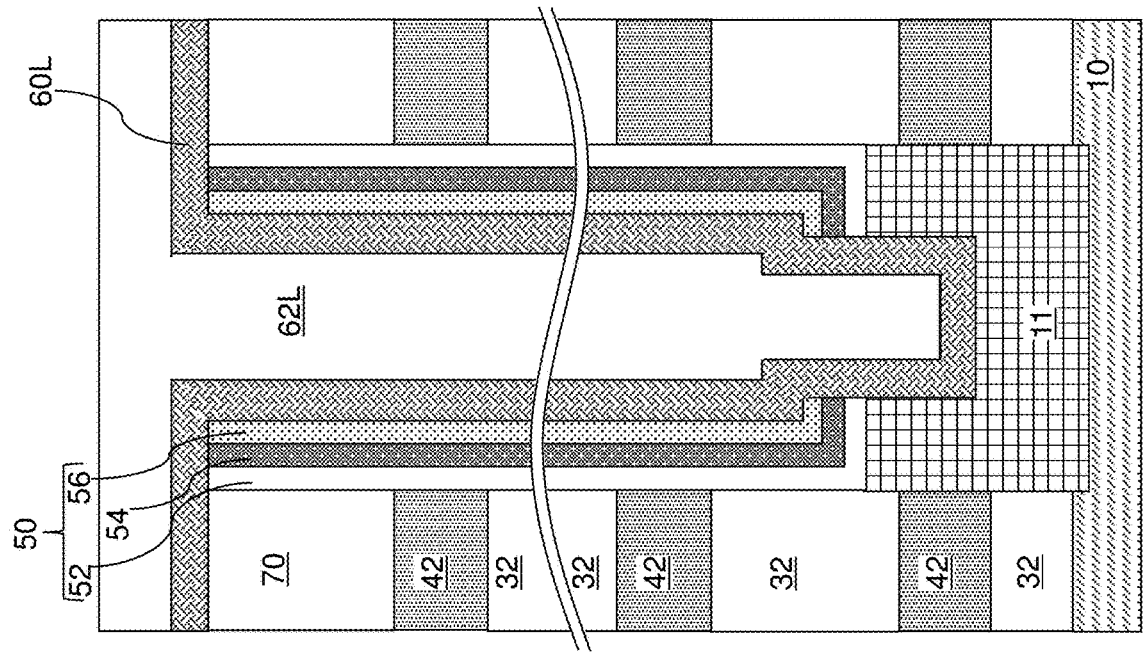
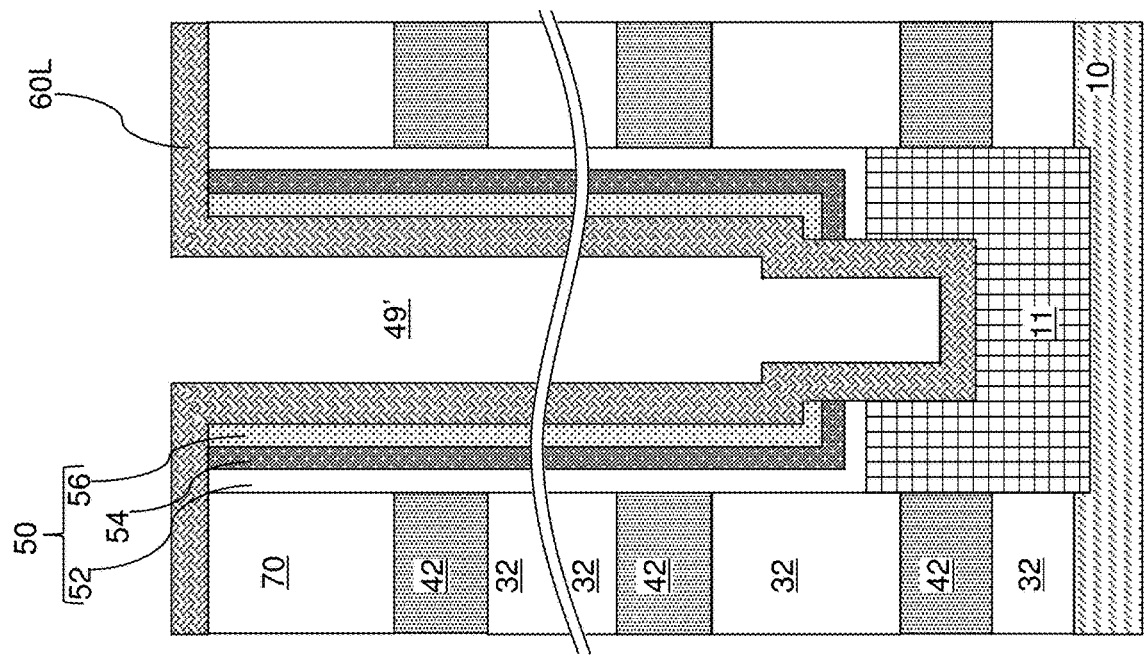

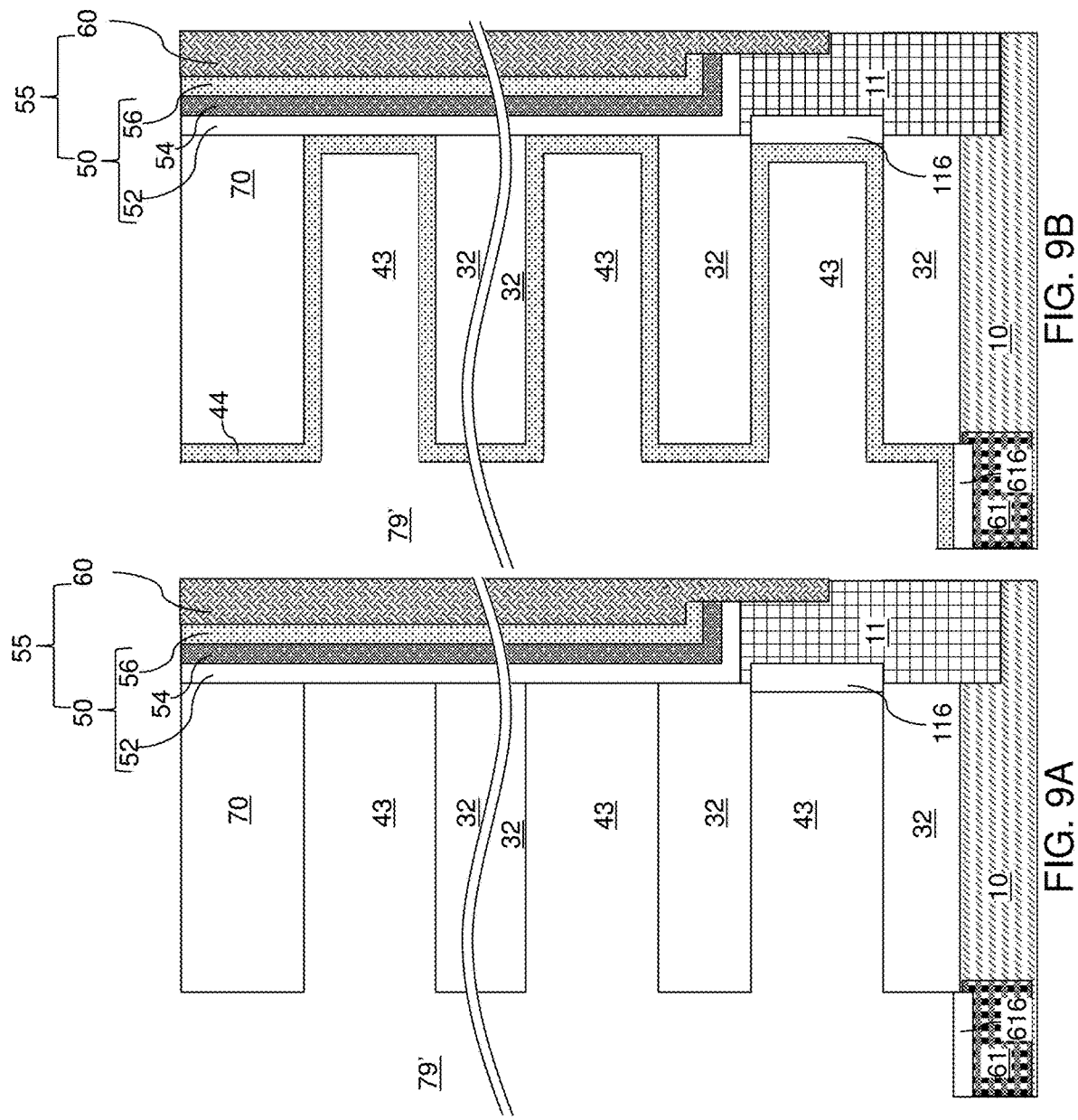

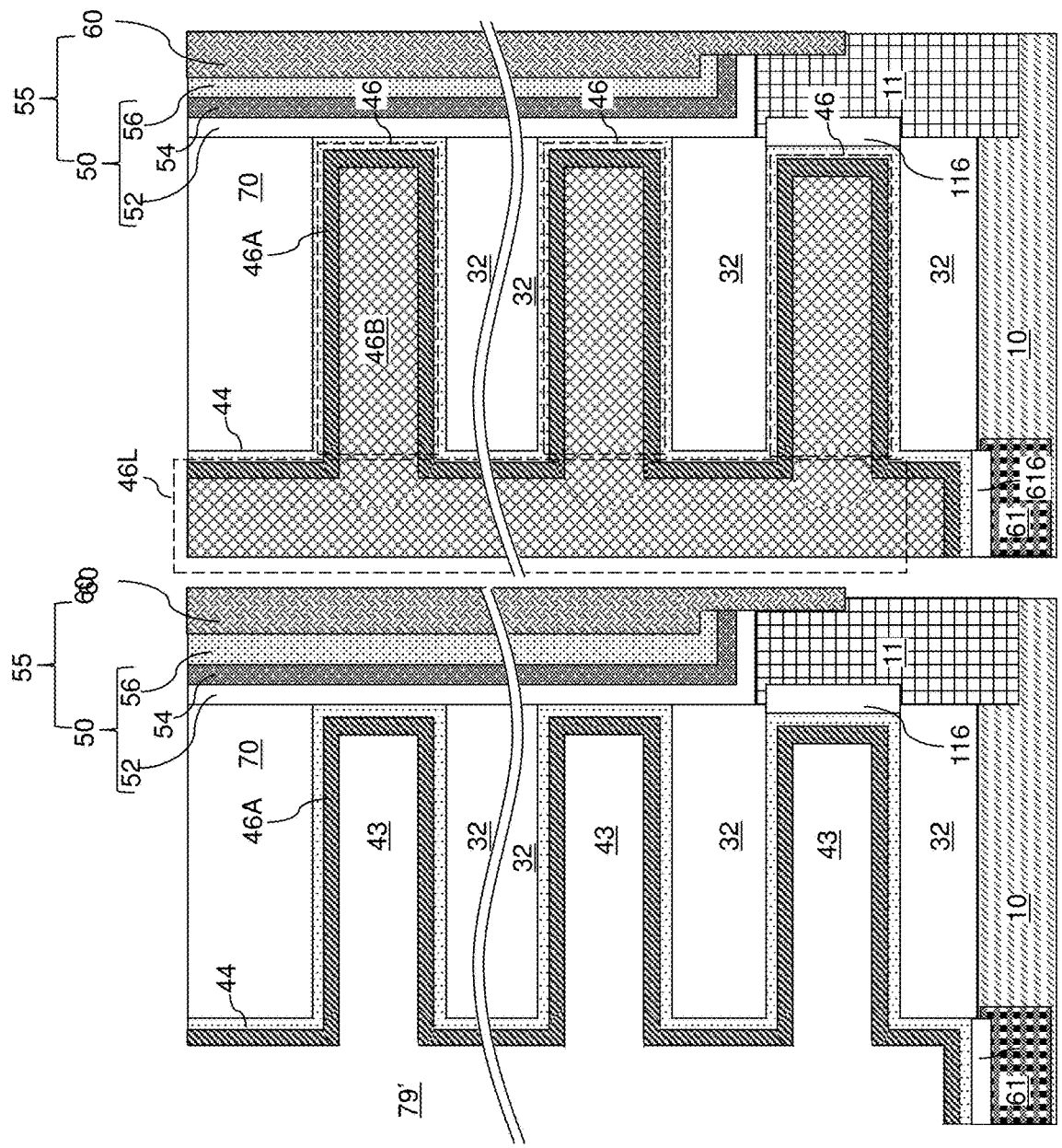

ental portion contained
within the dielectric liner, and an air gap.

THREE-DIMENSIONAL MEMORY DEVICE INCLUDING LOW-K DRAIN-SELECT-LEVEL ISOLATION STRUCTURES AND METHODS OF FORMING THE SAME

FIELD

The present disclosure relates generally to the field of semiconductor devices, and particularly to three-dimensional memory devices including low-k drain-select-level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the electrically conductive layers comprise word-line-level electrically conductive layers and drain-select-level electrically conductive layers overlying the word-line-level electrically conductive layers; an array of memory opening fill structures located within an array of memory openings vertically extending through the alternating stack; and a drain-select-level isolation structure vertically extending through the drain-select-level electrically conductive layers and having an effective dielectric constant that is less than 3.9, wherein: the array of memory opening fill structures comprises two rows of first memory opening fill structures that are arranged along a first horizontal direction; and each of the first memory opening fill structures comprises a respective planar straight sidewall in contact with a respective portion of a pair of straight sidewalls of the drain-select-level isolation structure.

According to another aspect of the present disclosure, a method of forming a three-dimensional memory device comprises forming a combination of an alternating stack of insulating layers and electrically conductive layers and an array of memory opening fill structures vertically extending through the alternating stack, wherein each of the memory opening fill structures comprises a respective memory film, a respective vertical semiconductor channel, and a respective drain region; forming a drain-select-level isolation trench through a subset of the electrically conductive layers and a subset of the insulating layers; forming a drain-select-level isolation structure having an effective dielectric constant that is less than 3.9 by filling the drain-select-level isolation trench with a fill material; and forming drain contact via structures on top surfaces of the drain regions. The array of memory opening fill structures comprises two rows of first memory opening fill structures that are arranged along a first horizontal direction; and each of the first memory opening fill structures comprises a respective planar straight sidewall in contact with a respective portion of a pair of straight sidewalls of the drain-select-level isolation structure.

According to yet another aspect of the present disclosure, a three-dimensional memory device is provided, which comprises: an alternating stack of insulating layers and electrically conductive layers located over a substrate, wherein the electrically conductive layers comprise word-line-level electrically conductive layers and drain-select-level electrically conductive layers overlying the word-line-level electrically conductive layers; an array of memory opening fill structures located within an array of memory openings vertically extending through the alternating stack; and a drain-select-level isolation structure vertically extending through the drain-select-level electrically conductive layers between two rows of memory opening fill structures of the array of memory opening structures and laterally extending along a first horizontal direction, and comprising a dielectric liner, a dielectric fill material portion contained within the dielectric liner, and an air gap.

According to still another aspect of the present disclosure, a method of forming a three-dimensional memory device is provided, which comprises: forming a combination of an alternating stack of insulating layers and electrically conductive layers and an array of memory opening fill structures vertically extending through the alternating stack, wherein each of the memory opening fill structures comprises a respective memory film, a respective vertical semiconductor channel, and a respective drain region; forming a drain-select-level isolation trench through a subset of the electrically conductive layers and a subset of the insulating layers; forming a sacrificial drain-select-level trench fill structure by filling the drain-select-level isolation trench with a dielectric liner and at least one fill material; forming drain contact via structures on top surfaces of the drain regions; and replacing the sacrificial drain-select-level trench fill structure with a drain-select-level isolation structure by removing the at least one fill material and forming at least a portion of an air gap within a volume of the drain-select-level isolation trench.

BRIEF DESCRIPTION OF THE DRAWINGS

FIGS. 5A-5H are sequential schematic vertical cross-sectional views of a memory opening within the first exemplary structure during formation of a memory stack structure, an optional dielectric core, and a drain region therein according to an embodiment of the present disclosure.

FIGS. 9A-9D are sequential vertical cross-sectional views of a region of the first exemplary structure during formation of electrically conductive layers according to an embodiment of the present disclosure.

DETAILED DESCRIPTION

Figure 1:
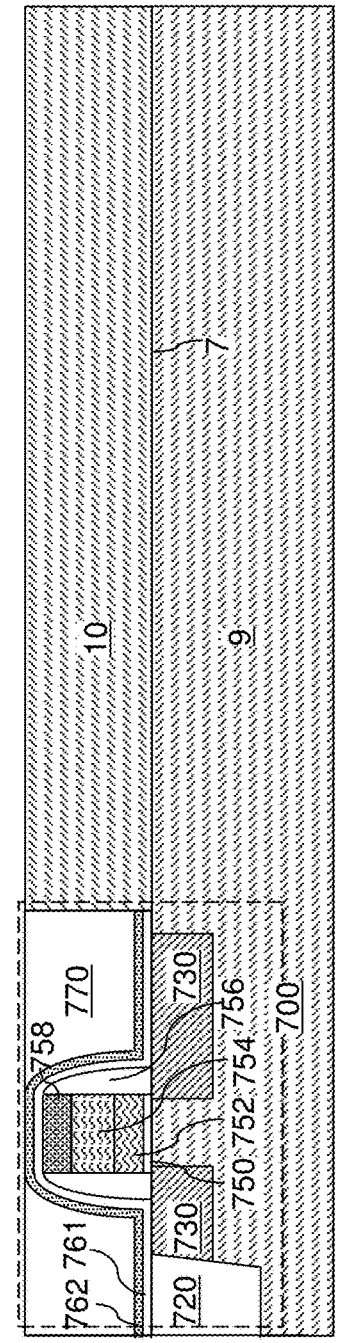
FIG. 1 is a schematic vertical cross-sectional view of a first exemplary structure after formation of at least one peripheral device, a semiconductor material layer, and a gate dielectric layer according to an embodiment of the present disclosure.

As discussed above, the embodiments of the present disclosure are directed to three-dimensional memory devices including low-k drain-select-level isolation structures and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
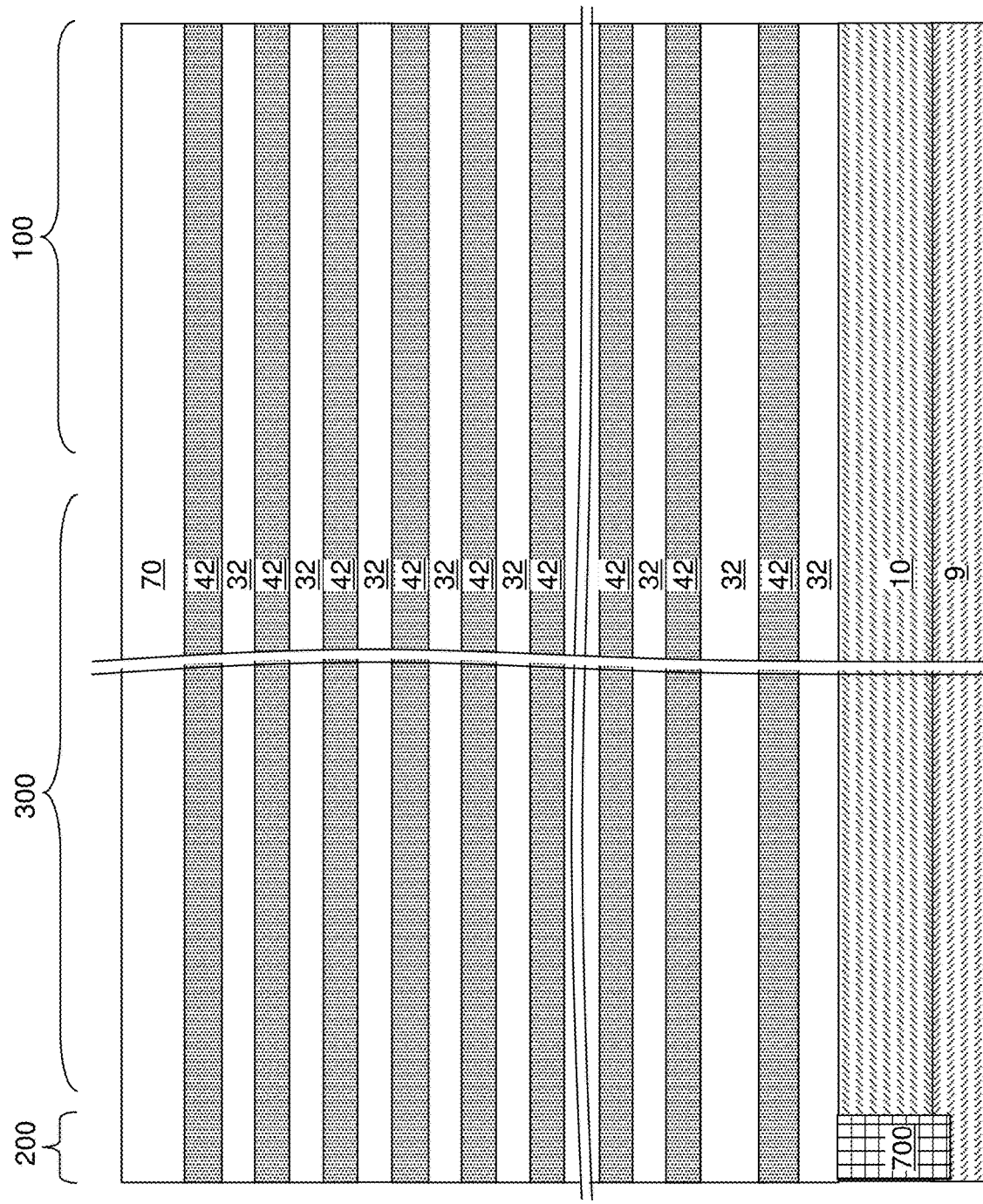
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness there amongst, or may have different thicknesses. The second elements may have the same thickness there amongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
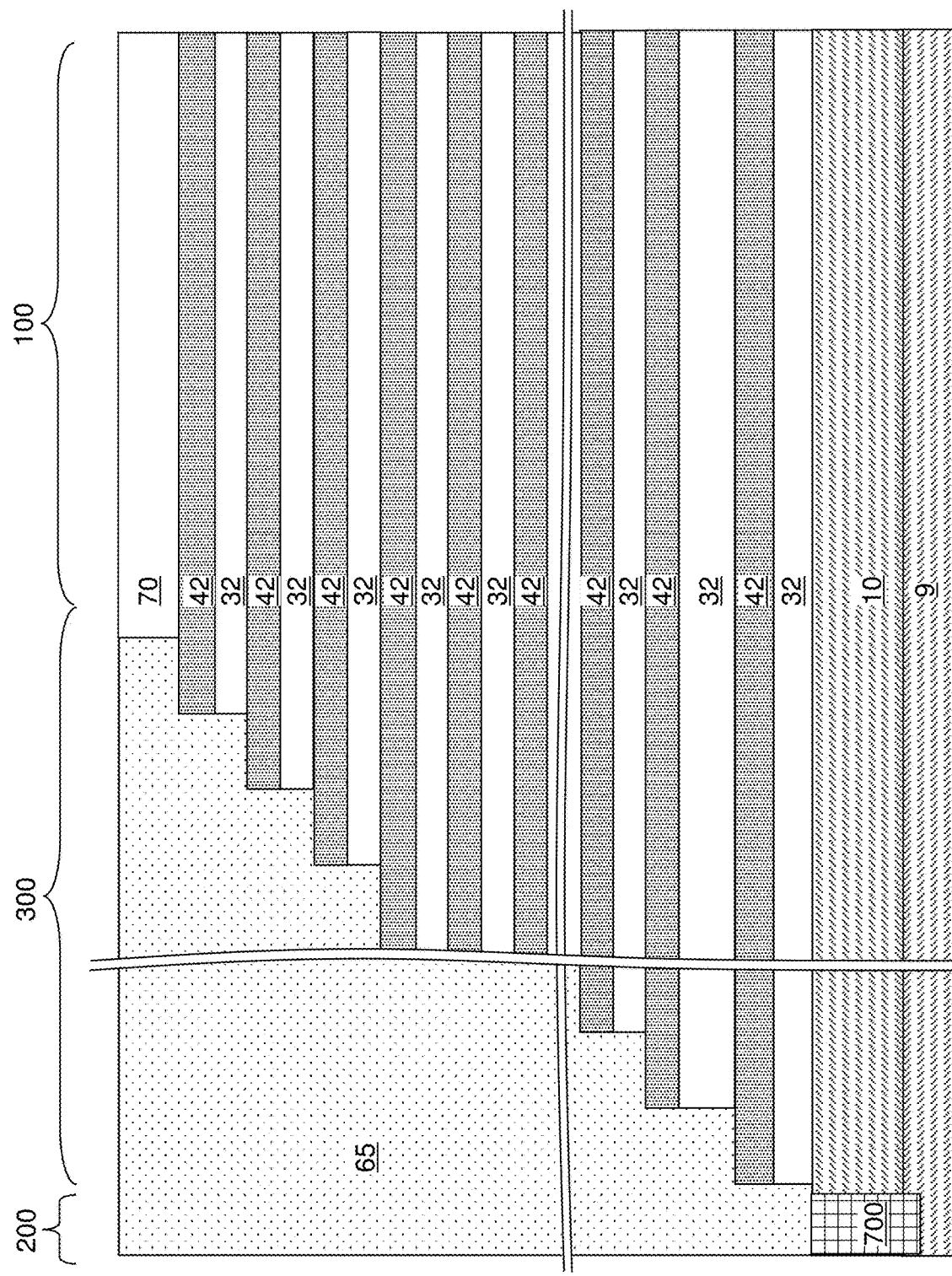
FIG. 3 is a schematic vertical cross-sectional view of the first exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
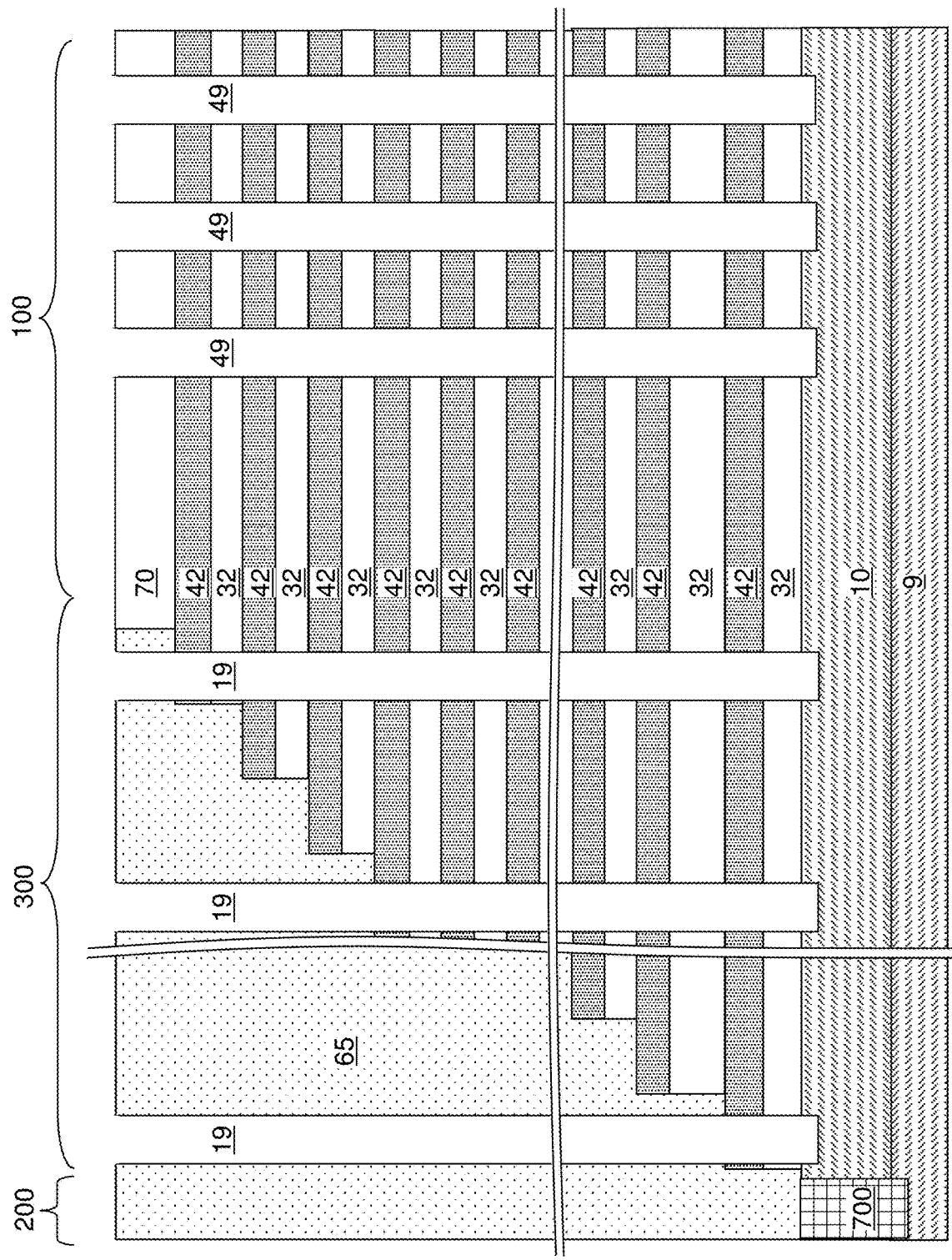
FIG. 4A is a schematic vertical cross-sectional view of the first exemplary structure after formation of memory openings and support openings according to an embodiment of the present disclosure.
Figure 4B:
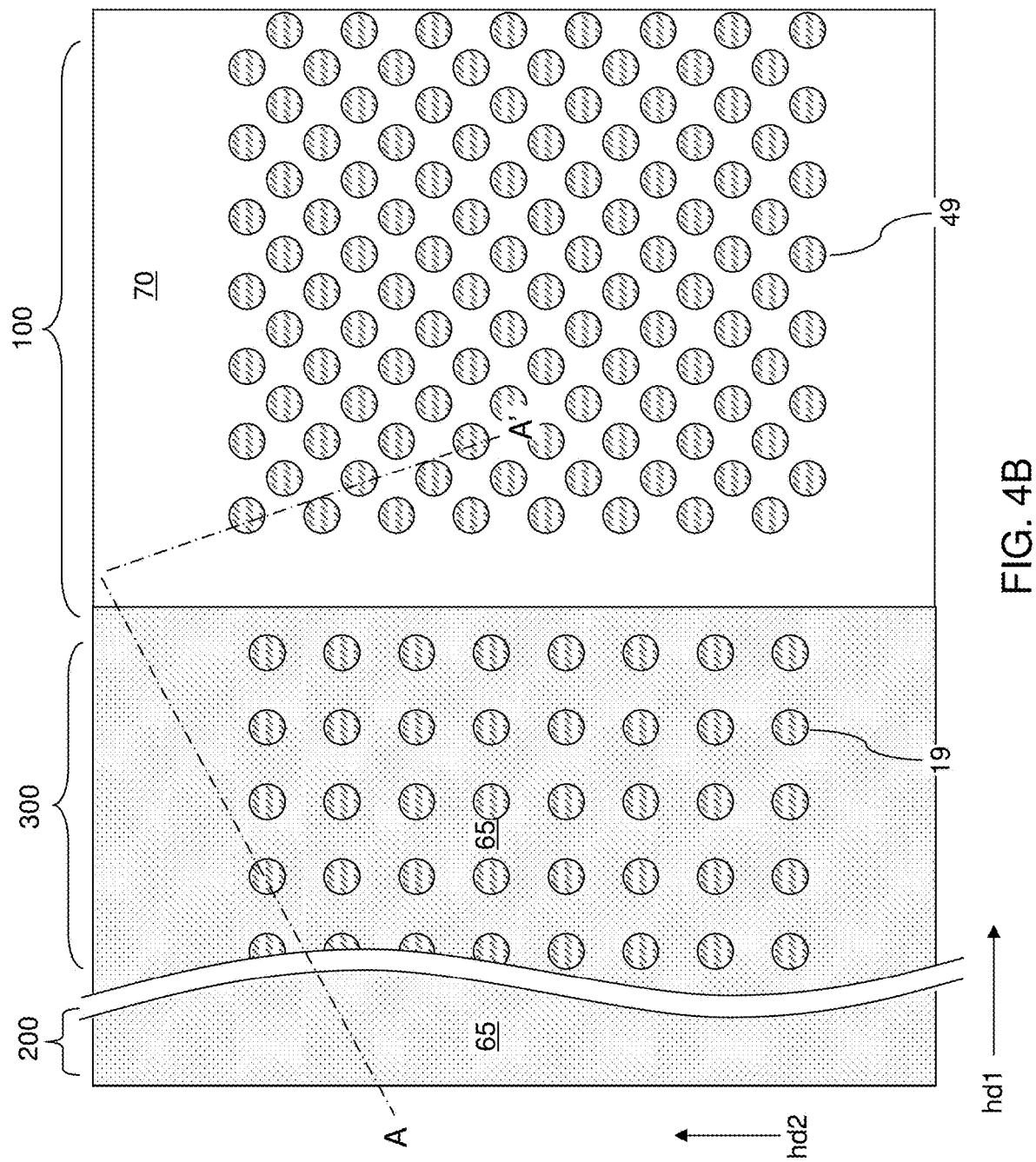
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each support opening 19.

Figures 5A, 5B:
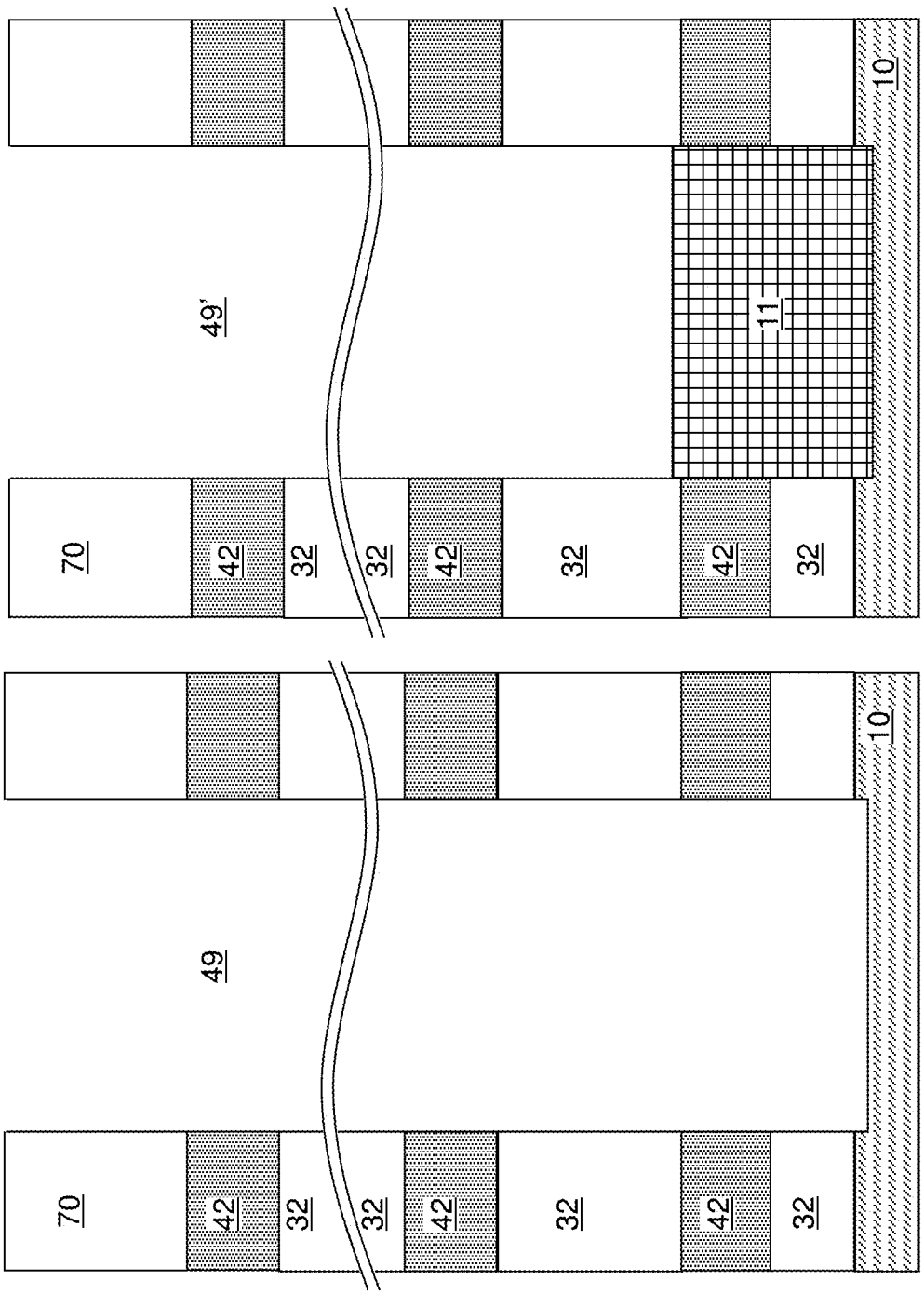

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a memory material layer 54, a tunneling dielectric layer 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide (Ta$_2$O$_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

In one embodiment, each vertical stack of memory elements comprises a vertical stack of charge storage material portions that retain electrical charges therein upon programming, or a vertical stack of ferroelectric memory elements that retains electrical polarization therein upon programming. In case the vertical stack of ferroelectric memory elements is used, the memory material layer 54 may comprise a continuous ferroelectric material layer or a plurality of discrete, vertically separated ferroelectric material portions. The ferroelectric material may comprise orthorhombic phase hafnium oxide doped with silicon, aluminum or zirconium for example.

The memory material layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the tunneling dielectric layer 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the memory material layer 54. A set of a blocking dielectric layer 52, a memory material layer 54, and a tunneling dielectric layer 56 in a memory opening 49 constitutes a memory film 50, which includes a plurality of charge storage regions (comprising portions of the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5H:
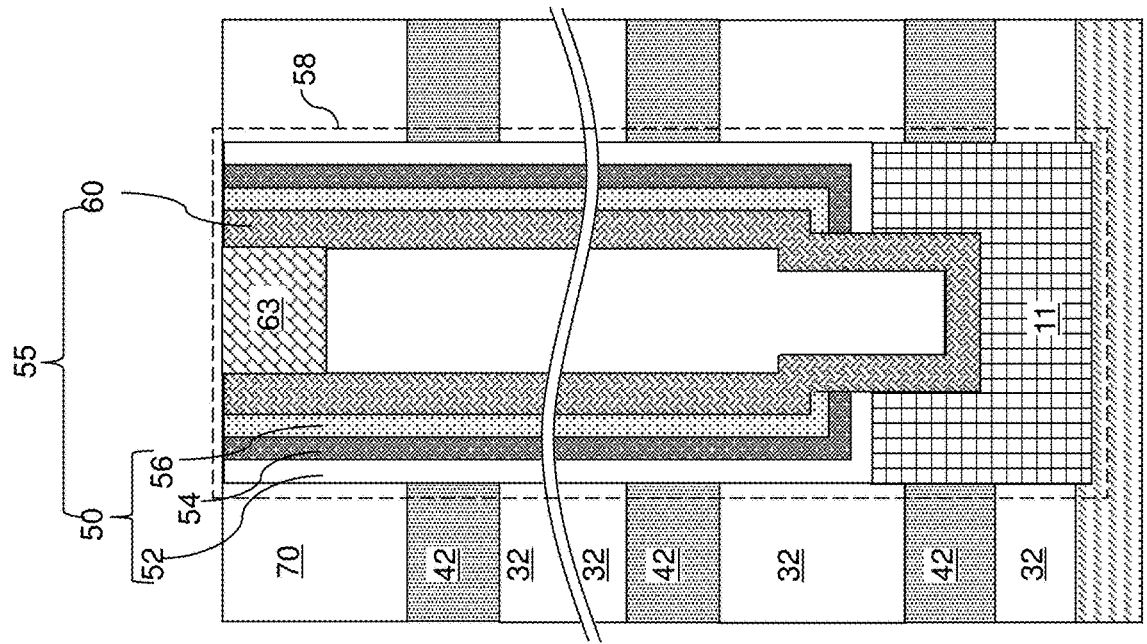
Figure 5G:
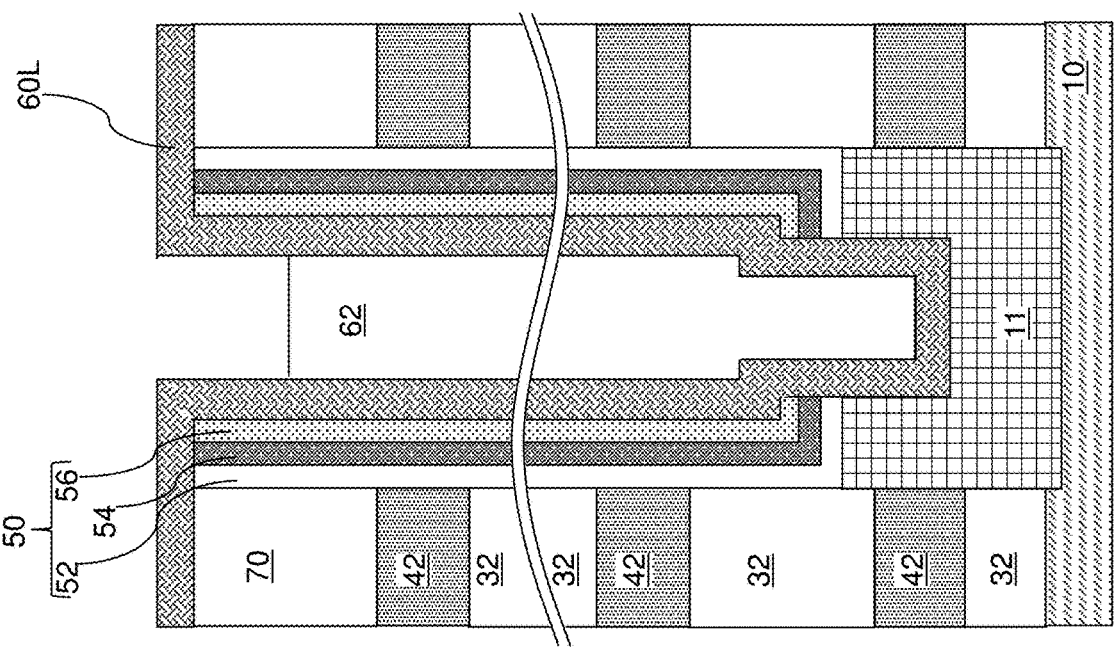

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/\text{cm}^3$ to $2.0 \times 10^{21}/\text{cm}^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or ferroelectric polarization with a macroscopic retention time. In some embodiments, a blocking dielectric layer 52 may not be present in the memory film 50 at this step, and a blocking dielectric layer may be subsequently formed after formation of backside recesses. Furthermore, if the ferroelectric memory material layer 54 is used, then the tunneling dielectric layer 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
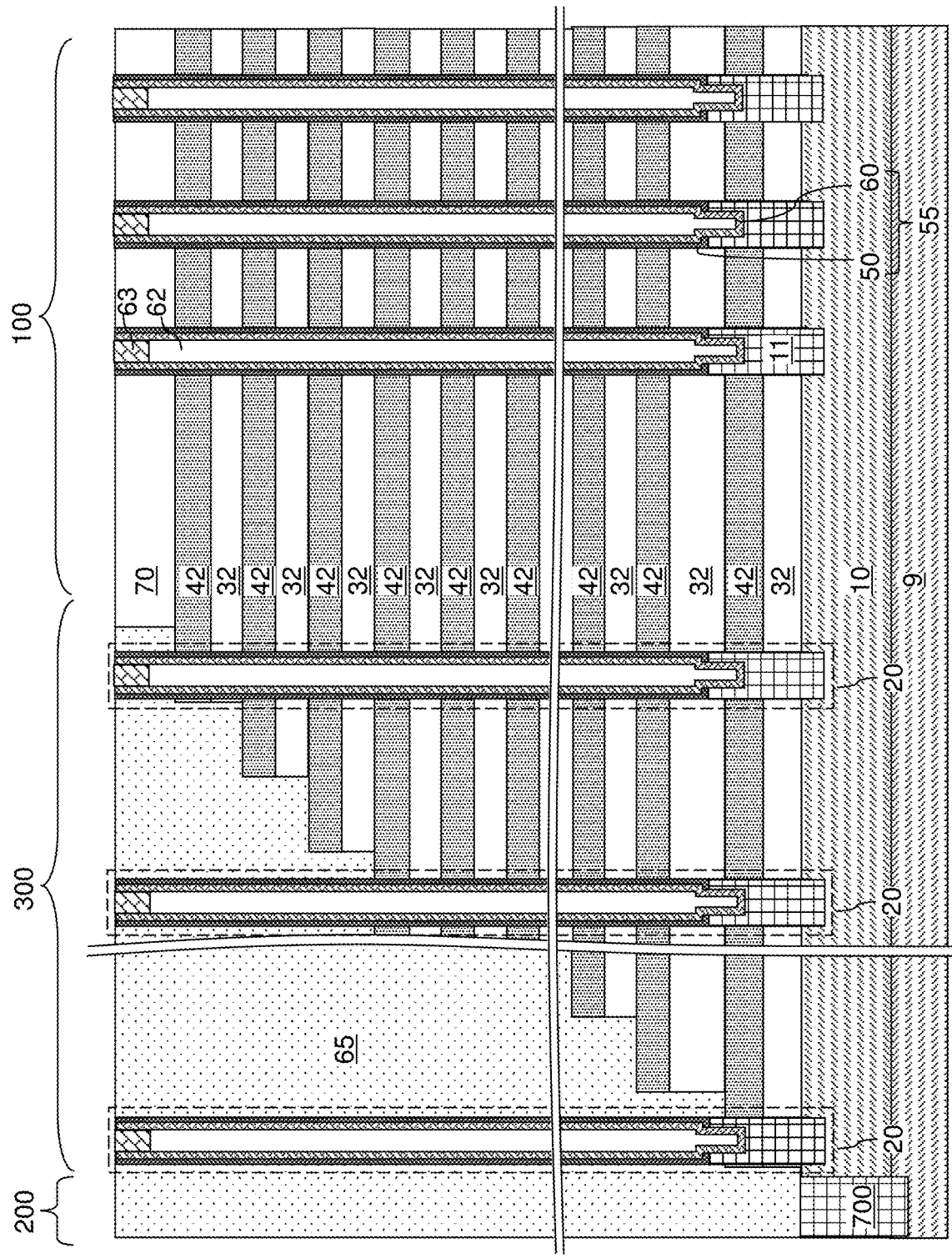
FIG. 6 is a schematic vertical cross-sectional view of the first exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions or ferroelectric regions (e.g., comprising portions of the memory material layer 54) laterally surrounding the tunneling dielectric layer 56 (if present in combination with the charge storage regions) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
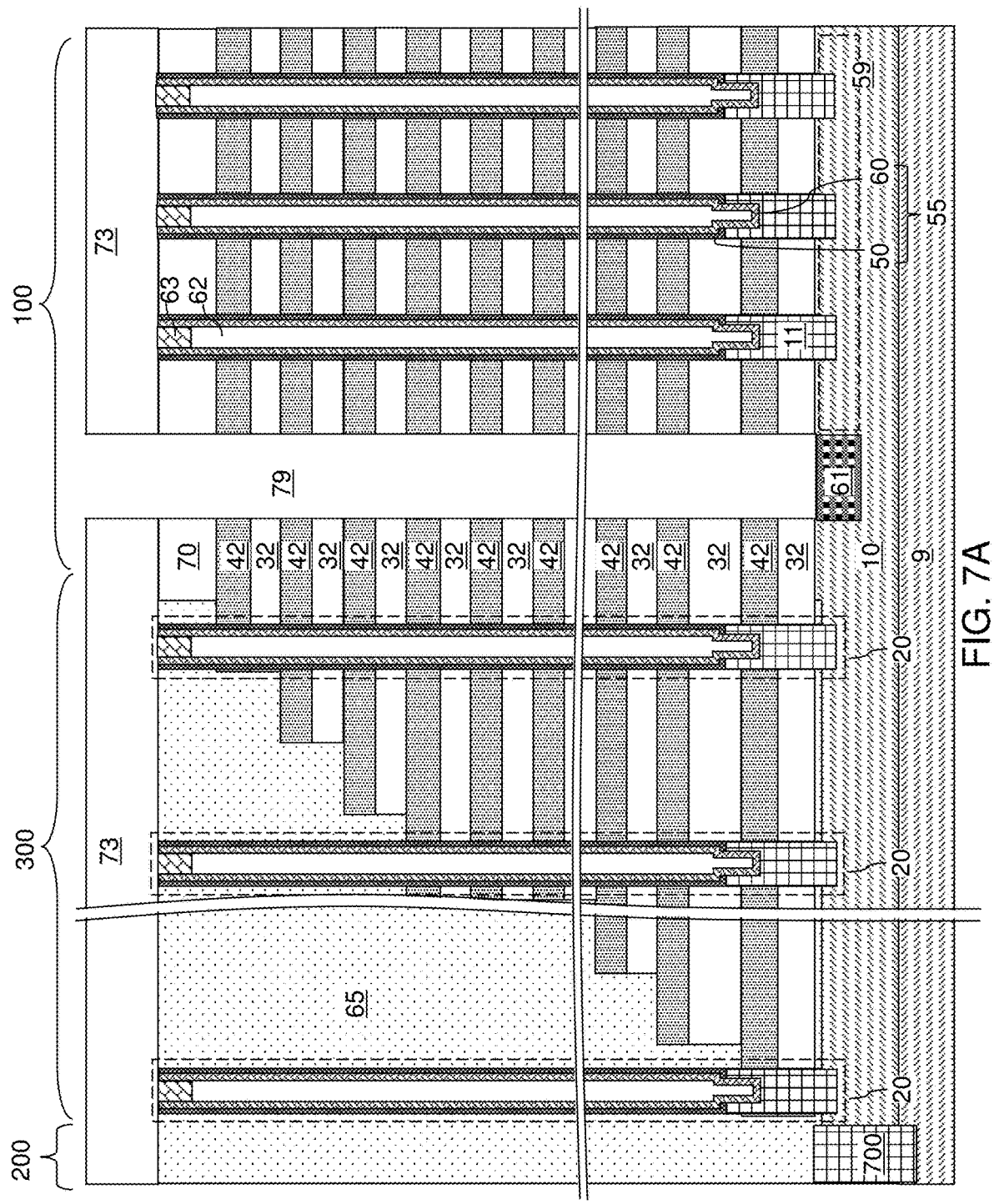
FIG. 7A is a schematic vertical cross-sectional view of the first exemplary structure after formation of backside trenches according to an embodiment of the present disclosure.
Figure 7B:
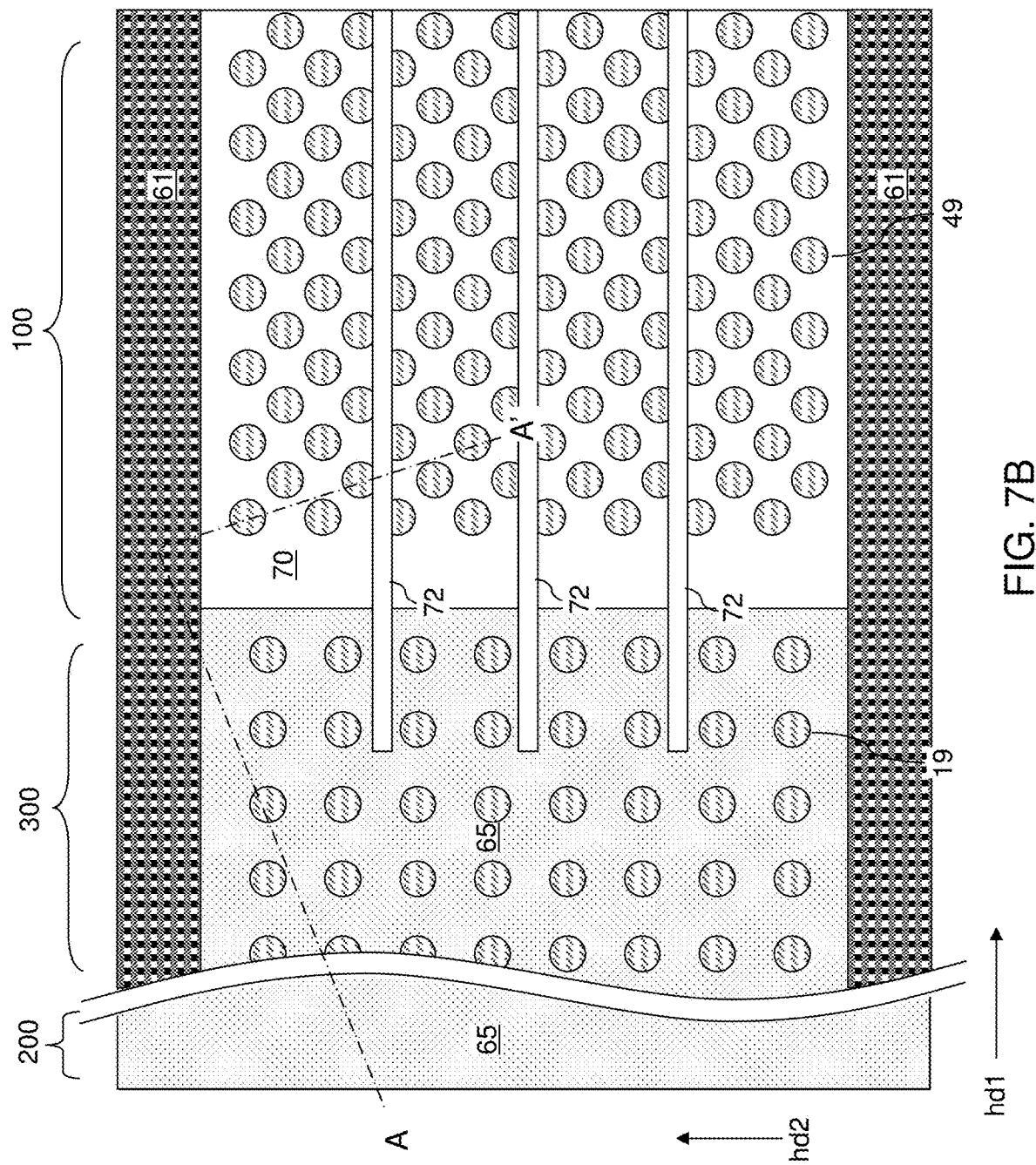
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. The memory stack structures 55 can be arranged in rows that extend along the first horizontal direction hd1. In one embodiment, the backside trenches 79 can include a source contact opening in which a source contact via structure can be subsequently formed. The photoresist layer can be removed, for example, by ashing.

Dopants of the second conductivity type can be implanted into physically exposed surface portions of the substrate (9, 10) (which may be surface portions of the semiconductor material layer 10) that are located at the bottom of the backside trenches by an ion implantation process. A source region 61 can be formed at a surface portion of the semiconductor material layer 10 under each backside trench 79. Each source region 61 is formed in a surface portion of the substrate (9, 10) that underlies a respective backside trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8:
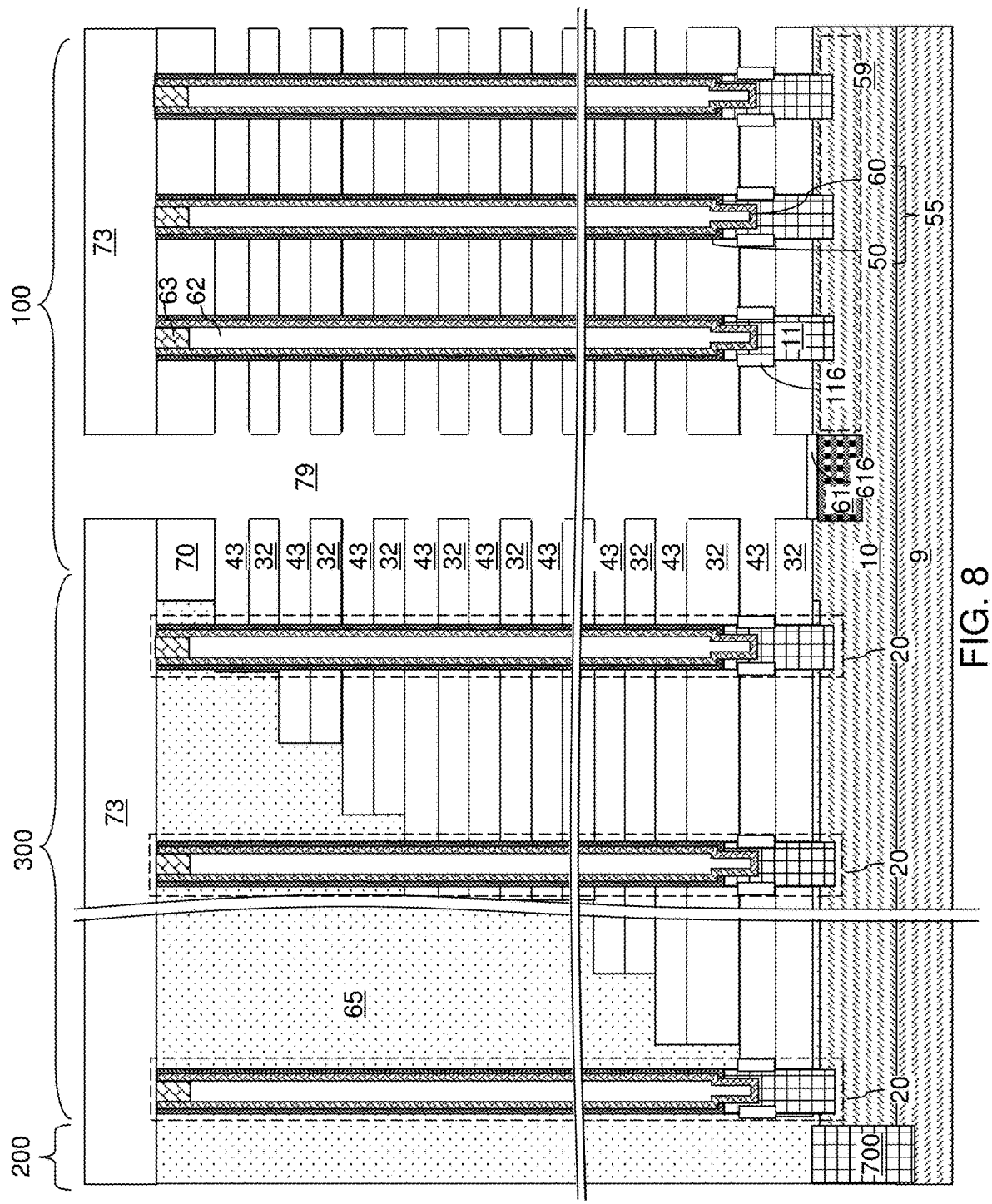
FIG. 8 is a schematic vertical cross-sectional view of the first exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the first exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
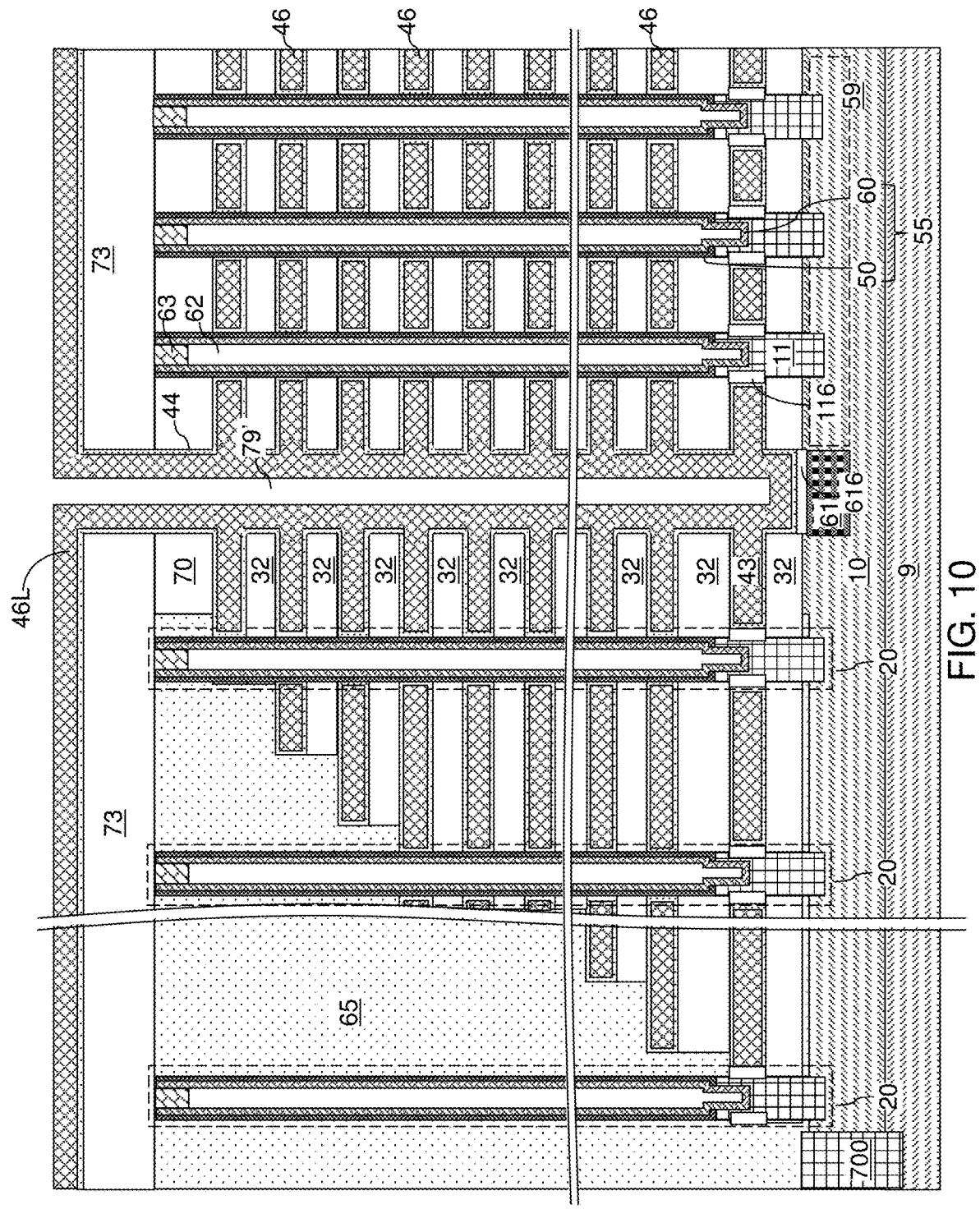
FIG. 10 is a schematic vertical cross-sectional view of the first exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11:
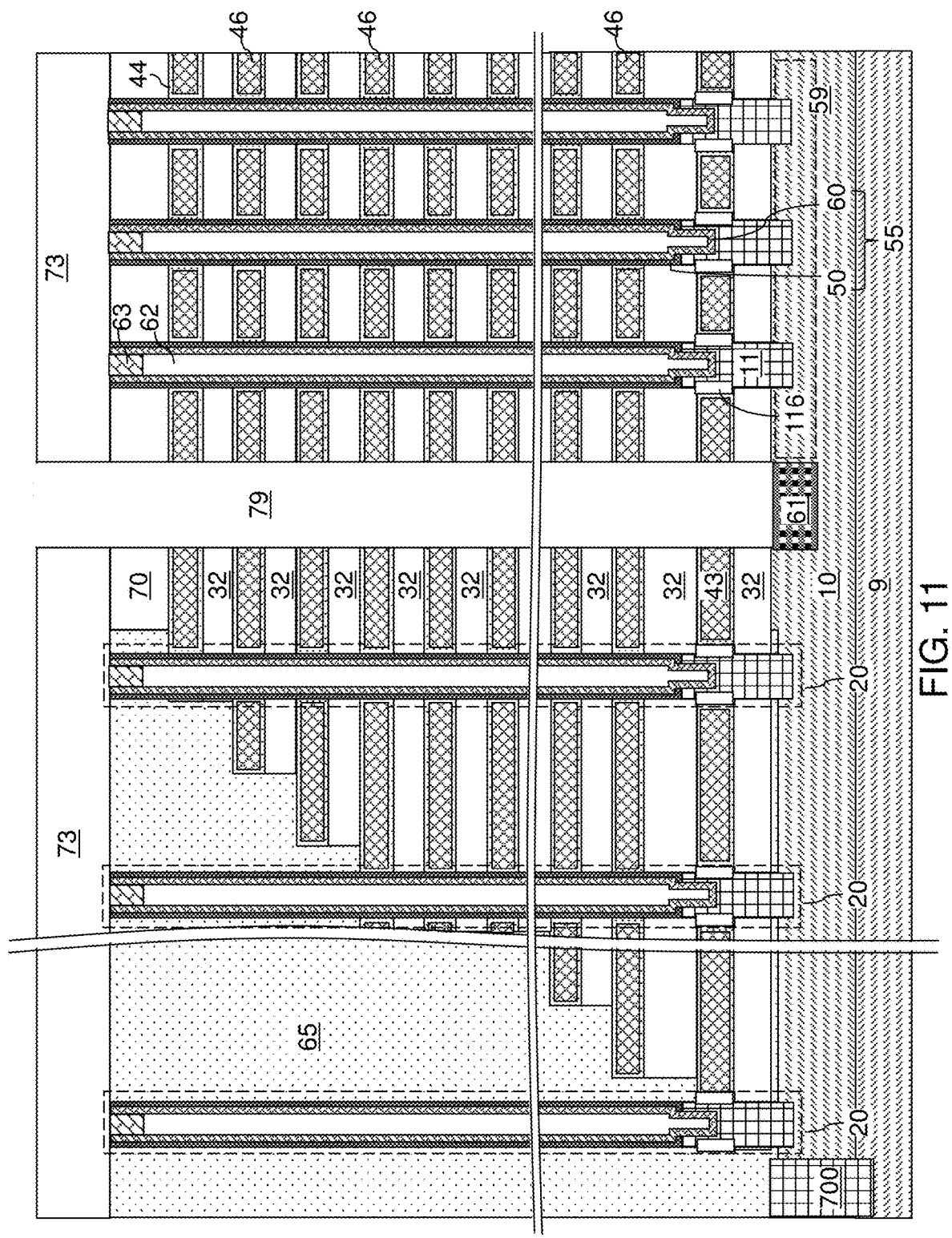
FIG. 11 is a schematic vertical cross-sectional view of the first exemplary structure after removal of a deposited conductive material from within the backside trench according to an embodiment of the present disclosure.

Referring to FIG. 11, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12A:
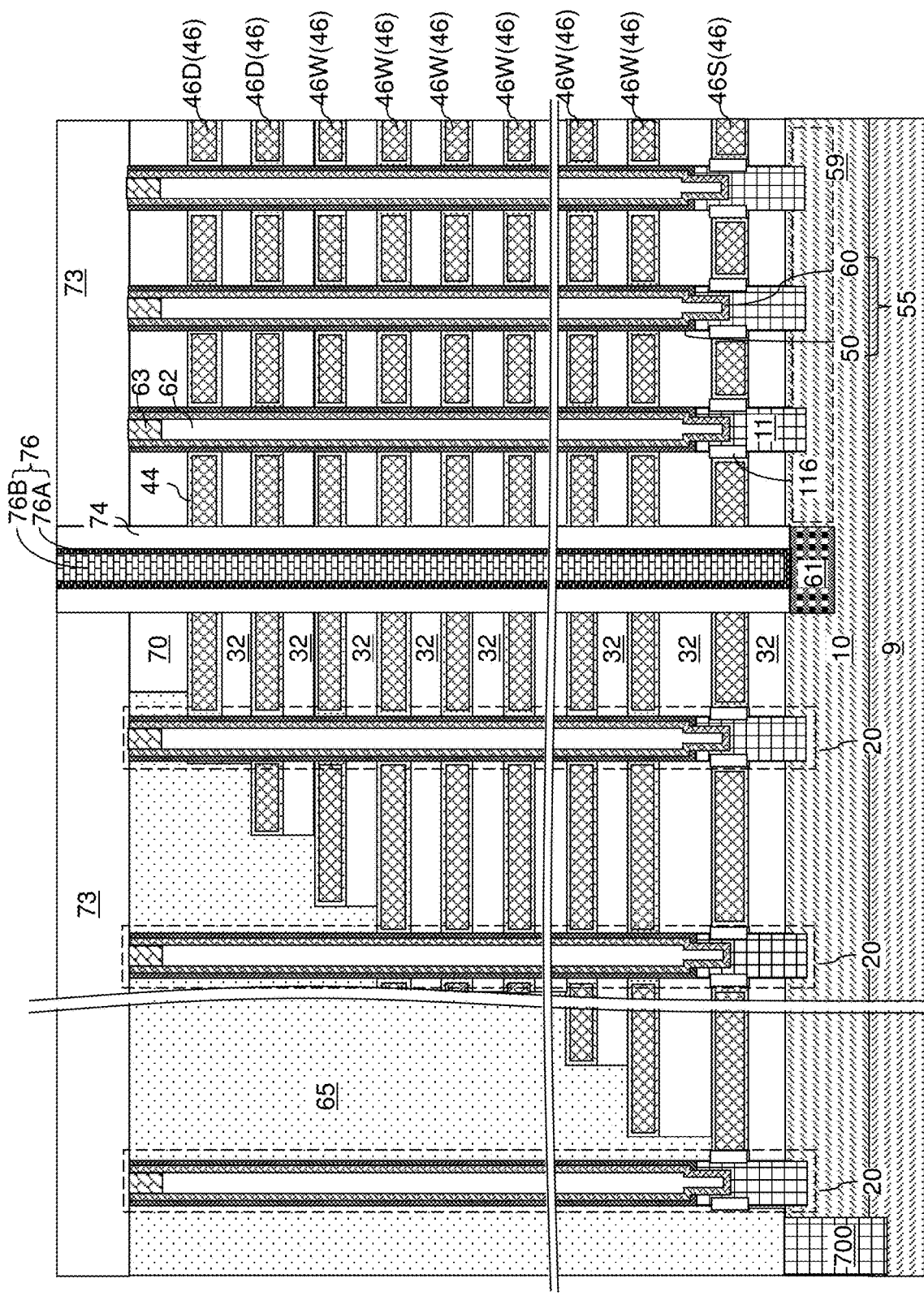
FIG. 12A is a schematic vertical cross-sectional view of the first exemplary structure after formation of an insulating spacer and a backside contact structure according to an embodiment of the present disclosure.
Figure 12B:
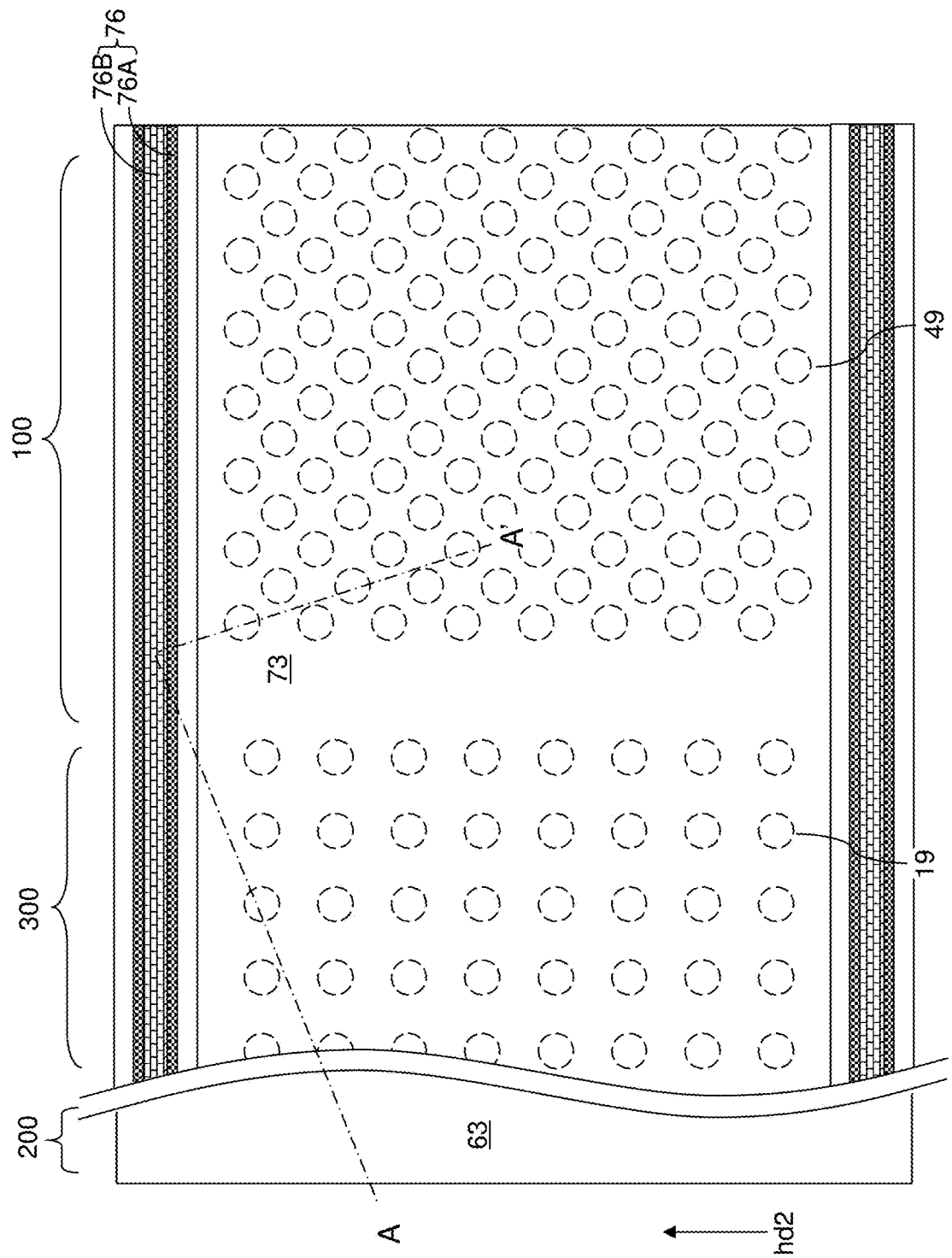
FIG. 12B is a magnified view of a region of the first exemplary structure of FIG. 12A.

Referring to FIGS. 12A and 12B, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A bottommost electrically conductive layer 46 provided upon formation of the electrically conductive layers 46 within the alternating stack (32, 46) can comprise a select gate electrode for the field effect transistors. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44. Generally, a backside contact via structure 76 can be formed within each of the backside trenches 79 after formation of the insulating spacers 74 by depositing and planarizing at least one conductive material in volumes of the backside trenches 79 that are not filled with the insulating spacers 74.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Generally, combinations of a respective alternating stack of insulating layers 32 and electrically conductive layers 46 and a respective array of memory opening fill structures 58 vertically extending through the respective alternating stack (32, 46) can be formed over a substrate (9, 10). Each of the memory opening fill structures 58 comprises a respective memory film 50, a respective vertical semiconductor channel 60, and a respective drain region 63. The combinations of a respective alternating stack of insulating layers 32 and electrically conductive layers 46 and a respective array of memory opening fill structures 58 can be formed by forming an in-process alternating stack of insulating layers 32 and sacrificial material layers 42 over the substrate (32, 42), forming the arrays of memory opening fill structures 58 through the in-process alternating stacks, forming a contact-level dielectric layer 73 over the arrays of memory opening fill structures 58, forming backside trenches 79 through the contact-level dielectric layer 73 and the in-process alternating stack (32, 42), forming backside recesses 43 by removing the sacrificial material layers 42 selective to the insulating layers 32 employing an isotropic etch process in which an isotropic etchant that etches the sacrificial material layers 42 is provided into the backside trenches 43, and forming the electrically conductive layers 46 by providing a precursor gas that deposits the electrically conductive layers 46 into the backside recesses 43.

The electrically conductive layers comprise word-line-level electrically conductive layers (i.e., word lines) 46W, drain-select-level electrically conductive layers (i.e., drain side select gate electrodes) 46D overlying the word-line-level electrically conductive layers 46W, and source-select-level electrically conductive layers (i.e., source side select gate electrodes) 46S underlying the word-line-level electrically conductive layers 46W. An array of memory opening fill structures 58 can be located within an array of memory openings 49 vertically extending through the alternating stack (32, 46). A first backside trench fill structure (74, 76) laterally extending along the first horizontal direction hd1 can contact first sidewalls of each layer within an alternating stack of insulating layers 32 and electrically conductive layers 46. A second backside trench fill structure (74, 76) laterally extending along the first horizontal direction hd1 can be laterally spaced from the first backside trench fill structure (74, 76) and can contact second sidewalls of each layer within the alternating stack (32, 46). Top surfaces of the first backside trench fill structure (74, 76) and the second backside trench fill structure (74, 76) can be located within a horizontal plane including a top surface of the contact-level dielectric layer 73.

Figure 13A:
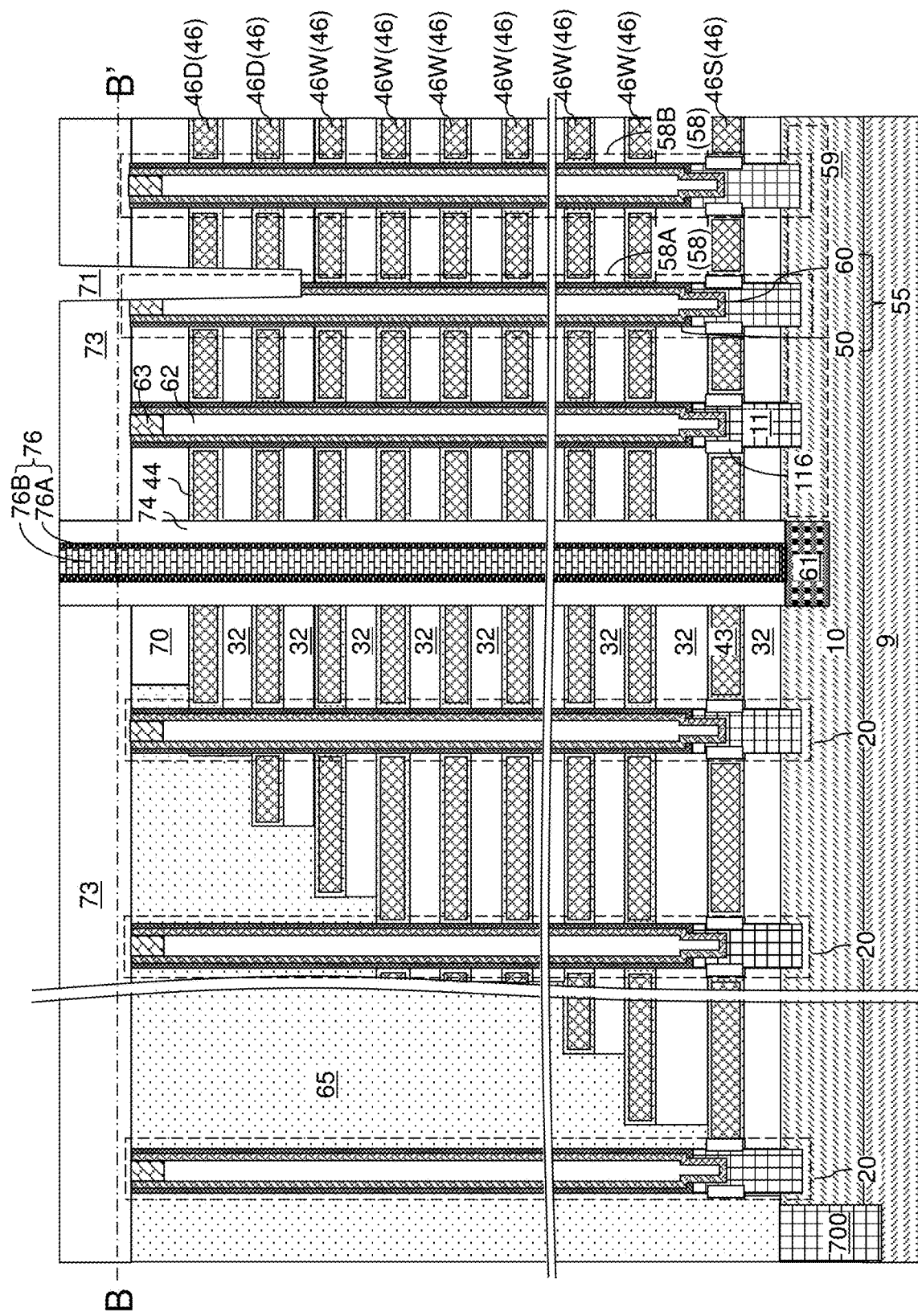
FIG. 13A is a schematic vertical cross-sectional view of the first exemplary structure after formation of drain-select-level isolation trenches according to a first embodiment of the present disclosure.
Figure 13B:
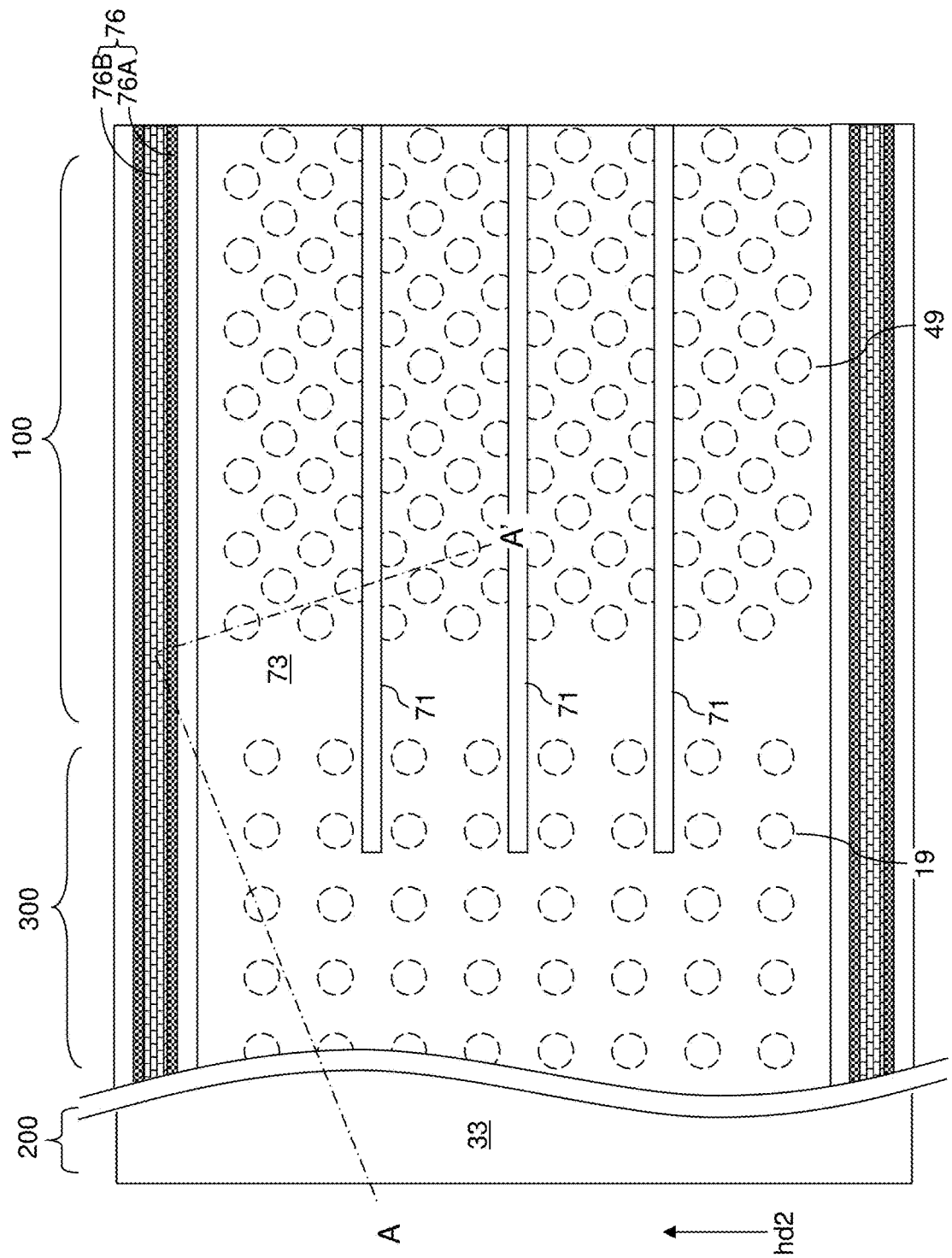
FIG. 13B is a top-down view of the first exemplary structure of FIG. 13A. The vertical plane A-A' is the plane of the schematic vertical cross-sectional view of FIG. 13A.

Referring to FIGS. 13A and 13B, a photoresist layer (not shown) can be applied over the top surface of the contact-level dielectric layer 73, and can be lithographically patterned to form elongated openings between sets of rows of memory opening fill structures 58 that laterally extend along the first horizontal direction hd1. For example, a cluster (e.g., memory block) of memory opening fill structures 58 located between a respective neighboring pair of backside trench fill structures (74, 76) can be divided into multiple sets of rows of memory opening fill structures 58 that are laterally spaced apart along the second horizontal direction hd2. For example, if a cluster of memory opening fill structures 58 located between a respective neighboring pair of backside trench fill structures (74, 76) includes M×N number of rows of memory opening fill structures 58 in which M is an integer greater than 1 and N is an integer greater than 1, the cluster of memory opening fill structures 58 may be divided into N sets of rows of memory opening fill structures 58 such that each set of rows of memory opening fill structures 58 includes M rows of memory opening fill structures 58. In the example illustrated in FIGS. 13A and 13B, M is 4 and N is 4. Embodiments in which M is any other integer greater than 1 and N is any other integer greater than 1 are expressly contemplated herein.

In one embodiment, the openings in the photoresist layer can be rectangular openings having lengthwise edges that are parallel to the first horizontal direction hd1 and having an areal overlap with peripheral portions of each memory opening fill structures 58 within some but not all neighboring pair of rows of memory opening fill structures 58. The lateral extend of each rectangular opening in the photoresist layer along the first horizontal direction hd1 can be selected such that the rectangular openings have the same lateral extent or a greater lateral extent than the drain-select-level electrically conductive layers 46D along the first horizontal direction hd1.

An anisotropic etch process can be performed to transfer the pattern in the photoresist layer through the contact-level dielectric layer 73, the insulating cap layer 70, and the drain-select-level electrically conductive layers 46D and any intervening insulating layers 32 located between the insulating cap layer 70 and the bottommost one of the drain-select-level electrically conductive layers 46D. The intervening insulating layers 32 are also referred to as drain-select-level insulating layers. Volumes of the voids formed by removal of the materials of the contact-level dielectric layer 73, the insulating cap layer 70, the drain-select-level electrically conductive layers 46D, and the drain-select-level insulating layers 32 constitute drain-select-level isolation trenches 71. Generally, the drain-select-level isolation trenches 71 can be formed through a subset of the electrically conductive layers 46 (i.e., the drain-select-level electrically conductive layers 46D) and a subset of the insulating layers (i.e., the drain-select-level insulating layers) by performing an anisotropic etch process employing a patterned etch mask layer (such as a photoresist layer) including line-shaped openings.

According to an aspect of the present disclosure, the array (e.g., memory block) of memory opening fill structures 58 located between a neighboring pair of backside trench fill structures (74, 76) can be arranged as a two-dimensional periodic array, and the drain-select-level isolation trenches 71 can cut through peripheral portions of some but not all rows neighboring pairs of memory opening fill structures 58. For example, two rows of memory opening fill structures 58 may be partially etched followed by two rows of memory opening fill structures 58 that are not etched. Optionally, three rows of memory opening fill structures 58 located adjacent to each backside trench fill structures (74, 76) are not etched. Other numbers of partially etched and unetched rows may be used. The memory opening fill structures 58 that are partially etched during formation of the drain-select-level isolation trenches 71 are herein referred to as first memory opening fill structures 58A. The memory opening fill structures 58 that are not etched during formation of the drain-select-level isolation trenches 71 are herein referred to as second memory opening fill structures 58B.

A planar straight sidewall of each of the first memory opening fill structures 58A is physically exposed upon formation of the drain-select-level isolation trenches 71 by the anisotropic etch process. In one embodiment, after the anisotropic etch process, each of the first memory opening fill structures 58A has a respective horizontal cross-sectional shape of a partial circle (e.g., semi-circle). The partial circle shape is a horizontal cross-sectional shape that includes an arc-shaped periphery that is adjoined to a straight periphery that is parallel to the first horizontal direction hd1. The straight periphery is a horizontal line contained within a planar sidewall of one of the drain-select-level isolation trenches 71. However, after the anisotropic etch process, each of the second memory opening fill structures 58B has a respective horizontal cross-sectional shape of a full circle or oval.

Figure 14A:
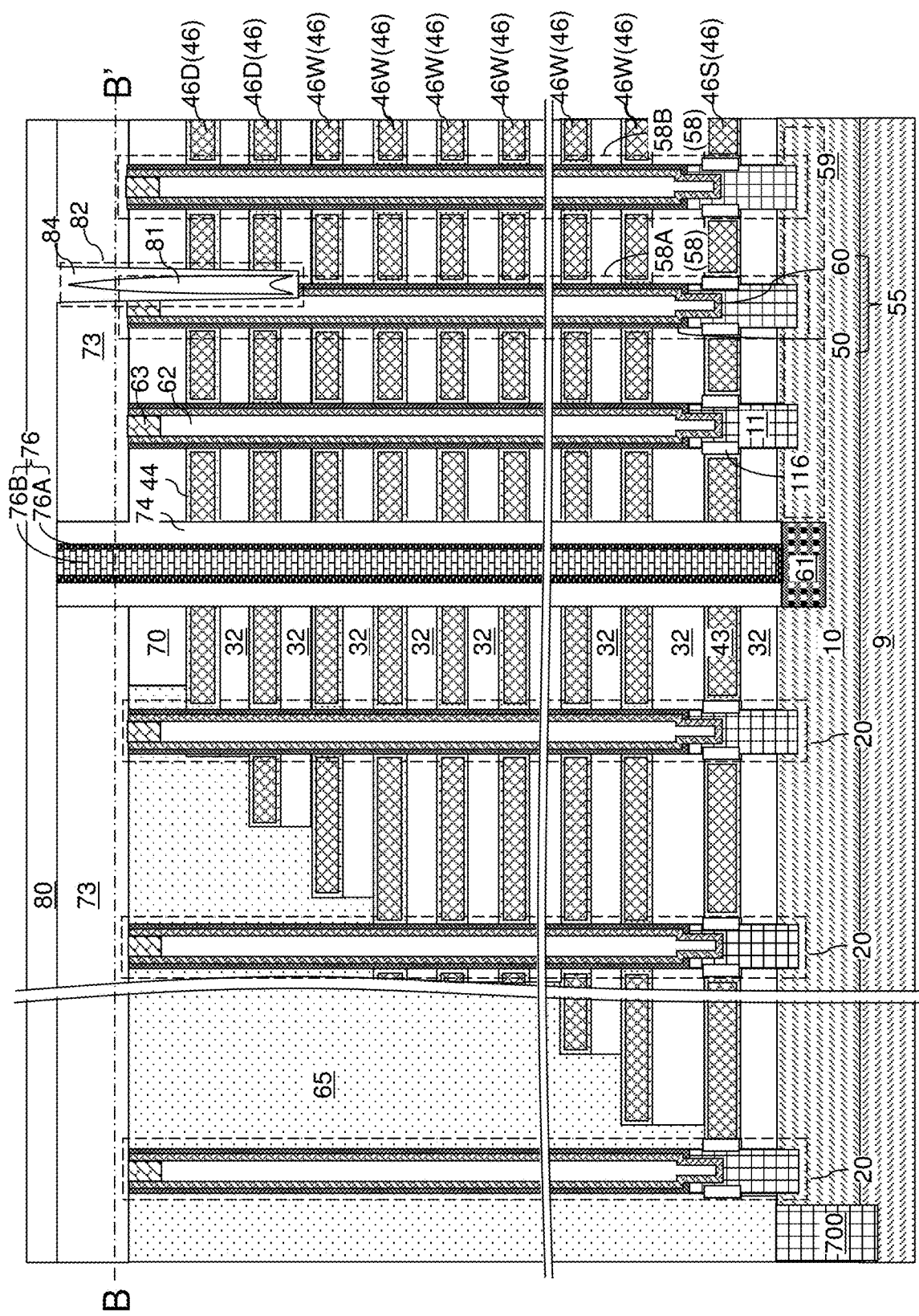
FIG. 14A is a schematic vertical cross-sectional view of the first exemplary structure after formation of a capping dielectric material layer including drain-select-level isolation structures according to the first embodiment of the present disclosure.
Figure 14B:
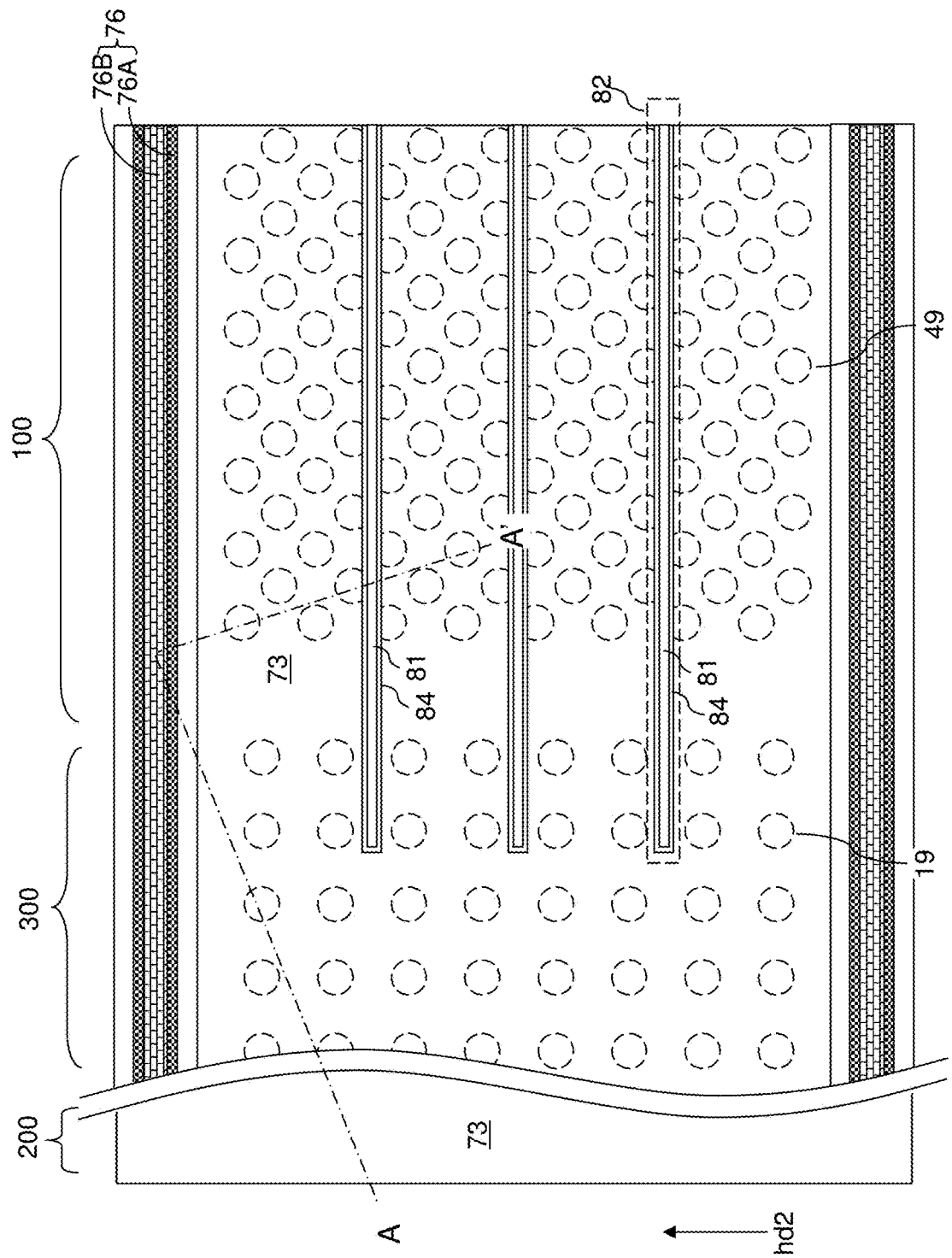
FIG. 14B is a horizontal cross-sectional view of the first exemplary structure along the horizontal plane B-B' of FIG. 14A.

Referring to FIGS. 14A and 14B, a dielectric fill material can be anisotropically deposited into the drain-select-level isolation trenches 71 and over the contact-level dielectric layer 73. For example, a plasma-enhanced chemical vapor deposition (PECVD) process can be performed to deposit the dielectric fill material into the drain-select-level isolation trenches 71 and over the contact-level dielectric layer 73. In one embodiment, the dielectric fill material may include a dielectric material such as undoped silicate glass (having a dielectric constant of 3.9), a doped silicate glass (such as fluorosilicate glass having a dielectric constant less than 3.9), or organosilicate glass. The anisotropically deposited dielectric fill material forms a capping dielectric material layer 80 that includes a horizontally-extending portion that overlies the top surface of the contact-level dielectric layer 73 and vertically-extending dielectric material portions 84 that are formed within the volumes of the drain-select-level isolation trenches 71.

According to an aspect of the present disclosure, each of the vertically-extending dielectric material portions 84 can encapsulate a respective air gap, which is herein referred to as an encapsulated cavity 81. Each encapsulated cavity 81 can be encapsulated by a respective vertically-extending dielectric material portion 84 of the capping dielectric material layer 80, and can be free of any solid phase material or any liquid-phase material therein. The entirety of an encapsulated cavity 81 may be bounded by a set of contiguous surfaces of a respective one of the vertically-extending dielectric material portions 84. The set of all structures located within each drain-select-level isolation trench 71 constitutes a drain-select-level isolation structure 82, which can include a combination of a vertically-extending dielectric material portion 84 and an encapsulated cavity 81. In one embodiment, each drain-select-level isolation structure 82 can comprise an encapsulated cavity 81 that is free of any solid material and encapsulated by a dielectric material portion (such as a vertically-extending dielectric material portion 84) of the capping dielectric material layer 80. Due to the presence of an encapsulated cavity 81 therein, the effective dielectric constant of a drain-select-level isolation structure 82 (i.e., a volume-weighted average of dielectric materials and voids within the drain-select-level isolation structure 82) can be less than 3.9.

The drain-select-level isolation structures 82 can laterally extend along the first horizontal direction hd1. Each backside trench 79 can have a uniform width that is invariant along the lengthwise direction (i.e., along the first horizontal direction hd1). Multiple rows of memory opening fill structures 58 can be located between a neighboring pair of a backside trench 79 and a drain-select-level isolation structure 82, or between a neighboring pair of drain-select-level isolation structures 82.

In one embodiment, each of the first memory opening fill structures 58A comprises a respective cylindrical outer sidewall vertically extending through each of the word-line-level electrically conductive layers 46W. In one embodiment, each of the first memory opening fill structures 58A comprises a horizontal surface connecting a bottom edge of the respective planar straight sidewall to a top edge of the respective cylindrical outer sidewall.

Figure 15A:
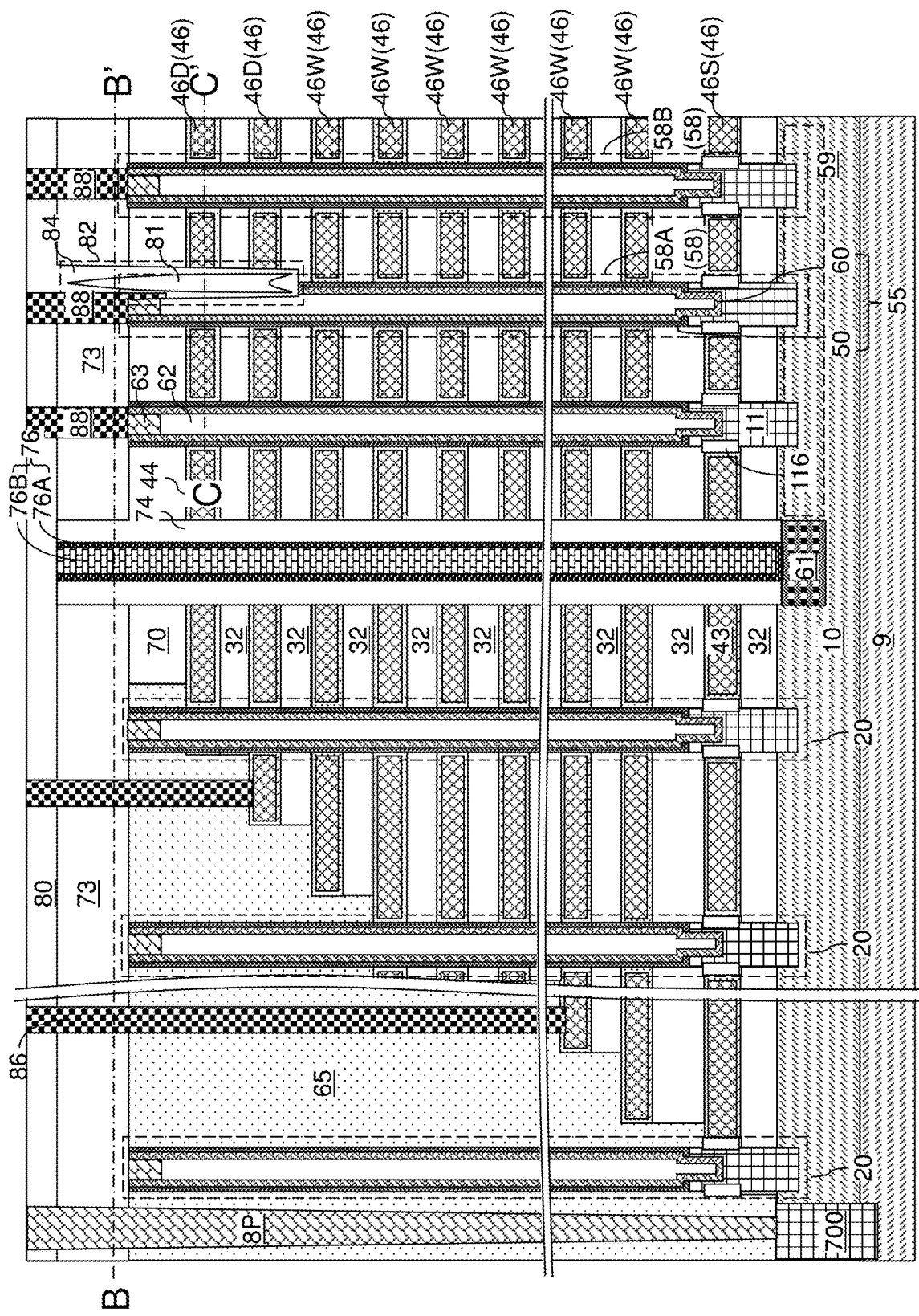
FIG. 15A is a schematic vertical cross-sectional view of the first exemplary structure after formation of additional contact via structures according to the first embodiment of the present disclosure.
Figure 15B:
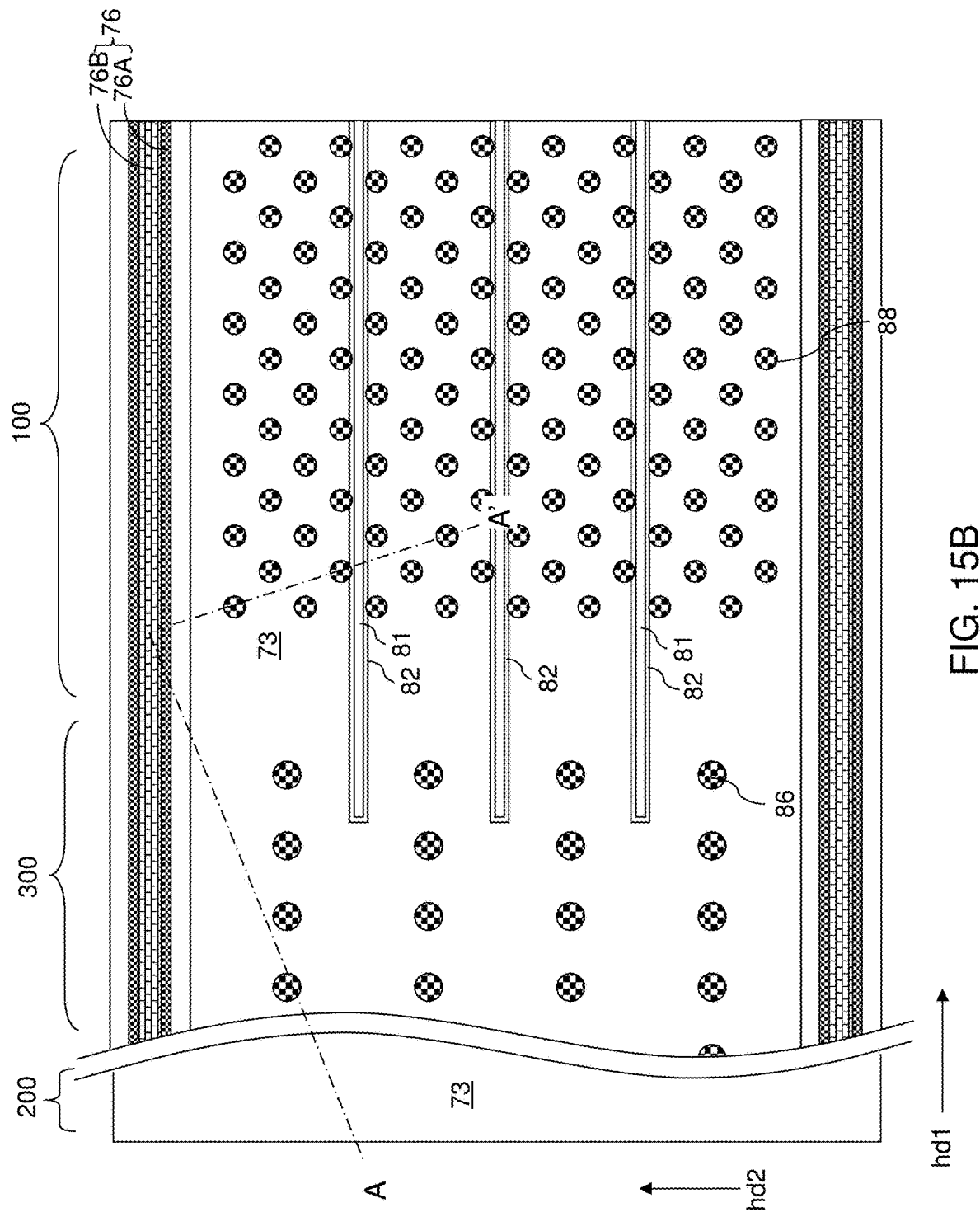
FIG. 15B is a horizontal cross-sectional view of the first exemplary structure along the horizontal plane B-B' of FIG. 15A. The vertical plane A-A' is the plane of the schematic vertical cross-sectional view of FIG. 15A.
Figure 15C:
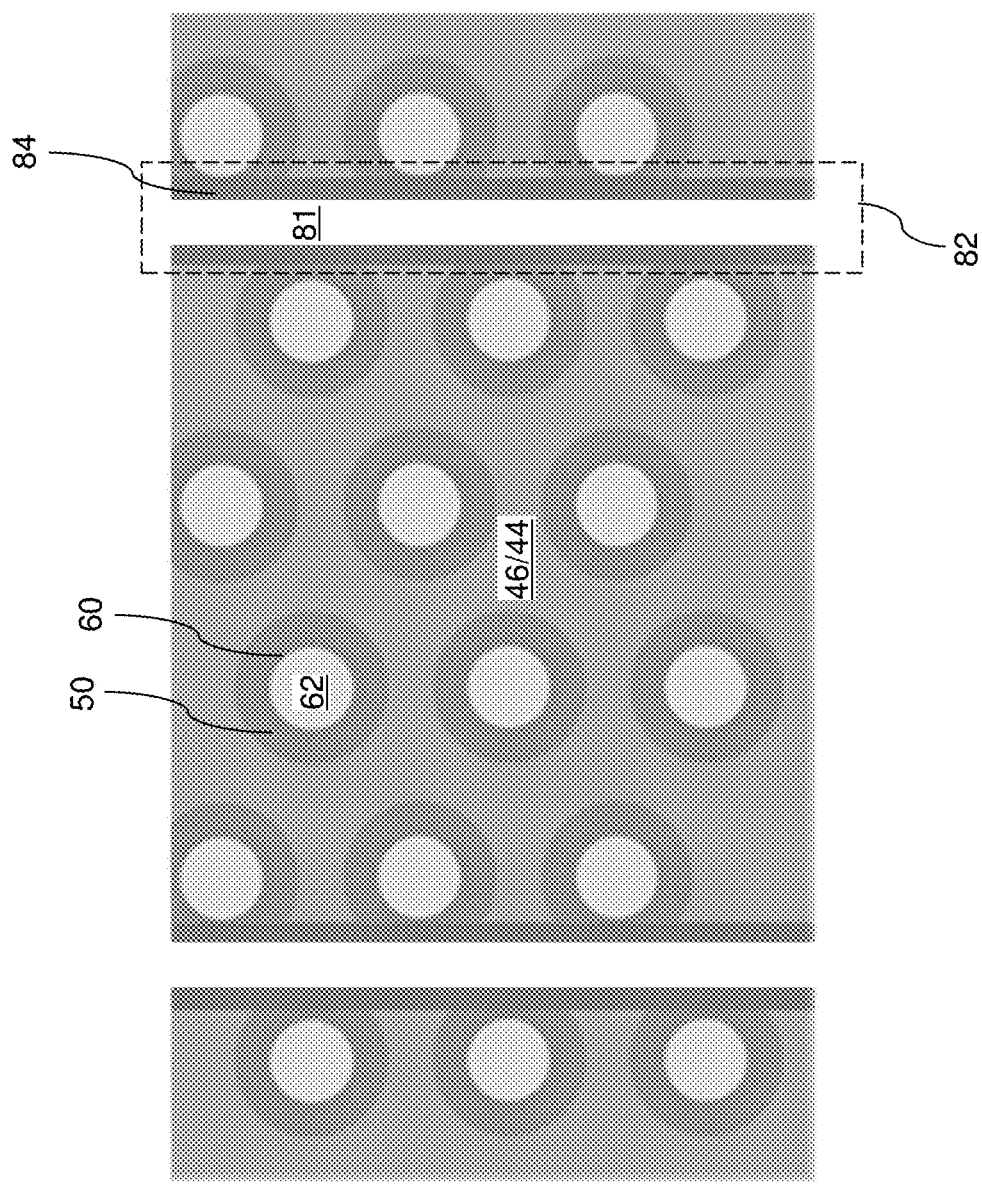
FIG. 15C is a horizontal cross-sectional view of the first exemplary structure along the horizontal plane C-C' of FIG. 15A.

Referring to FIGS. 15A-15C, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Layer contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the at least one semiconductor device 700.

The contact-level dielectric layer 73 overlies the alternating stack (32, 46) and the arrays of memory opening fill structures 58. The drain contact via structures 88 vertically extend through the contact-level dielectric layer 73, and contacts a top surface of a respective one of the memory opening fill structures 58. Specifically, each of the drain contact via structures 88 can be formed on a top surface of a respective one of the drain regions 63. The drain-select-level isolation structures 82 can be formed prior to formation of the drain contact via structures 88 by depositing the dielectric fill material within the drain-select-level isolation trenches 71. The drain contact via structures 88 protrude above the horizontal plane including the top surface of the contact-level dielectric layer 73.

In one embodiment, a subset of the drain contact via structures 88 contacting the first memory opening fill structures 58A can comprise a respective vertically straight and laterally convex sidewall that contacts a vertically straight and laterally concave sidewall segment of a drain-select-level isolation structure 82. As used herein, a vertical straight sidewall refers to a sidewall that is straight in a vertical cross-sectional profile that is present in a vertical cross-sectional view. A laterally convex sidewall refers to a sidewall that has a convex profile in a horizontal cross-sectional view. A laterally concave sidewall refers to a sidewall that has a concave profile in a horizontal cross-sectional view.

In one embodiment, alignment between the drain contact via structures 88 and the drain regions 63 may have a non-zero overlay error, and at least one of the drain contact via structures 88 may comprise a bottom surface contacting a top surface of one of the drain regions 63 and a downward-protruding portion vertically extending through a peripheral portion of a drain-select-level isolation structure 82 and contacting a planar sidewall of the one of the drain regions 63.

The horizontally-extending portion of the capping dielectric material layer 80 can overlie the top surface of the contact-level dielectric layer 73. Each drain-select-level isolation structure 82 can comprise a vertically-extending portion of the capping dielectric material layer 80. The top surfaces of the drain contact via structures 88 can be located within a horizontal plane including a top surface of the capping dielectric material layer 80.

Figure 16A:
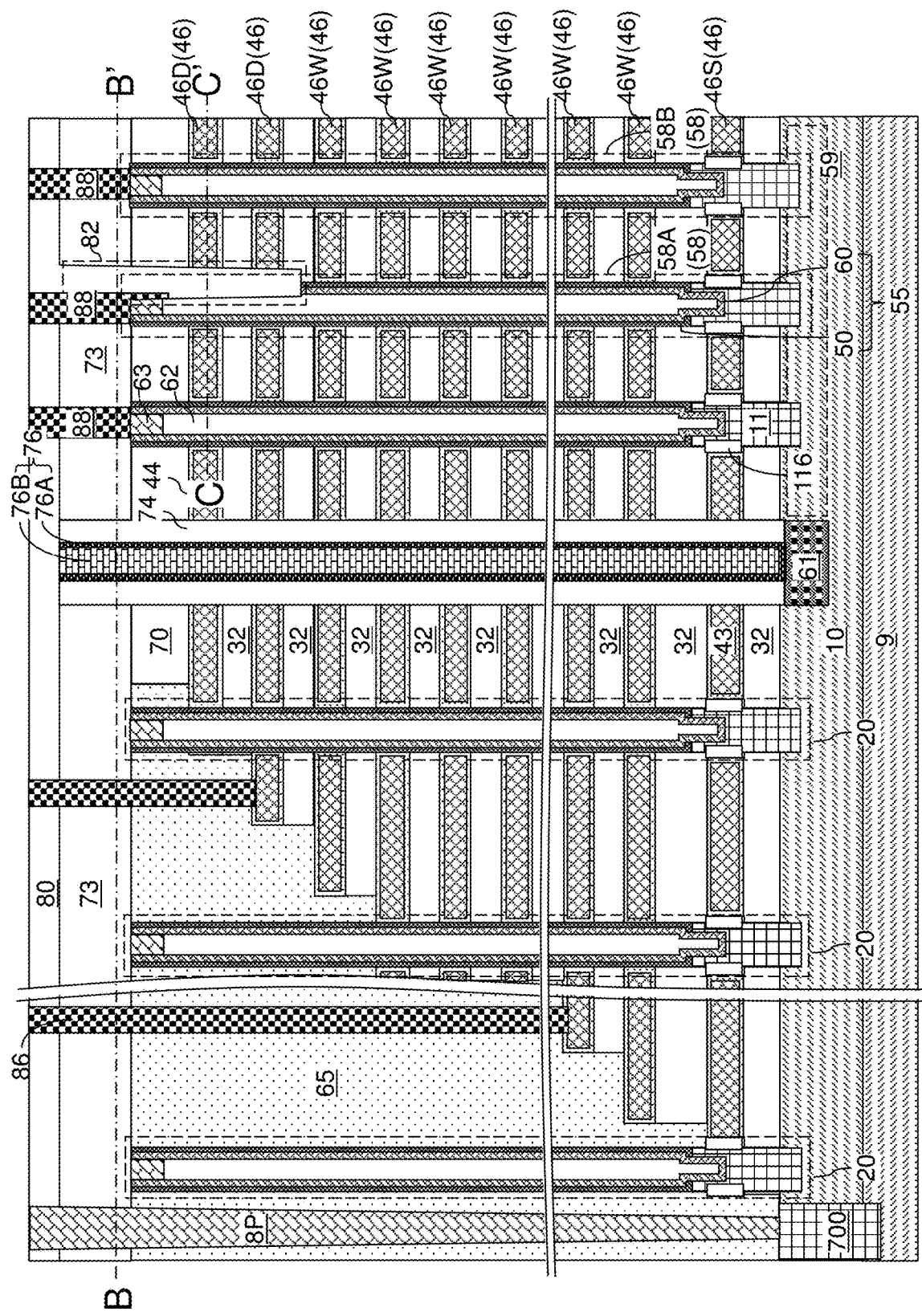
FIG. 16A is a schematic vertical cross-sectional view of an alternative configuration of the first exemplary structure after formation of additional contact via structures according to the first embodiment of the present disclosure.
Figure 16B:
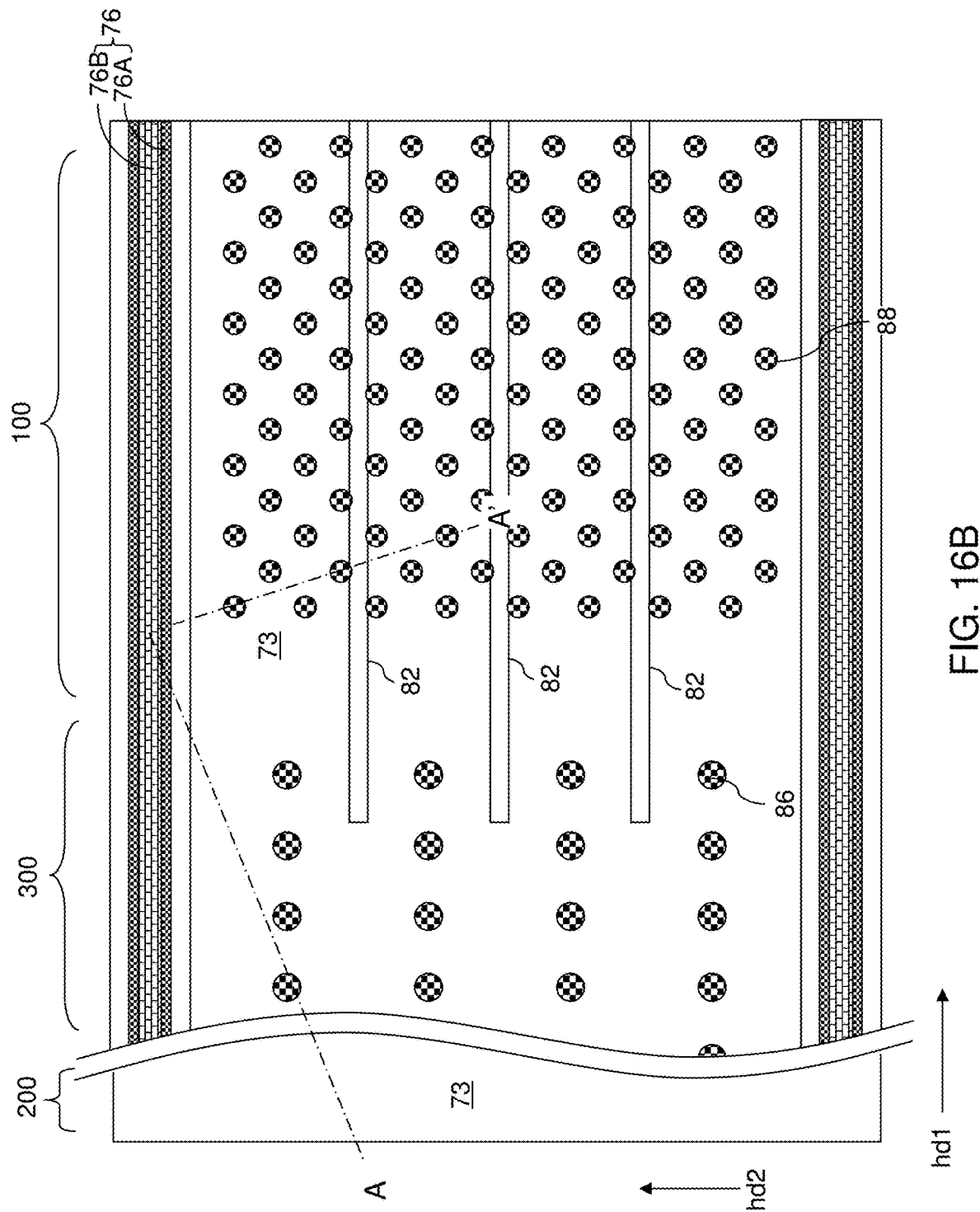
FIG. 16B is a horizontal cross-sectional view of the first exemplary structure along the horizontal plane B-B' of FIG. 16A. The vertical plane A-A' is the plane of the schematic vertical cross-sectional view of FIG. 16A.
Figure 16C:
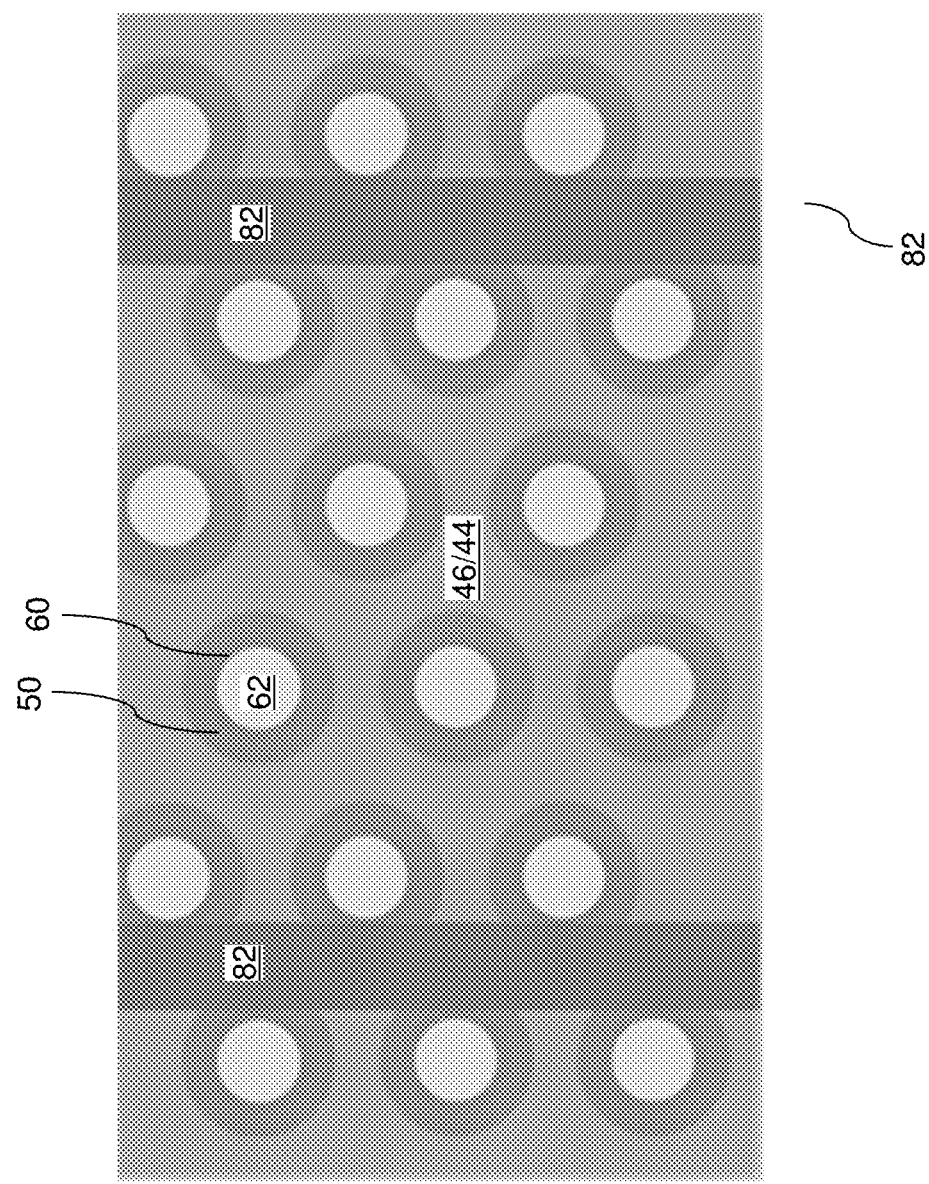
FIG. 16C is a horizontal cross-sectional view of the first exemplary structure along the horizontal plane C-C' of FIG. 16A.

Referring to FIGS. 16A-16C, an alternative configuration of the first exemplary structure of the first embodiment is illustrated after formation of the additional contact via structures (88, 86, 8P). The alternative configuration of the first exemplary structure can be derived from the first exemplary structure by modifying the anisotropic deposition process employed to deposit the dielectric fill material of the capping dielectric material layer 80. Specifically, a less anisotropic deposition process or an isotropic deposition process may be employed to deposit the capping dielectric material layer 80. In one embodiment, the deposition process that deposits the dielectric fill material of the capping dielectric material layer 80 may deposit the dielectric fill material in the drain-select-level isolation trenches 71 in a manner that does not form encapsulated cavities 81. In this case, the entire volume of each drain-select-level isolation structure 82 may be filled with a dielectric material having a dielectric constant less than 3.9, such as fluorosilicate glass having a dielectric constant of about 3.5, a non-porous organosilicate glass (e.g., carbon doped glass) having a dielectric constant of about 3.0, or a porous organosilicate glass having a dielectric constant in a range from 2.0 to 3.0. In this case, each drain-select-level isolation structure 82 may have an effective dielectric constant that is less than 3.9.

Figure 17:
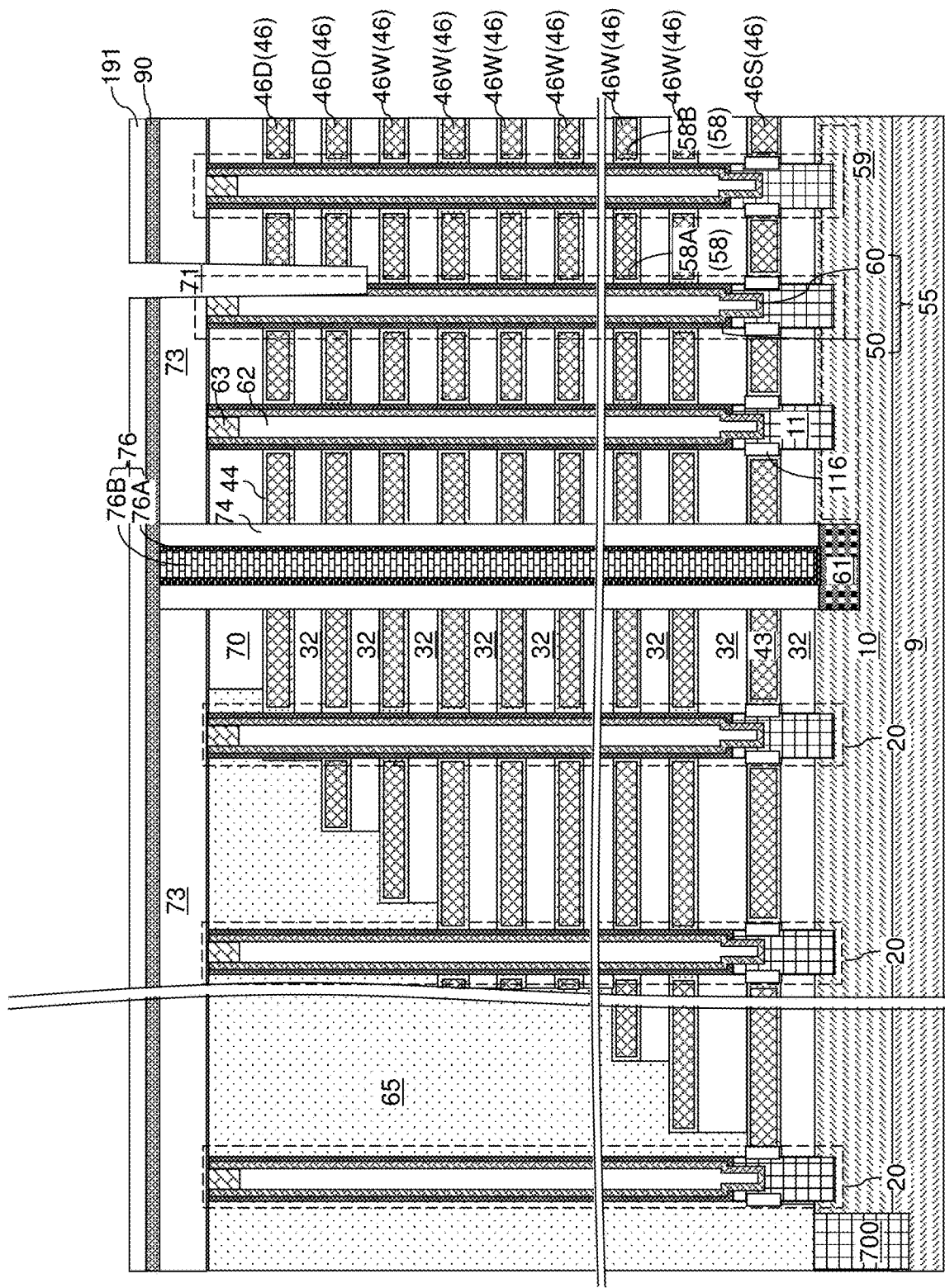
FIG. 17 is a schematic vertical cross-sectional view of a second exemplary structure after formation of a hard mask dielectric layer, a sacrificial dielectric pad layer, and drain-select-level isolation trenches according to a second embodiment of the present disclosure.

Referring to FIG. 17, a second exemplary structure according to the second embodiment of the present disclosure can be derived from the first exemplary structure illustrated in FIGS. 12A and 12B by forming a hard mask dielectric layer 90 and an optional sacrificial dielectric pad layer 191, and by forming drain-select-level isolation trenches 71.

The hard mask dielectric layer 90 includes a dielectric material that may be employed as a hard mask during a subsequent planarization process (such as a chemical mechanical polishing process or an etch back process) or a subsequent etch process. For example, the hard mask dielectric layer 90 may include silicon nitride, silicon oxynitride, silicon carbide, silicon carbide nitride, or a stack thereof. The thickness of the hard mask dielectric layer 90 may be in a range from 10 nm to 100 nm, although lesser and greater thicknesses may also be employed.

The sacrificial dielectric pad layer 191 includes a sacrificial dielectric material that can be removed during a subsequent planarization process. For example, the sacrificial dielectric pad layer 191 can include undoped silicate glass or a doped silicate glass. The thickness of the sacrificial dielectric pad layer 191 can be in a range from 10 nm to 200 nm, although lesser and greater thicknesses may also be employed.

A photoresist layer can be applied over the sacrificial dielectric pad layer 191, and can be lithographically patterned in the same pattern as the pattern of the openings in the photoresist layer employed to pattern the drain-select-level isolation trenches 71 at the processing steps of FIGS. 13A and 13B. Subsequently, an anisotropic etch process can be performed to transfer the pattern of the openings in the photoresist layer through the sacrificial dielectric pad layer 191, the hard mask dielectric layer 90, the contact-level dielectric layer 73, and underlying portions of the first memory opening fill structures 58, the drain-select-level electrically conductive layers 46D, and the drain-select-level insulating layers 32. Generally, the processing steps of FIGS. 13A and 13B may be performed with a modification in the anisotropic etch process so that unmasked portions of the sacrificial dielectric pad layer 191 and the hard mask dielectric layer 90 are etched prior to etching the unmasked portions of the contact-level dielectric layer 73.

According to an aspect of the present disclosure, a planar straight sidewall of each of the first memory opening fill structures 58A is physically exposed upon formation of the drain-select-level isolation trenches 71 by the anisotropic etch process. In one embodiment, each of the first memory opening fill structures 58A has the same respective horizontal cross-sectional shape having the arc-shaped periphery that is adjoined to a straight periphery that is parallel to the first horizontal direction hd1, as in the first embodiment. The straight periphery is a horizontal line contained within a planar sidewall of one of the drain-select-level isolation trenches 71.

Figure 18:
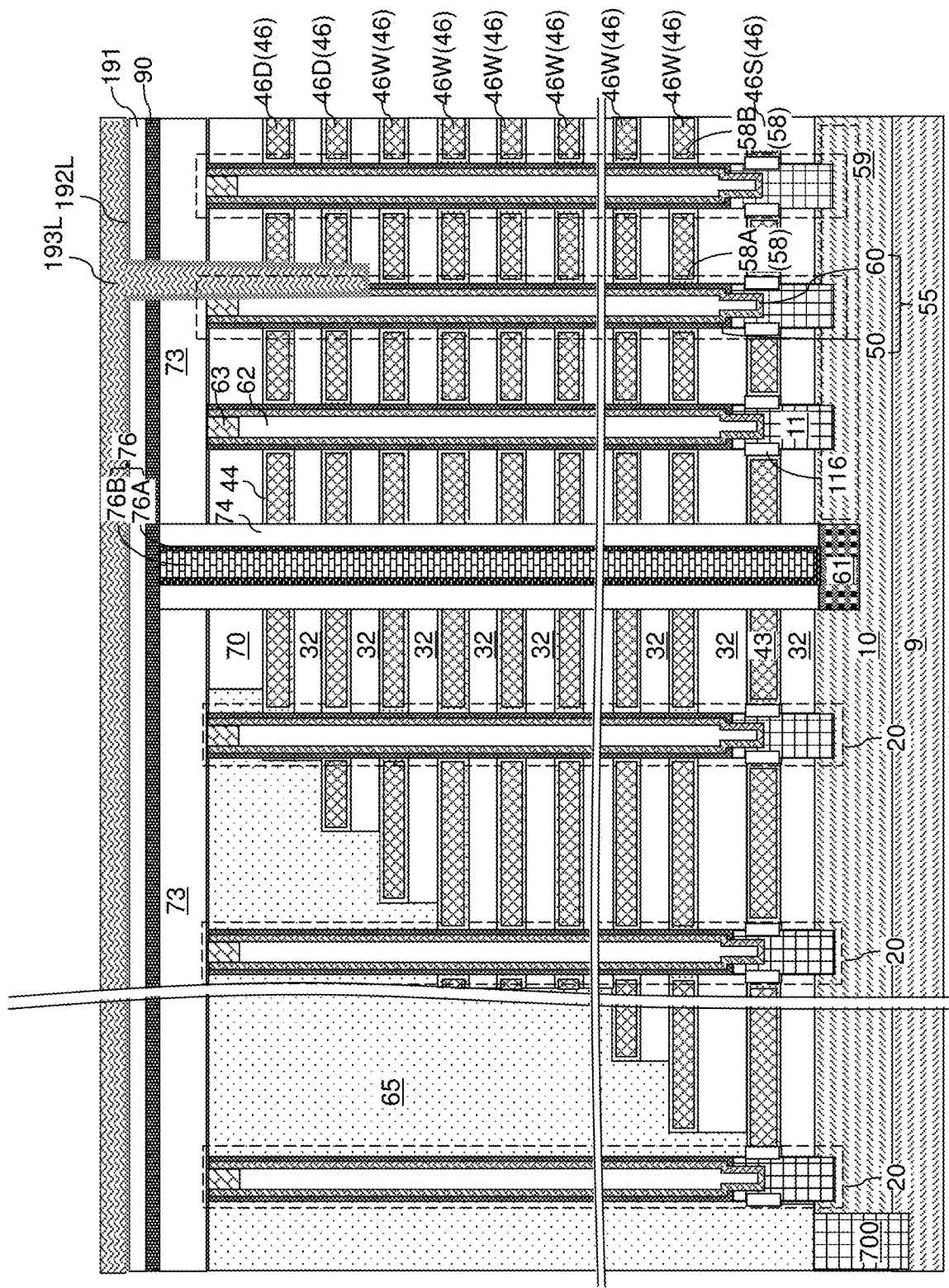
FIG. 18 is a schematic vertical cross-sectional view of the second exemplary structure after formation of a dielectric liner and a sacrificial trench fill material layer according to the second embodiment of the present disclosure.

Referring to FIG. 18, a dielectric liner layer 192L can be conformally deposited on the sidewalls and the bottom surfaces of the drain-select-level isolation trenches 71 and over the sacrificial dielectric pad layer 191. The dielectric liner layer 192L includes a dielectric material such as silicon oxide or a dielectric metal oxide (e.g., aluminum oxide), and can have a thickness in a range from 1 nm to 20 nm, such as from 1.5 nm to 10 nm, although lesser and greater thicknesses may also be employed.

A sacrificial trench fill material layer 193L including a sacrificial fill material can be deposited on the physically exposed surfaces of the dielectric liner layer 192L. The sacrificial trench fill material layer 193L can be deposited in remaining unfilled volumes of the drain-select-level isolation trenches 71 and over the sacrificial dielectric pad layer 191. The sacrificial fill material comprises a material that can be removed selective to the material of the dielectric liner layer 192L. For example, if the dielectric liner layer 192L includes undoped silicate glass or a dielectric metal oxide, then the sacrificial trench fill material layer 193L may include borosilicate glass which has an etch rate in HF vapor that is much higher than the etch rate of the dielectric liner layer 192L in HF vapor. The thickness of the sacrificial trench fill material layer 193L, as measured over in a horizontally-extending portion, may be in a range from 50 nm to 400 nm, although lesser and greater thicknesses may also be employed.

Figure 19:
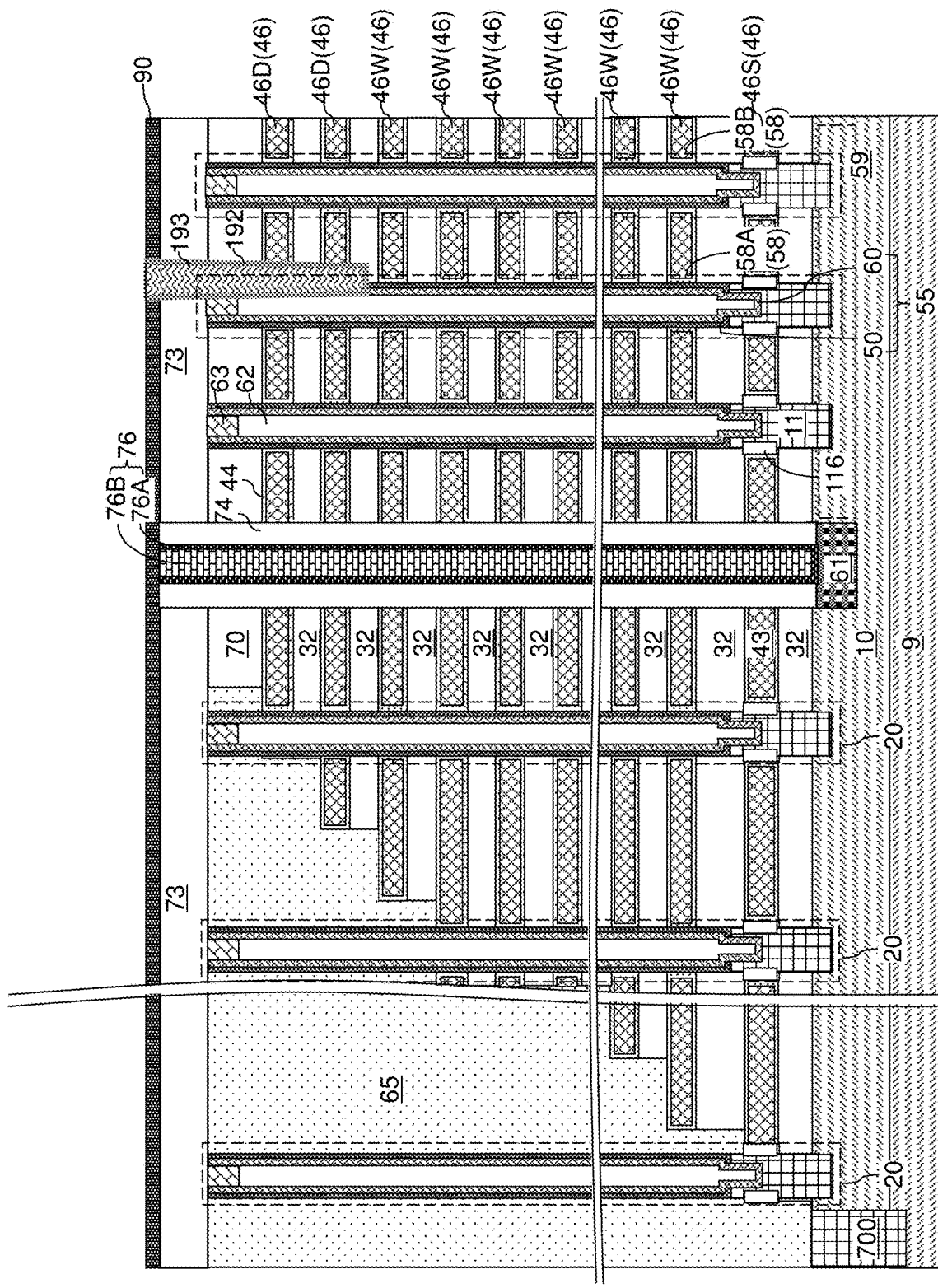
FIG. 19 is a schematic vertical cross-sectional view of the second exemplary structure after formation of sacrificial drain-select-level trench fill structures according to the second embodiment of the present disclosure.

Referring to FIG. 19, a planarization process can be performed to remove portions of the sacrificial trench fill material layer 193L, the dielectric liner layer 192L, and the sacrificial dielectric pad layer 191 located above the horizontal plane including the top surface of the hard mask dielectric layer 90. The planarization process may employ chemical mechanical polishing and/or a recess etch process. A top surface of the hard mask dielectric layer 90 may be employed as a stopping surface for the planarization process. A combination of a patterned remaining portion of the dielectric liner layer 192L and a patterned remaining portion of the sacrificial trench fill material layer 193L is located within each volume of the drain-select-level isolation trenches 71. Each patterned portion of the sacrificial trench fill material layer 193L constitutes a sacrificial drain-select-level trench fill structure 193. Each patterned portion of the dielectric liner layer 192L constitutes a dielectric liner 192.

Figure 20:
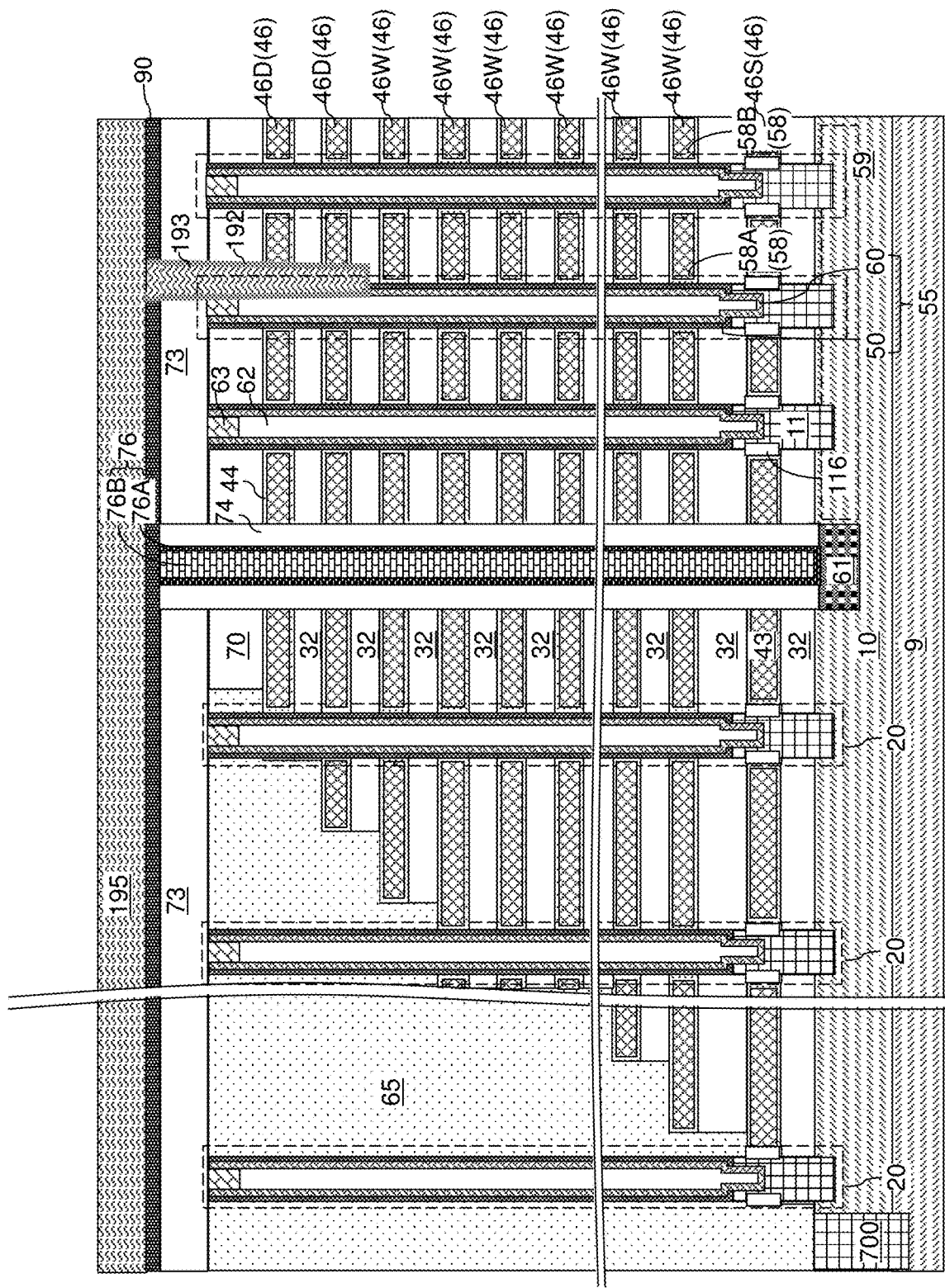
FIG. 20 is a schematic vertical cross-sectional view of the second exemplary structure after formation of a sacrificial matrix layer according to the second embodiment of the present disclosure.

Referring to FIG. 20, a sacrificial matrix layer 195 can be deposited over the hard mask dielectric layer 90 and the sacrificial drain-select-level trench fill structures 193. The sacrificial matrix layer 195 includes a material that can be removed selective to the materials of the dielectric liners 192 and the hard mask dielectric layer 90. For example, the sacrificial matrix layer 195 can include a dielectric material such as borosilicate glass or organosilicate glass. The thickness of the sacrificial matrix layer 195 can be in a range from 100 nm to 600 nm, although lesser and greater thicknesses may also be employed.

Figure 21:
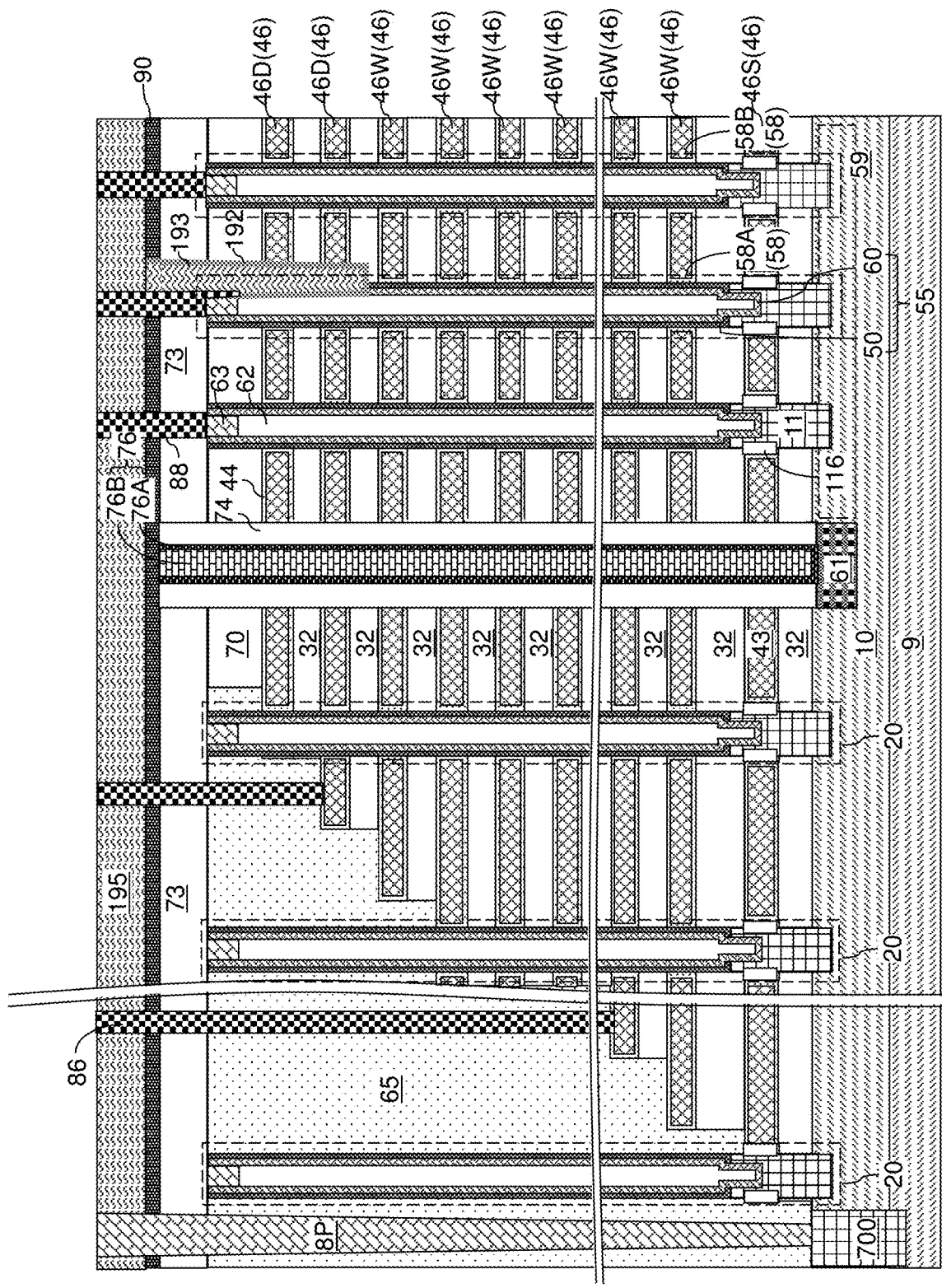
FIG. 21 is a schematic vertical cross-sectional view of the second exemplary structure after formation of contact via structures according to the second embodiment of the present disclosure.

Referring to FIG. 21, a photoresist layer (not shown) can be applied over the sacrificial matrix layer 195, and can be lithographically patterned to form opening in areas of the drain regions 63, areas of the stepped surfaces of the electrically conductive layers 46, and areas of electrical nodes of the at least one semiconductor devices 700. An anisotropic etch process can be performed to etch unmasked portions of the sacrificial matrix layer 195, the hard mask dielectric layer 90, and the contact-level dielectric layer 73 and underlying dielectric material portions, if any, thereby forming various via cavities. The drain regions 63, the electrically conductive layers 46, and the electrical nodes of the at least one semiconductor device 700 may be employed as etch stop structures for the anisotropic etch process. In some embodiments, at least one of the via cavities extending to a drain region 63 may have a non-zero overlay variation, and may etch into a portion of a sacrificial drain-select-level trench fill structure 193 and physically expose a sidewall of a first memory opening fill structure 58A such as a sidewall of a drain region 63. In one embodiment, a portion of a dielectric liner 192 may be collaterally recessed in case one of the via cavities overlying a drain region 63 protrudes downward below the top surface of the drain region 63. The photoresist layer can be subsequently removed, for example, by ashing.

At least one conductive material can be conformally deposited in the various via cavities. For example, the at least one conductive material may include a metallic barrier liner including a conductive metallic nitride (e.g., TiN, TaN, or WN) or a conductive metallic carbide (TiC, TaC, or WC), and a metallic fill material such as W, Ti, Ta, Mo, Ru, Co, Cu, etc. Excess portions of the at least one conductive material can be removed from above the horizontal plane including the top surface of the sacrificial matrix layer 195 by a planarization process, which may include a chemical mechanical polishing process and/or a recess etch process. Each remaining portion of the at least one conductive material contacting a respective one of the drain regions 63 constitutes a drain region 88. Each remaining portion of the at least one conductive material contacting a respective one of the electrically conductive layers 46 constitutes a layer contact via structure 86. Peripheral device contact via structures 8P can be formed through the retro-stepped dielectric material portion 65 directly on respective nodes of the at least one semiconductor device 700. The drain contact via structures 88 can be formed through the sacrificial matrix layer 195, the hard mask dielectric layer 90, and the contact-level dielectric layer 73 on top surfaces of the drain regions 63. In one embodiment, a subset of the drain contact via structures 88 comprises a respective vertically straight and laterally convex sidewall that contacts a vertically straight and laterally concave sidewall segment of the drain-select-level isolation structure.

In one embodiment, at least one of the drain contact via structures 88 may comprise a bottom surface contacting a top surface of one of the drain regions 63 and a downward-protruding portion contacting a planar sidewall of the one of the drain regions 63 of one of the first memory opening fill structures 58A. In one embodiment, the downward-protruding portion protrudes downward from a horizontal plane including the top surfaces of the drain regions 63 and contacts the sidewall of one of the drain regions 63, and the downward-protruding portion may contact a recessed surface of the dielectric liner 192.

Figure 22:
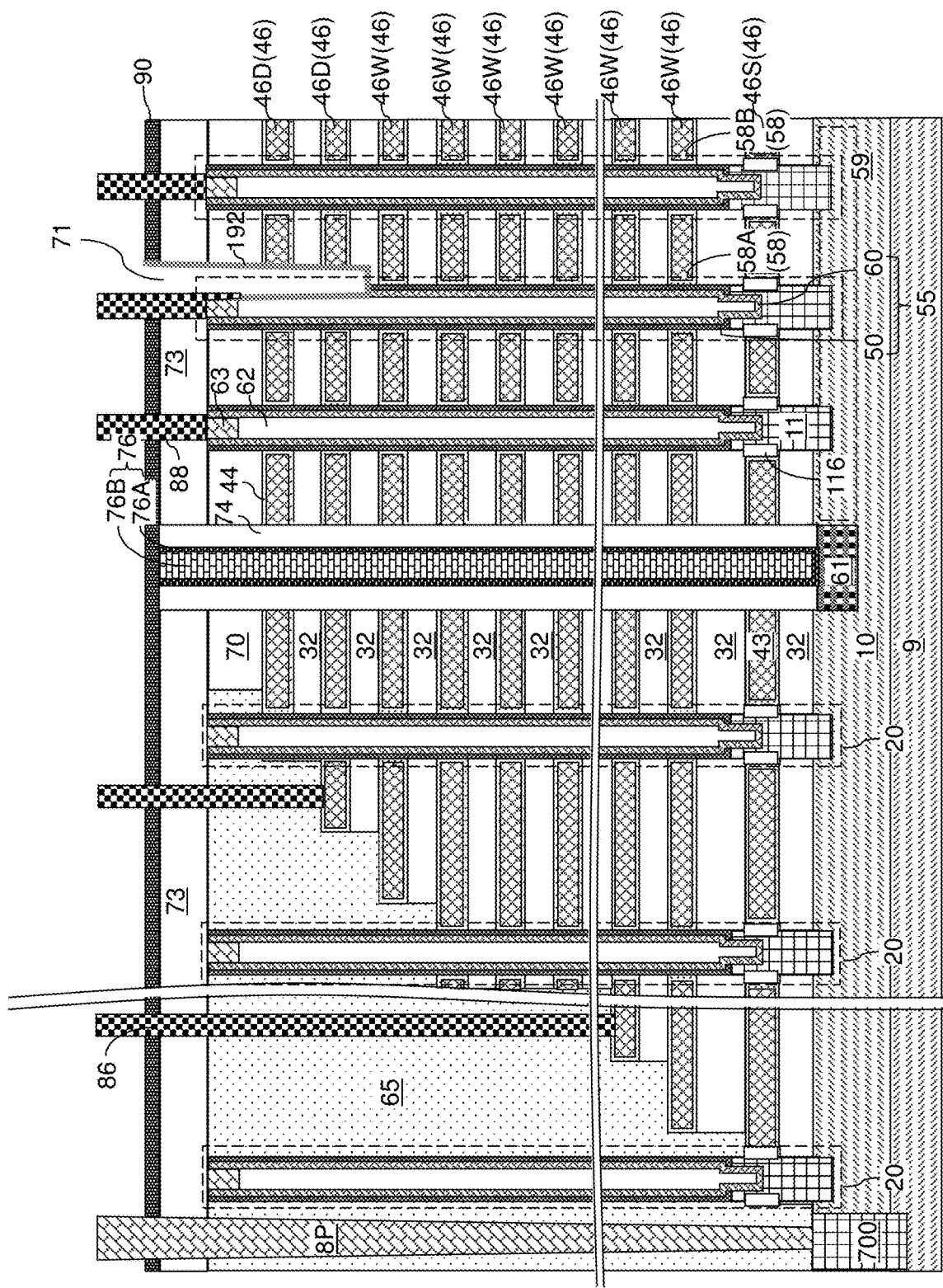
FIG. 22 is a schematic vertical cross-sectional view of the second exemplary structure after removal of the sacrificial matrix layer and the sacrificial drain-select-level trench fill structures according to the second embodiment of the present disclosure.

Referring to FIG. 22, the sacrificial matrix layer 195 and the sacrificial drain-select-level trench fill structures 193 can be removed selective to the materials of the hard mask dielectric layer 90, the dielectric liners 192, and the various contact via structures (88, 86, 8P). In one embodiment, the sacrificial matrix layer 195 and the sacrificial drain-select-level trench fill structures 193 may comprise borosilicate glass and/or organosilicate glass. The sacrificial matrix layer 195 can be removed selective to the hard mask dielectric layer 90, and the sacrificial fill material of the sacrificial drain-select-level trench fill structures 193 can be removed selective to the hard mask dielectric layer 90, the dielectric liners 192, and the various contact via structures (88, 86, 8P). In case the sacrificial matrix layer 195 and the sacrificial drain-select-level trench fill structures 193 comprise borosilicate glass and/or organosilicate glass, a dry etch employing HF vapor (e.g., for borosilicate glass) or a wet etch process employing dilute hydrofluoric acid may be performed to remove the sacrificial matrix layer 195 and the sacrificial drain-select-level trench fill structures 193.

Figure 23:
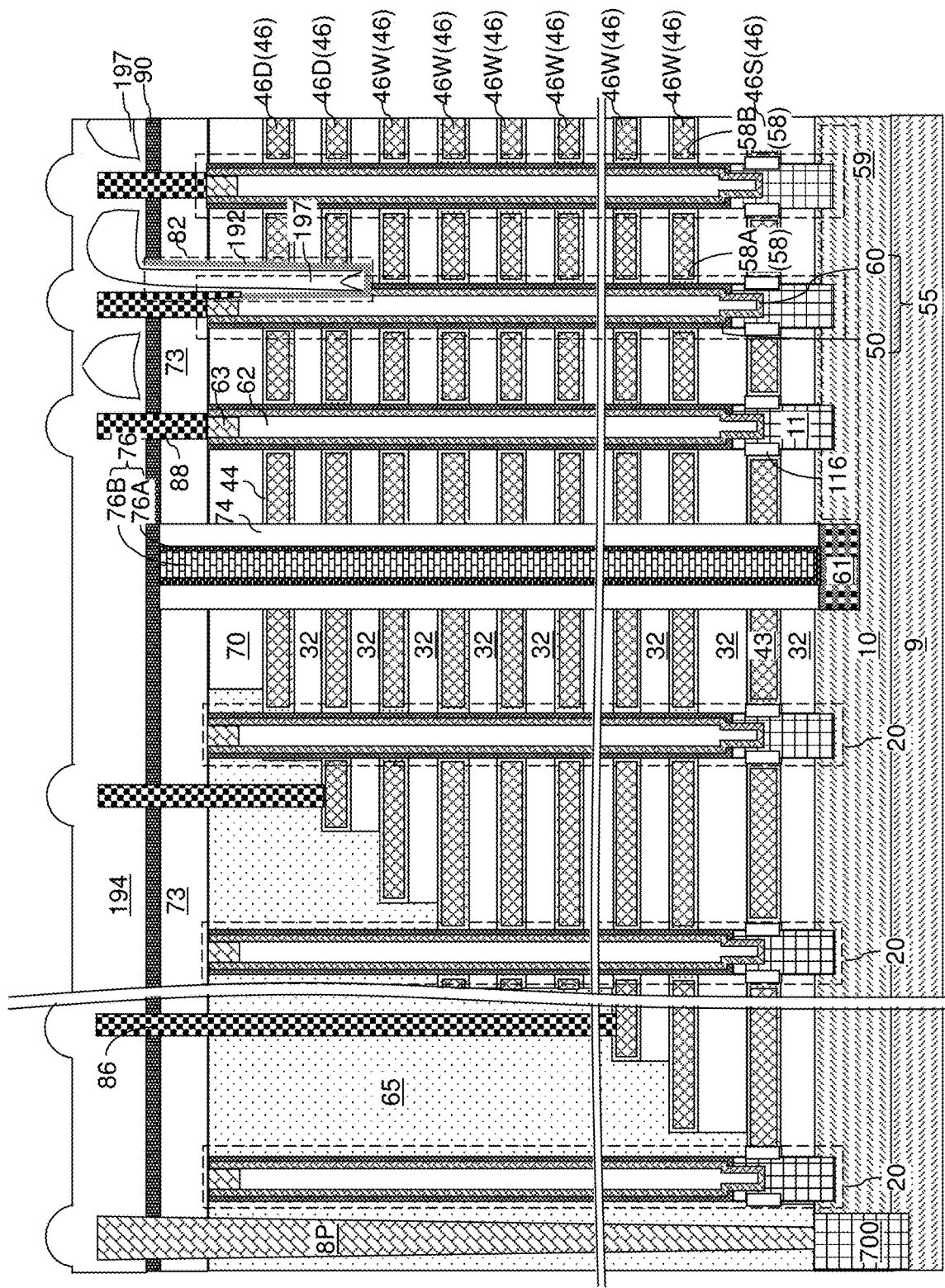
FIG. 23 is a schematic vertical cross-sectional view of the second exemplary structure after formation of a capping dielectric material layer according to the second embodiment of the present disclosure.

Referring to FIG. 23, a dielectric fill material can be anisotropically deposited to form a capping dielectric material layer 194. The dielectric fill material can be anisotropically deposited within the volume of the drain-select-level isolation trenches 71 on the dielectric liners 192, and over the hard mask dielectric layer 90. The capping dielectric material layer 194 can include a horizontally-extending portion overlying the alternating stack (32, 46) and the hard mask dielectric layer 90, and dielectric fill material portions that are deposited in the volumes of the drain-select-level isolation trenches 71. Material portions that are formed within the volumes of the drain-select-level isolation trenches 71 constitute drain-select-level isolation structures 82. Each dielectric fill material portion of the capping dielectric material layer 194 that protrudes downward into a volume of a drain-select-level isolation trench 71 is a portion of a drain-select-level isolation structure, and may embed a respective encapsulated cavity 197 and may be laterally surrounded by a respective dielectric liner 192.

In one embodiment, the dielectric fill material may be anisotropically deposited over the drain contact via structures 88. The drain contact via structures 88 protrude above the horizontal plane including the top surface of the contact-level dielectric layer 73. In one embodiment, the capping dielectric material layer 194 embeds at least one encapsulated cavity (i.e., air gap) 197 including a lower portion located within a respective drain-select-level isolation structure 82 and an upper portion located above the horizontal plane including the top surface of the contact-level dielectric layer 73. In one embodiment, the upper portion of an encapsulated cavity 197 may be located above the horizontal plane including the top surface of the hard mask dielectric layer 90.

In one embodiment, each drain-select-level isolation structure 82 may vertically extend through the drain-select-level electrically conductive layers 46D between two rows of first memory opening fill structures 58A of the array of memory opening structures 58, and may laterally extend along a first horizontal direction hd1. Each drain-select-level isolation structure 82 may comprise a dielectric liner 192, a dielectric fill material portion (which is a cavity-containing downward-protruding portion of the capping dielectric material layer 194) contained within the dielectric liner 192, and a volume of an encapsulated cavity 197 that is free of any solid phase material. In one embodiment, the encapsulated cavity 197 may comprise an additional volume embedded within the horizontally-extending portion of the capping dielectric material layer 194 and connected to the volume of the encapsulated cavity 197 within the drain-select-level isolation structure 82.

In one embodiment, the capping dielectric material layer 194 comprises a horizontally-extending portion that overlies the top surface of the contact-level dielectric layer 73. Each dielectric fill material portion of a drain-select-level isolation structure 82 may comprise a vertically-extending portion of the capping dielectric material layer 194. In one embodiment, top surfaces of the drain contact via structures 88 cam be located below a horizontal plane including a top surface of the capping dielectric material layer 194.

In one embodiment, a hard mask dielectric layer 90 can be located between the contact-level dielectric layer 73 and the capping dielectric material layer 194. Each dielectric liner 192 can contact a respective sidewall of the hard mask dielectric layer 90. In one embodiment, the capping dielectric material layer 194 can contact a top surface of the hard mask dielectric layer 90. In one embodiment, each dielectric liner 192 may comprise a top surface contacting a bottom surface of the horizontally-extending portion of the capping dielectric material layer 194. In one embodiment, each encapsulated cavity 197 may be laterally surrounded by a respective dielectric fill material portion that is a portion of the capping dielectric material layer 194, and may be spaced from a dielectric liner 192 by the dielectric fill material portion.

Figure 24:
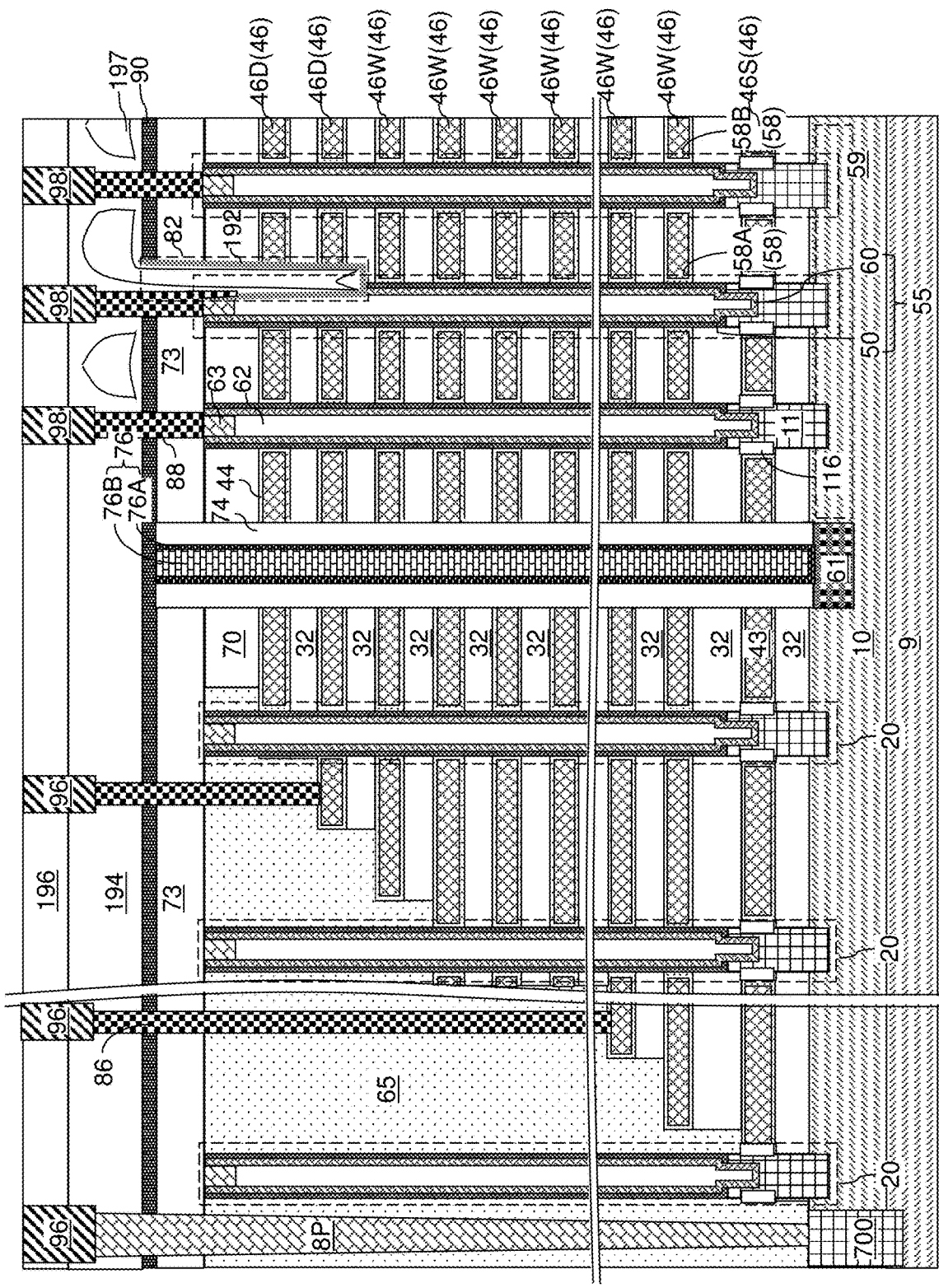
FIG. 24 is a schematic vertical cross-sectional view of the second exemplary structure after formation of a line-level dielectric layer and metal line structures according to the second embodiment of the present disclosure.

Referring to FIG. 24, a line-level dielectric layer 196 can be deposited over the capping dielectric material layer 194. Metal line structures (98, 96) can be formed in the line-level dielectric layer on a top surface of a respective one of the contact via structures (88, 86, 8P). The metal line structures (98, 96) may include, for example, bit lines 98 contacting a respective subset of the drain contact via structures 88 and laterally extending along the second horizontal direction hd2. Further, the metal line structures (98, 96) may include interconnection metal lines 96 that are formed on a respective subset of the layer contact via structures 86 and the peripheral device contact via structures 8P.

Figure 25:
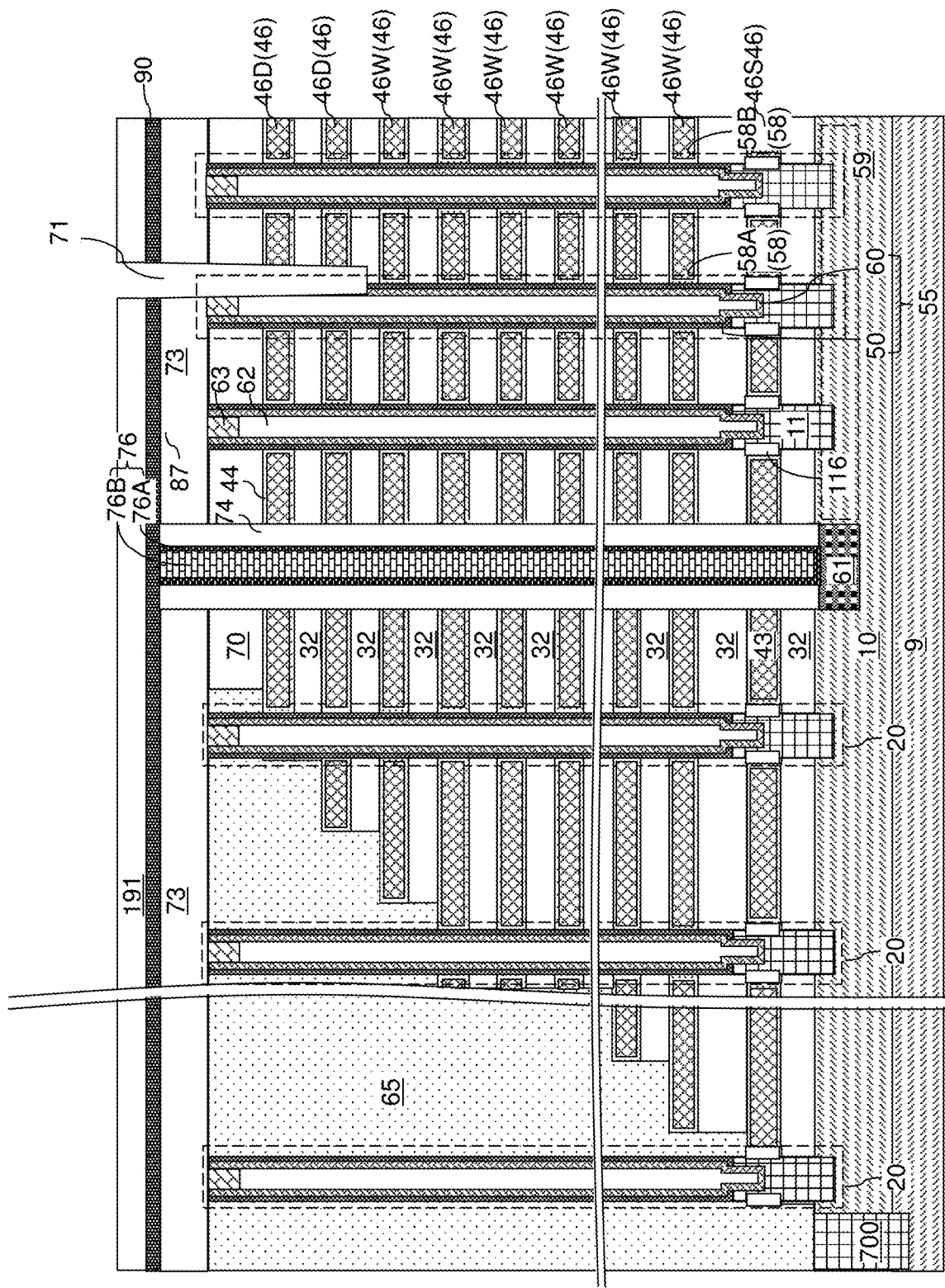
FIG. 25 is a schematic vertical cross-sectional view of a third exemplary structure after formation of a hard mask dielectric layer, a sacrificial dielectric pad layer, and drain-select-level isolation trenches according to a third embodiment of the present disclosure.

Referring to FIG. 25, a third exemplary structure according to the third embodiment of the present disclosure can be the same as the second exemplary structure illustrated in FIG. 17.

Figure 26:
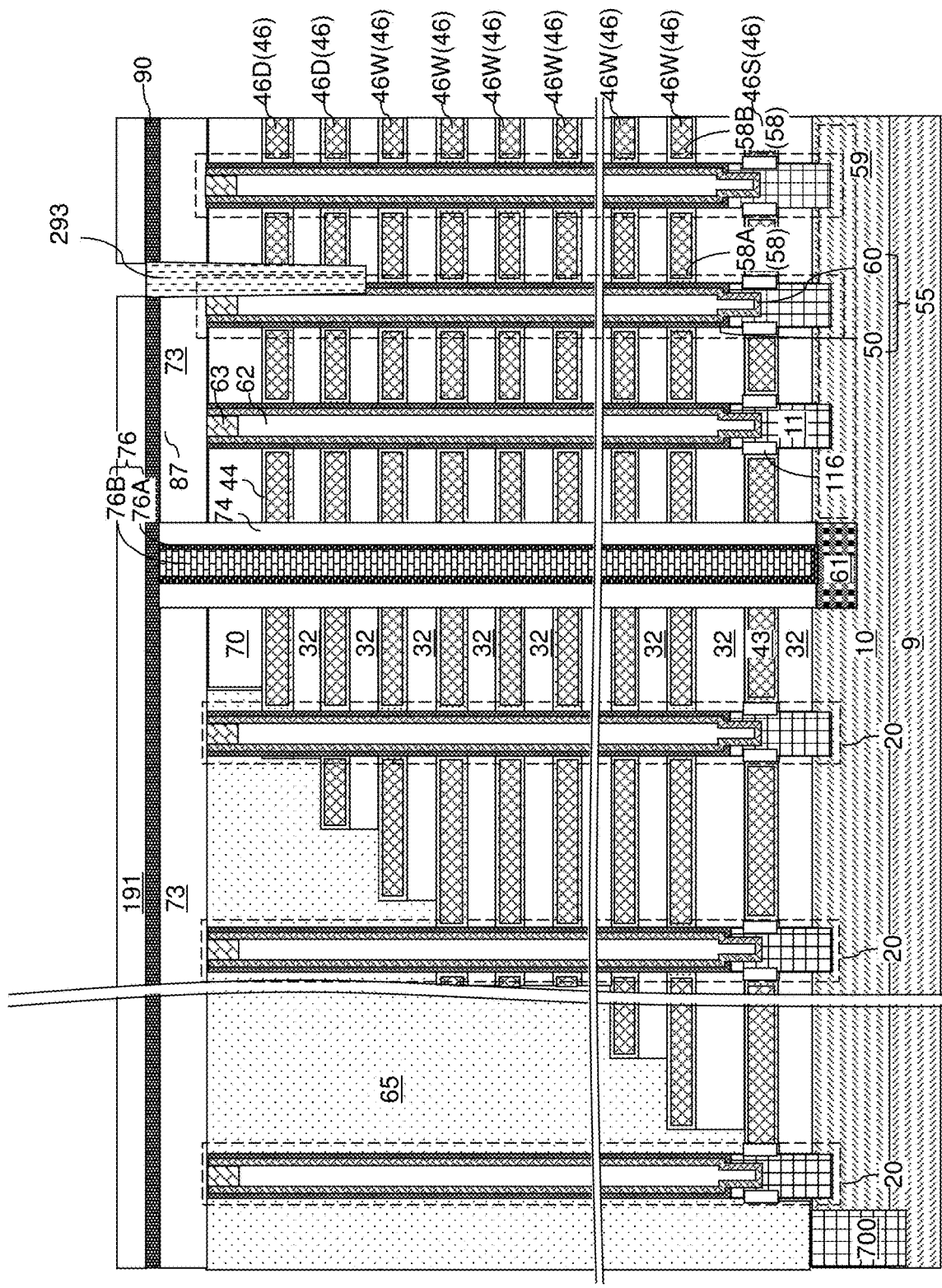
FIG. 26 is a schematic vertical cross-sectional view of the third exemplary structure after formation of sacrificial drain-select-level trench fill structures according to the third embodiment of the present disclosure.

Referring to FIG. 26, a sacrificial trench fill material layer including a sacrificial fill material can be deposited in the drain-select-level isolation trenches 71. The sacrificial fill material comprises a material that can be removed selective to the materials of the sacrificial dielectric pad layer 191, the contact-level dielectric layer 73, the drain regions 63, the electrically conductive layers 46, and the insulating layers 32. For example, the sacrificial trench fill material may include amorphous carbon that can be subsequently ashed in an oxygen-containing ambient, or organosilicate glass or borosilicate glass that can be etched at a faster etch rate than undoped silicate glass. The sacrificial fill material can be removed from outside the volumes of the drain-select-level isolation trenches 71 by a planarization process such as a recess etch process or a chemical mechanical planarization process. Optionally, remaining portions of the sacrificial fill material may be vertically recessed below the horizontal plane including the top surface of the sacrificial dielectric pad layer 191. Each remaining portion of the sacrificial trench fill material layer constitutes a sacrificial drain-select-level trench fill structure 293. The sacrificial dielectric pad layer 191 can be removed by additional polishing or selective etch back.

Figure 27:
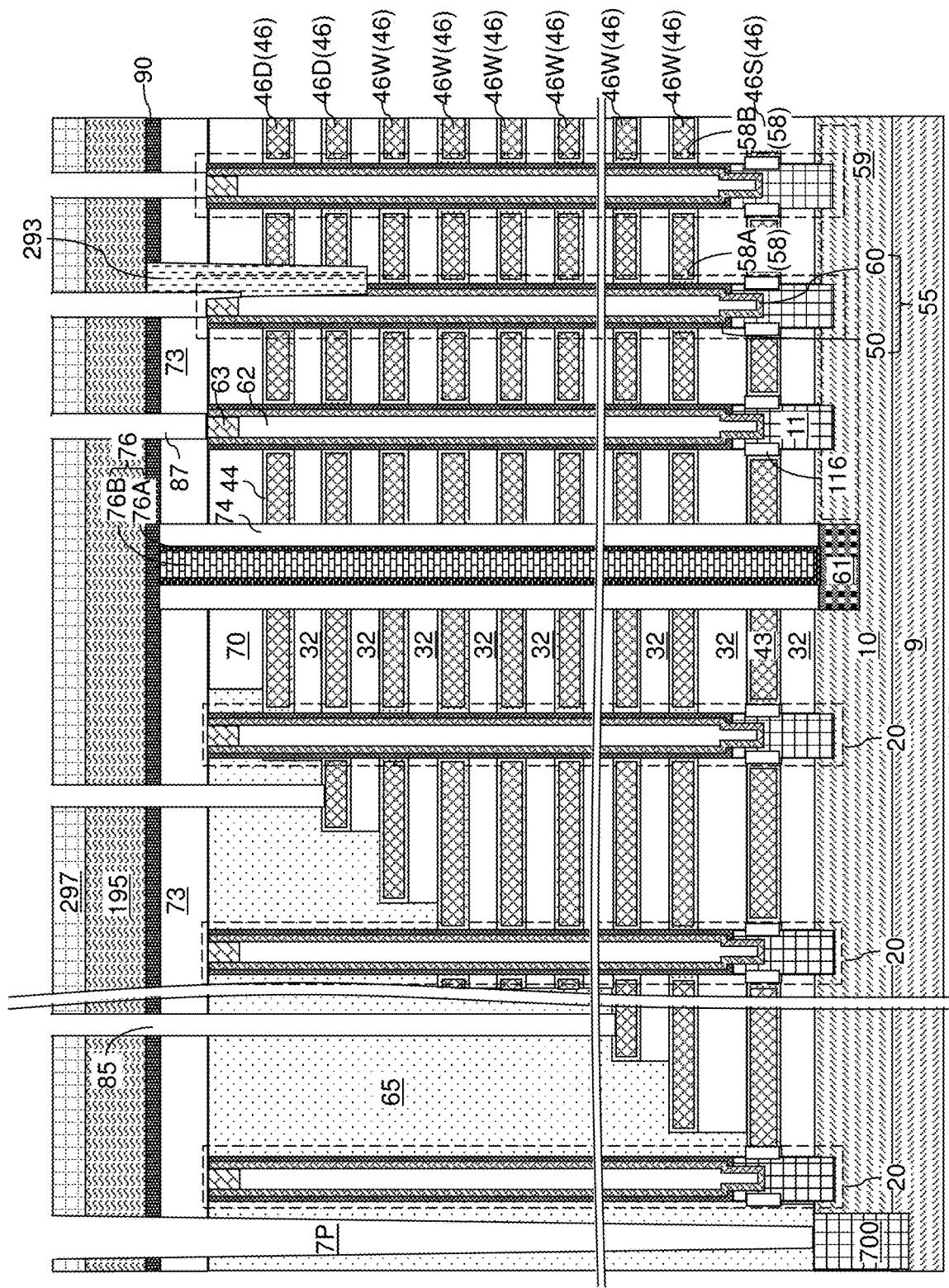
FIG. 27 is a schematic vertical cross-sectional view of the third exemplary structure after formation of a sacrificial matrix layer and a patterning film according to the third embodiment of the present disclosure.

Referring to FIG. 27, a sacrificial matrix layer 195 can be deposited over the hard mask dielectric layer 90 and the sacrificial drain-select-level trench fill structures 293. The sacrificial matrix layer 195 includes a material that can be removed selective to the material of the hard mask dielectric layer 90. For example, the sacrificial matrix layer 195 can include a dielectric material such as borosilicate glass or organosilicate glass. The thickness of the sacrificial matrix layer 195 can be in a range from 100 nm to 600 nm, although lesser and greater thicknesses may also be employed.

A masking layer 297, such as a photoresist layer or a stacked mask process (SMAP) layer stack (e.g., two photoresist layers separated by a spin-on glass layer), can be applied over the sacrificial matrix layer 195, and can be lithographically patterned to form opening in areas of the drain regions 63, areas of the stepped surfaces of the electrically conductive layers 46, and areas of electrical nodes of the at least one semiconductor devices 700. An anisotropic etch process can be performed to etch unmasked portions of the sacrificial matrix layer 195, the hard mask dielectric layer 90, and the contact-level dielectric layer 73 and underlying dielectric material portions, if any, thereby forming various via cavities (87, 85, 7P). The various via cavities (87, 85, 7P) can include drain contact via cavities 87, layer contact via cavities 85, and peripheral contact via cavities 7P. The drain regions 63, the electrically conductive layers 46, and the electrical nodes of the at least one semiconductor device 700 may be employed as etch stop structures for the anisotropic etch process. In some embodiments, at least one of the drain contact via cavities 87 may have a non-zero overlay variation, and may etch into a portion of a sacrificial drain-select-level trench fill structure 293 and physically expose a sidewall of a first memory opening fill structure 58A such as a sidewall of a drain region 63.

Figure 28:
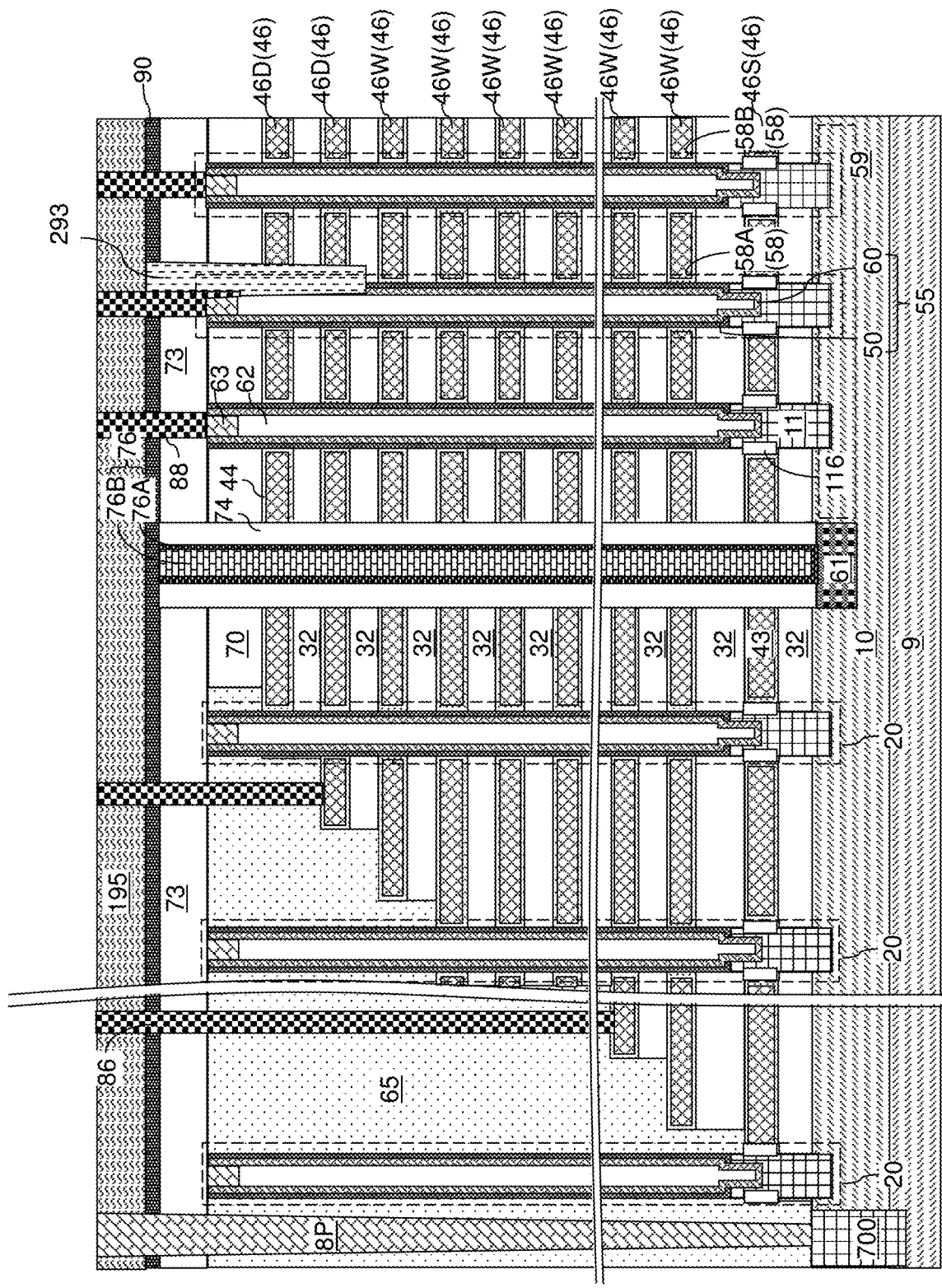
FIG. 28 is a schematic vertical cross-sectional view of the third exemplary structure after formation of contact via structures according to the third embodiment of the present disclosure.

Referring to FIG. 28, the masking layer 297 can be removed by an anisotropic process such as CMP or reactive ion etching (RIE). At least one conductive material can be conformally deposited in the various via cavities (87, 85, 7P). For example, the at least one conductive material may include a metallic barrier liner including a conductive metallic nitride (e.g., TiN, TaN, or WN) or a conductive metallic carbide (TiC, TaC, or WC), and a metallic fill material such as W, Ti, Ta, Mo, Ru, Co, Cu, etc. Excess portions of the at least one conductive material can be removed from above the horizontal plane including the top surface of the sacrificial matrix layer 195 by a planarization process, which may include a chemical mechanical polishing process and/or a recess etch process. Each remaining portion of the at least one conductive material contacting a respective one of the drain regions 63 constitutes a drain region 88. Each remaining portion of the at least one conductive material contacting a respective one of the electrically conductive layers 46 constitutes a layer contact via structure 86. Peripheral device contact via structures 8P can be formed through the retro-stepped dielectric material portion 65 directly on respective nodes of the at least one semiconductor device 700. The drain contact via structures 88 can be formed through the sacrificial matrix layer 195, the hard mask dielectric layer 90, and the contact-level dielectric layer 73 on top surfaces of the drain regions 63. In one embodiment, a subset of the drain contact via structures comprises a respective vertically straight and laterally convex sidewall that contacts a vertically straight and laterally concave sidewall segment of the drain-select-level isolation structure.

In one embodiment, one of the drain contact via structures 88 may comprise a bottom surface contacting a top surface of one of the drain regions 63 and a downward-protruding portion contacting a planar sidewall of the one of the drain regions 63 of one of the first memory opening fill structures 58A. In one embodiment, the downward-protruding portion that protrudes downward from a horizontal plane includes the top surfaces of the drain regions 63 and contacts a sidewall of one of the drain regions 62.

Figure 29:
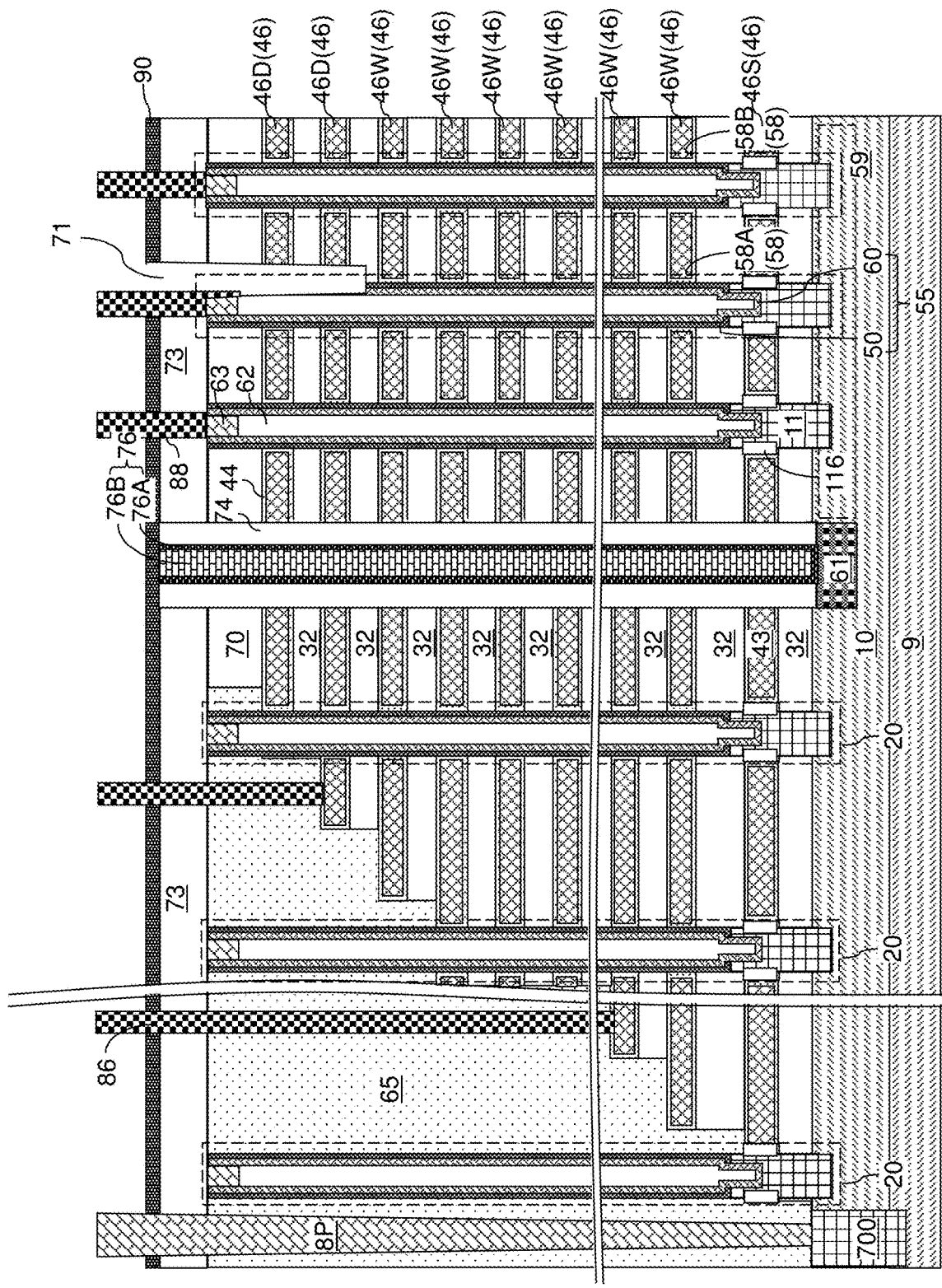
FIG. 29 is a schematic vertical cross-sectional view of the third exemplary structure after removal of the sacrificial matrix layer and the sacrificial drain-select-level trench fill structures according to the third embodiment of the present disclosure.

Referring to FIG. 29, the sacrificial matrix layer 195 and the sacrificial drain-select-level trench fill structures 293 can be removed selective to the materials of the hard mask dielectric layer 90, the dielectric liners 192, and the various contact via structures (88, 86, 8P). In one embodiment, the sacrificial matrix layer 195 may comprise borosilicate glass or organosilicate glass, and may be removed by performing a dry etch employing HF vapor or a wet etch process employing dilute hydrofluoric acid. In one embodiment, the sacrificial drain-select-level trench fill structures 293 may comprise amorphous carbon, and may be removed by ashing.

Figure 30:
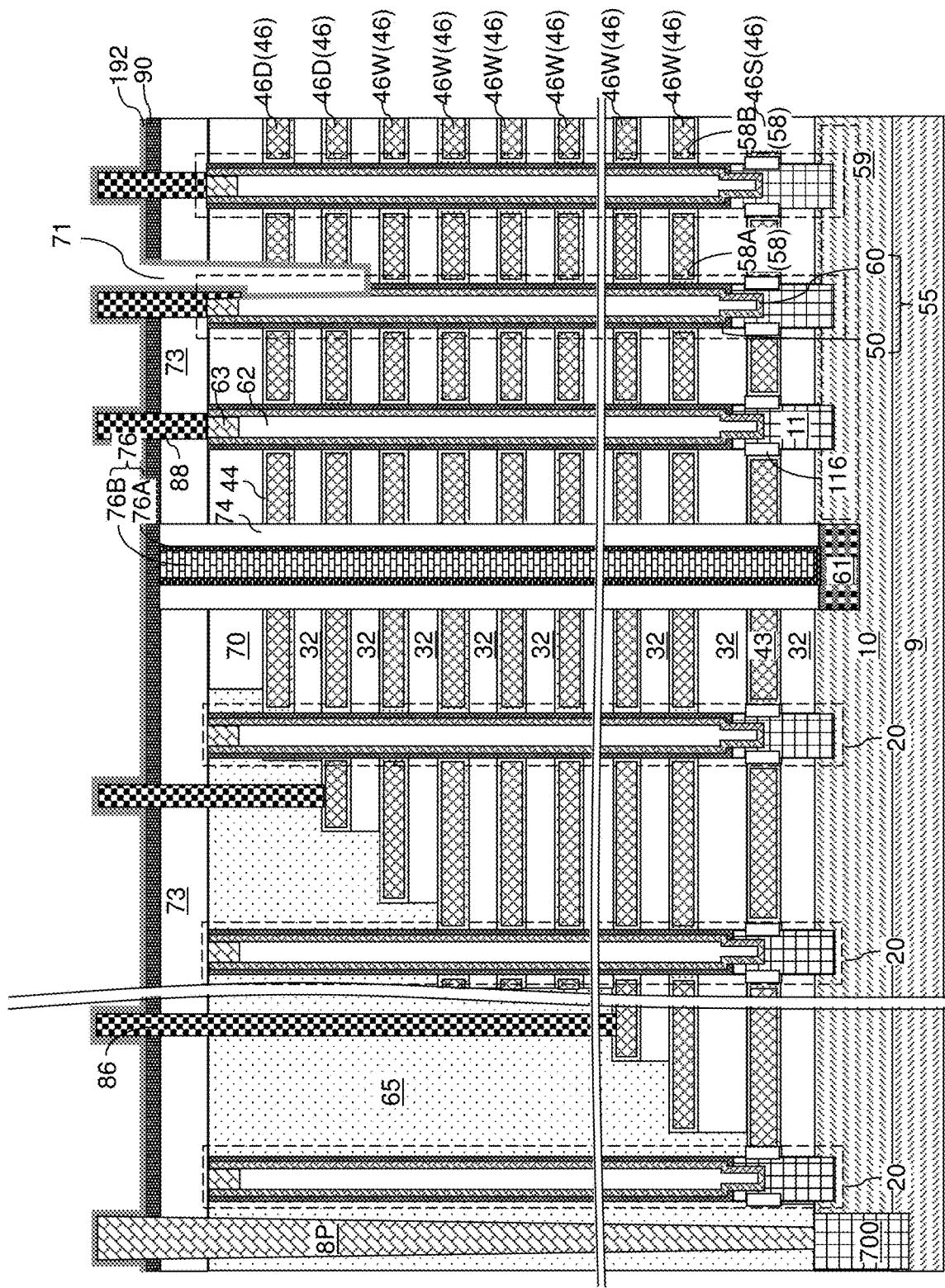
FIG. 30 is a schematic vertical cross-sectional view of the third exemplary structure after formation of a dielectric liner according to the third embodiment of the present disclosure.

Referring to FIG. 30, a dielectric liner 192 can be conformally deposited on the sidewalls and the bottom surfaces of the drain-select-level isolation trenches 71, on the physically exposed surfaces of the various contact via structures (88, 86, 8P), and on a top surface of the hard mask dielectric layer 90. The dielectric liner 192 includes a dielectric material such as silicon oxide or a dielectric metal oxide (e.g., aluminum oxide), and can have a thickness in a range from 1 nm to 20 nm, such as from 1.5 nm to 10 nm, although lesser and greater thicknesses may also be employed. Alternatively, the dielectric liner 192 can be conformally deposited on the sidewalls and the bottom surfaces of the drain-select-level isolation trenches 71 and on a top surface of the sacrificial dielectric pad layer 191 during an earlier step shown in FIG. 25.

Figure 31:
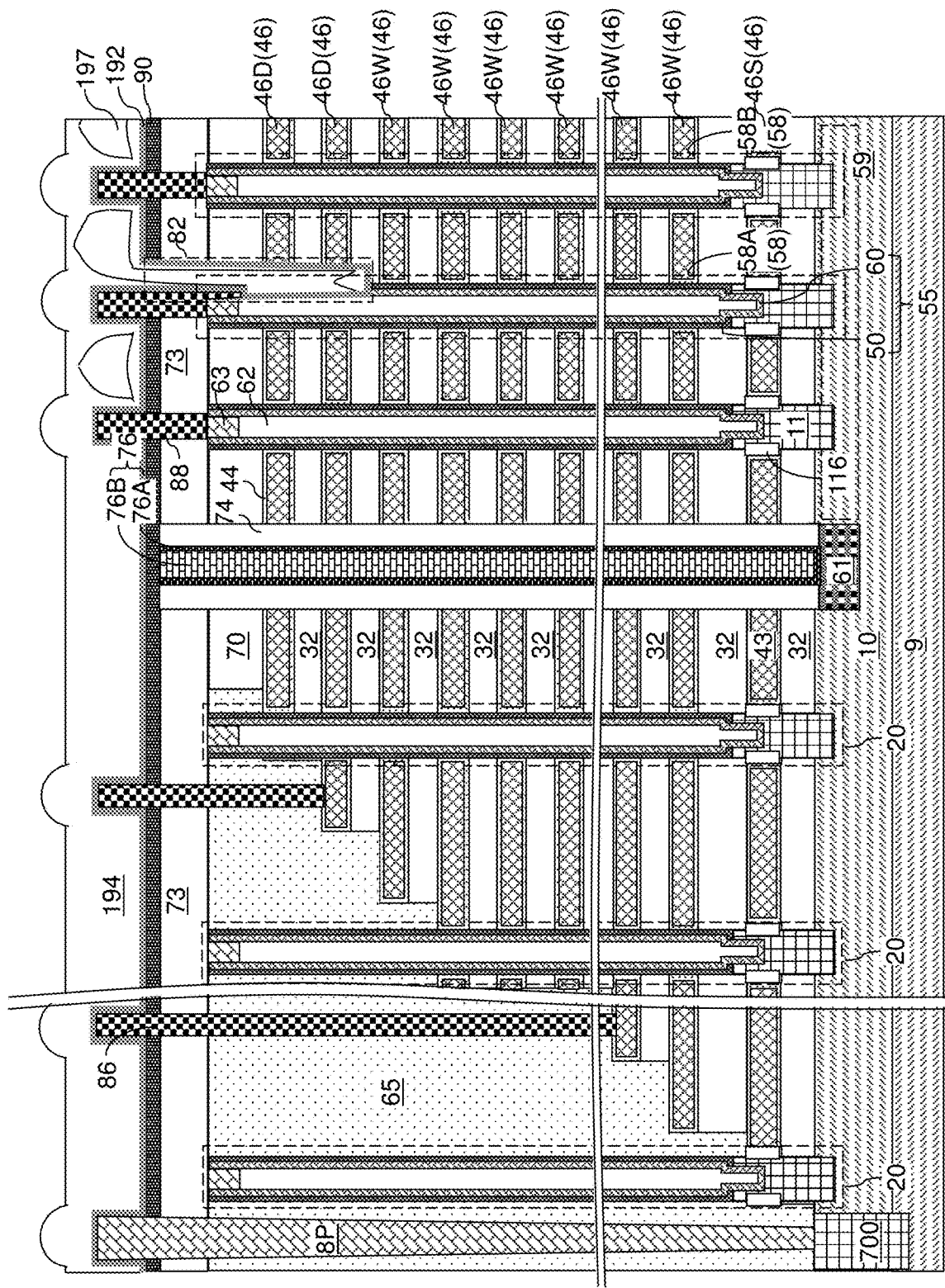
FIG. 31 is a schematic vertical cross-sectional view of the third exemplary structure after formation of a capping dielectric material layer according to the third embodiment of the present disclosure.

Referring to FIG. 31, a dielectric fill material can be anisotropically deposited to form a capping dielectric material layer 194. The dielectric fill material can be anisotropically deposited within the volume of the drain-select-level isolation trenches 71 over the physically exposed surfaces of the dielectric liners 192. The capping dielectric material layer 194 can include a horizontally-extending portion overlying the alternating stack (32, 46) and the hard mask dielectric layer 90, and dielectric fill material portions that are deposited in the volumes of the drain-select-level isolation trenches 71. Material portions that are formed within the volumes of the drain-select-level isolation trenches 71 constitute drain-select-level isolation structures 82. Each dielectric fill material portion of the capping dielectric material layer 194 that protrudes downward into a volume of a drain-select-level isolation trench 71 is a portion of a drain-select-level isolation structure 82, and may embed a respective encapsulated cavity (i.e., air gap) 197 and may be laterally surrounded by the dielectric liner 192.

In one embodiment, the dielectric fill material may be anisotropically deposited over the drain contact via structures 88. The drain contact via structures 88 protrude above the horizontal plane including the top surface of the contact-level dielectric layer 73. In one embodiment, the capping dielectric material layer 194 embeds at least one encapsulated cavity 197 including a lower portion located within a respective drain-select-level isolation structure 82 and an upper portion located above the horizontal plane including the top surface of the contact-level dielectric layer 73. In one embodiment, the upper portion of an encapsulated cavity 197 may be located above the horizontal plane including the top surface of the hard mask dielectric layer 90.

In one embodiment, each drain-select-level isolation structure 82 may vertically extend through the drain-select-level electrically conductive layers 46D between two rows of first memory opening fill structures 58A of the array of memory opening structures 58, and may laterally extend along a first horizontal direction hd1. Each drain-select-level isolation structure 82 may comprise a portion of the dielectric liner 192, a dielectric fill material portion (which is a cavity-containing downward-protruding portion of the capping dielectric material layer 194) contained within the dielectric liner 192, and a volume of an encapsulated cavity 197 that is free of any solid phase material. In one embodiment, the encapsulated cavity 197 may comprise an additional volume embedded within the horizontally-extending portion of the capping dielectric material layer 194 and connected to the volume of the encapsulated cavity 197 within the drain-select-level isolation structure 82.

In one embodiment, the capping dielectric material layer 194 comprises a horizontally-extending portion that overlies the top surface of the contact-level dielectric layer 73. Each dielectric fill material portion of a drain-select-level isolation structure 82 may comprise a vertically-extending portion of the capping dielectric material layer 194. In one embodiment, top surfaces of the drain contact via structures 88 cam be located below a horizontal plane including a top surface of the capping dielectric material layer 194.

In one embodiment, a hard mask dielectric layer 90 can be located between the contact-level dielectric layer 73 and the capping dielectric material layer 194. The dielectric liner 192 can contact sidewalls of openings in the hard mask dielectric layer 90. In one embodiment, the capping dielectric material layer 194 can contact a top surface of the hard mask dielectric layer 90. The dielectric liner 192 comprises a top surface contacting a bottom surface of the horizontally-extending portion of the capping dielectric material layer 194. In one embodiment, each encapsulated cavity 197 may be laterally surrounded by a respective dielectric fill material portion that is a portion of the capping dielectric material layer 194, and may be spaced from a dielectric liner 192 by the dielectric fill material portion.

Figure 32:
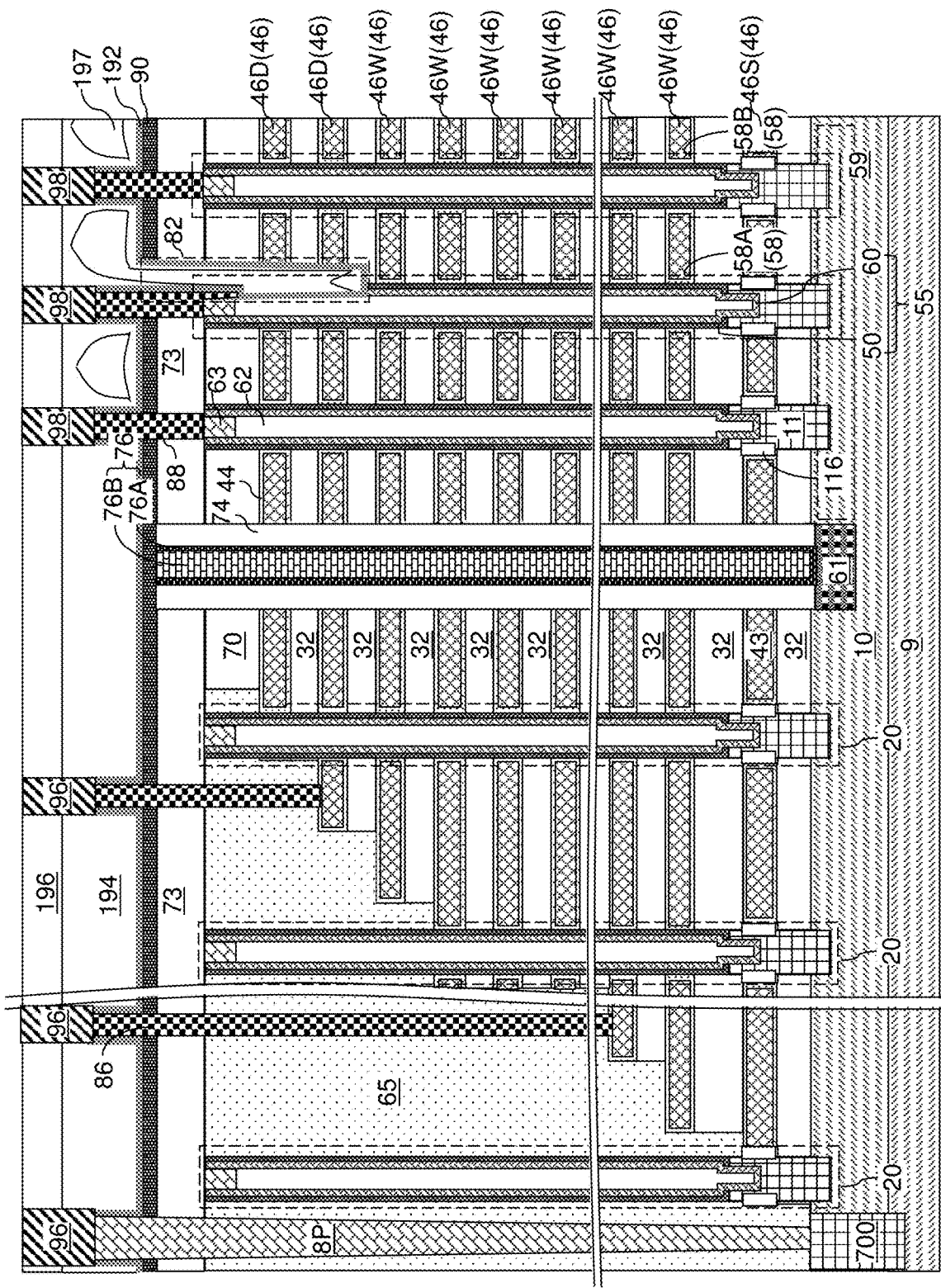
FIG. 32 is a schematic vertical cross-sectional view of the third exemplary structure after formation of a line-level dielectric layer and metal line structures according to the third embodiment of the present disclosure.

Referring to FIG. 32, a line-level dielectric layer 196 can be deposited over the capping dielectric material layer 194. Metal line structures (98, 96) can be formed in the line-level dielectric layer on a top surface of a respective one of the contact via structures (88. 86. 8P). The metal line structures (98, 96) may include, for example, bit lines 98 contacting a respective subset of the drain contact via structures 88 and laterally extending along the second horizontal direction hd2. Further, the metal line structures (98, 96) may include interconnection metal lines 96 that are formed on a respective subset of the layer contact via structures 86 and the peripheral device contact via structures 8P.

Figure 33:
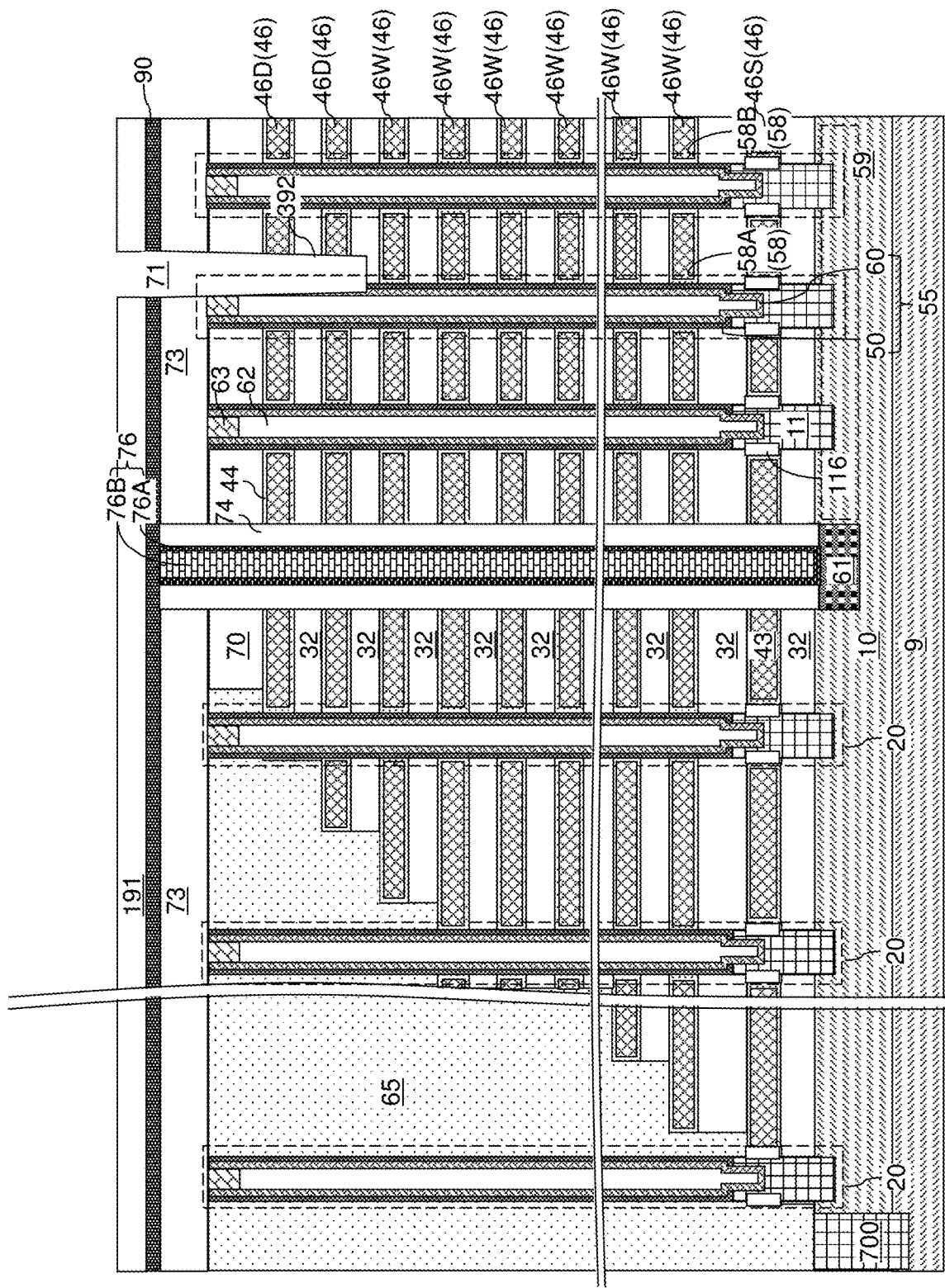
FIG. 33 is a schematic vertical cross-sectional view of a fourth exemplary structure after formation of a hard mask dielectric layer, a sacrificial dielectric pad layer, and drain-select-level isolation trenches according to a fourth embodiment of the present disclosure.

Referring to FIG. 33, a fourth exemplary structure according to the fourth embodiment is illustrated, which can be the same as the second exemplary structure illustrated in FIG. 17.

Figure 34:
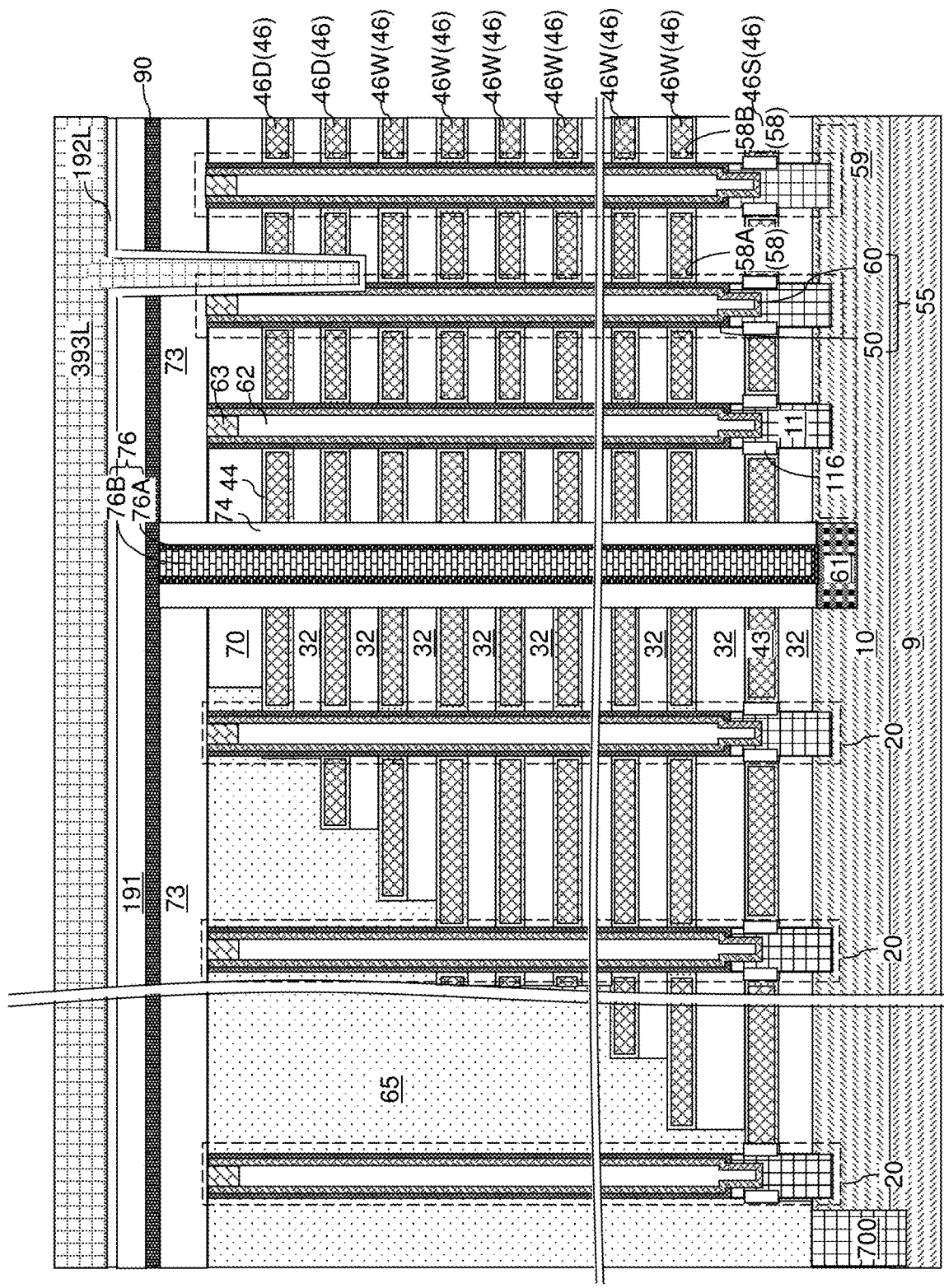
FIG. 34 is a schematic vertical cross-sectional view of a fourth exemplary structure after formation of a continuous dielectric liner and sacrificial drain-select-level trench fill material layer according to the fourth embodiment of the present disclosure.

Referring to FIG. 34, a dielectric liner layer 192L can be conformally deposited on the sidewalls and the bottom surfaces of the drain-select-level isolation trenches 71 and over the sacrificial dielectric pad layer 191. The dielectric liner layer 192L includes a dielectric material such as silicon oxide or a dielectric metal oxide (e.g., aluminum oxide), and can have a thickness in a range from 1 nm to 20 nm, such as from 1.5 nm to 10 nm, although lesser and greater thicknesses may also be employed.

A sacrificial trench fill material layer 393L including a sacrificial fill material can be deposited on the physically exposed surfaces of the dielectric liner layer 192L. The sacrificial trench fill material layer 393L can be deposited in remaining unfilled volumes of the drain-select-level isolation trenches 71 and over the sacrificial dielectric pad layer 191. The sacrificial fill material comprises a material that can be removed selective to the material of the dielectric liner layer 192L. For example, if the dielectric liner layer 192L includes undoped silicate glass or a dielectric metal oxide, the sacrificial trench fill material layer 393L may include a semiconductor material such as amorphous silicon, polysilicon, germanium, a silicon-germanium alloy, or a compound semiconductor material. In an illustrative example, the sacrificial trench fill material layer 393L includes amorphous silicon. The thickness of the sacrificial trench fill material layer 393L, as measured over in a horizontally-extending portion, may be in a range from 50 nm to 400 nm, although lesser and greater thicknesses may also be employed.

Figure 35:
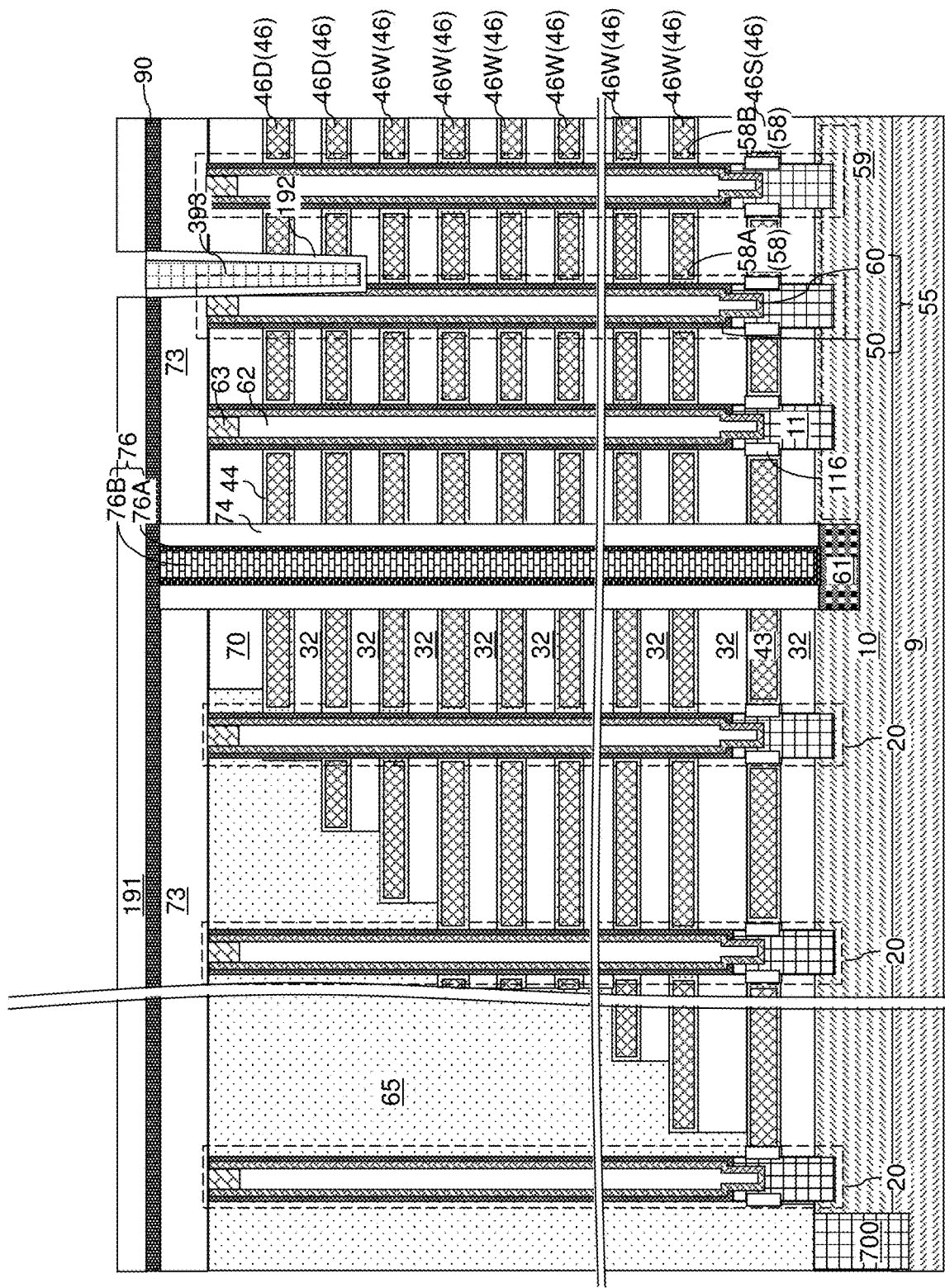
FIG. 35 is a schematic vertical cross-sectional view of the fourth exemplary structure after formation of combinations of a dielectric liner and a sacrificial drain-select-level trench fill structure according to the fourth embodiment of the present disclosure.

Referring to FIG. 35, a planarization process can be performed to remove portions of the sacrificial trench fill material layer 393L, the dielectric liner layer 192L, and the sacrificial dielectric pad layer 191 located above the horizontal plane including the top surface of the hard mask dielectric layer 90. The planarization process may employ chemical mechanical polishing and/or a recess etch process. A top surface of the hard mask dielectric layer 90 may be employed as a stopping surface for the planarization process. A combination of a patterned remaining portion of the dielectric liner layer 192L and a patterned remaining portion of the sacrificial trench fill material layer 393L is located within each volume of the drain-select-level isolation trenches 71. Each patterned portion of the sacrificial trench fill material layer 393L constitutes a sacrificial drain-select-level trench fill structure 393. Each patterned portion of the dielectric liner layer 192L constitutes a dielectric liner 192.

Figure 36:
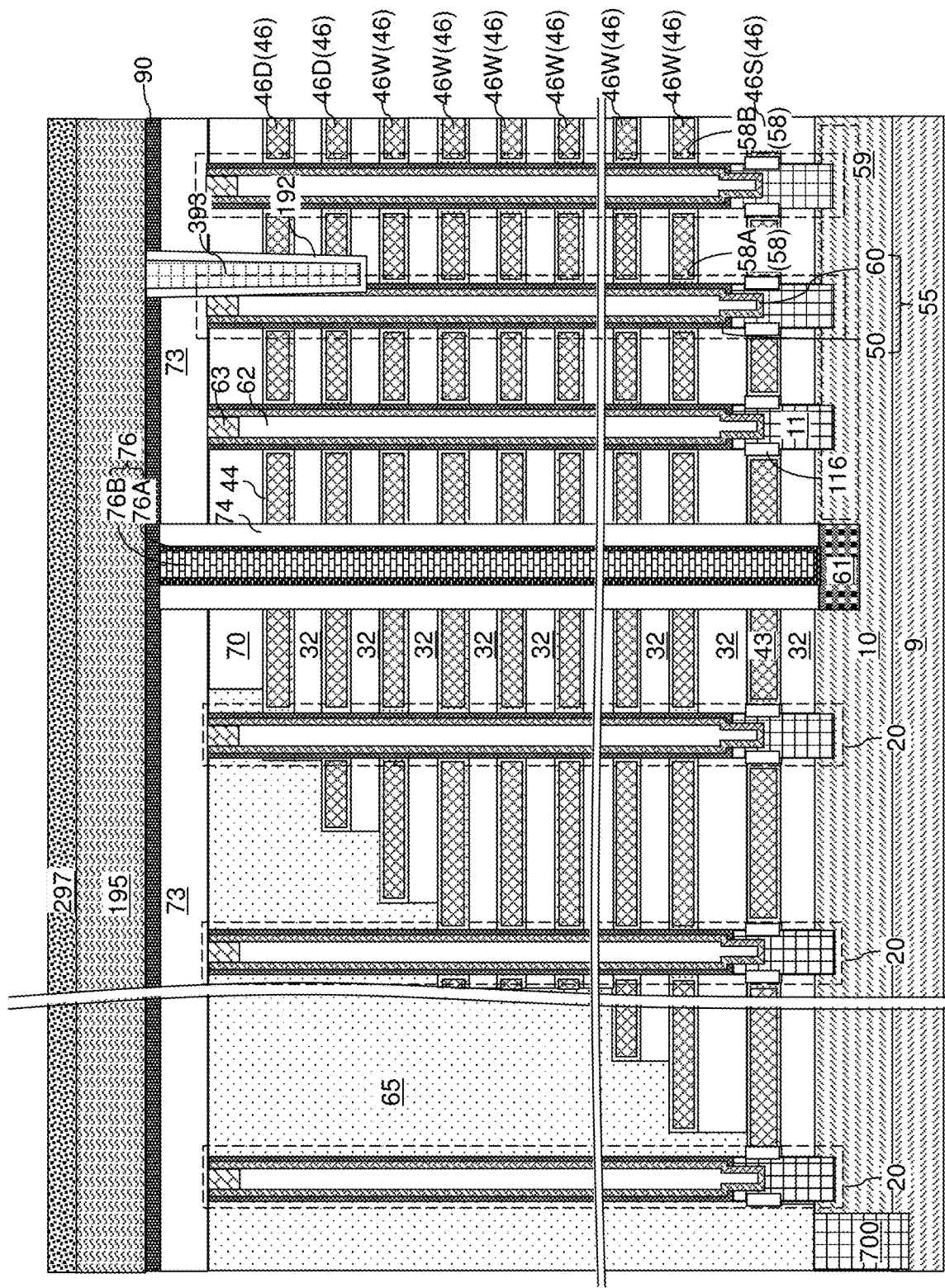
FIG. 36 is a schematic vertical cross-sectional view of the fourth exemplary structure after formation of a sacrificial matrix layer and a patterning film according to the fourth embodiment of the present disclosure.

Referring to FIG. 36, a sacrificial matrix layer 195 can be deposited over the hard mask dielectric layer 90 and the sacrificial drain-select-level trench fill structures 393. The sacrificial matrix layer 195 includes a material that can be removed selective to the material of the hard mask dielectric layer 90. For example, the sacrificial matrix layer 195 can include a dielectric material such as borosilicate glass or organosilicate glass. The thickness of the sacrificial matrix layer 195 can be in a range from 100 nm to 600 nm, although lesser and greater thicknesses may also be employed. A photoresist layer 297 can be applied over the sacrificial matrix layer 195.

Figure 37:
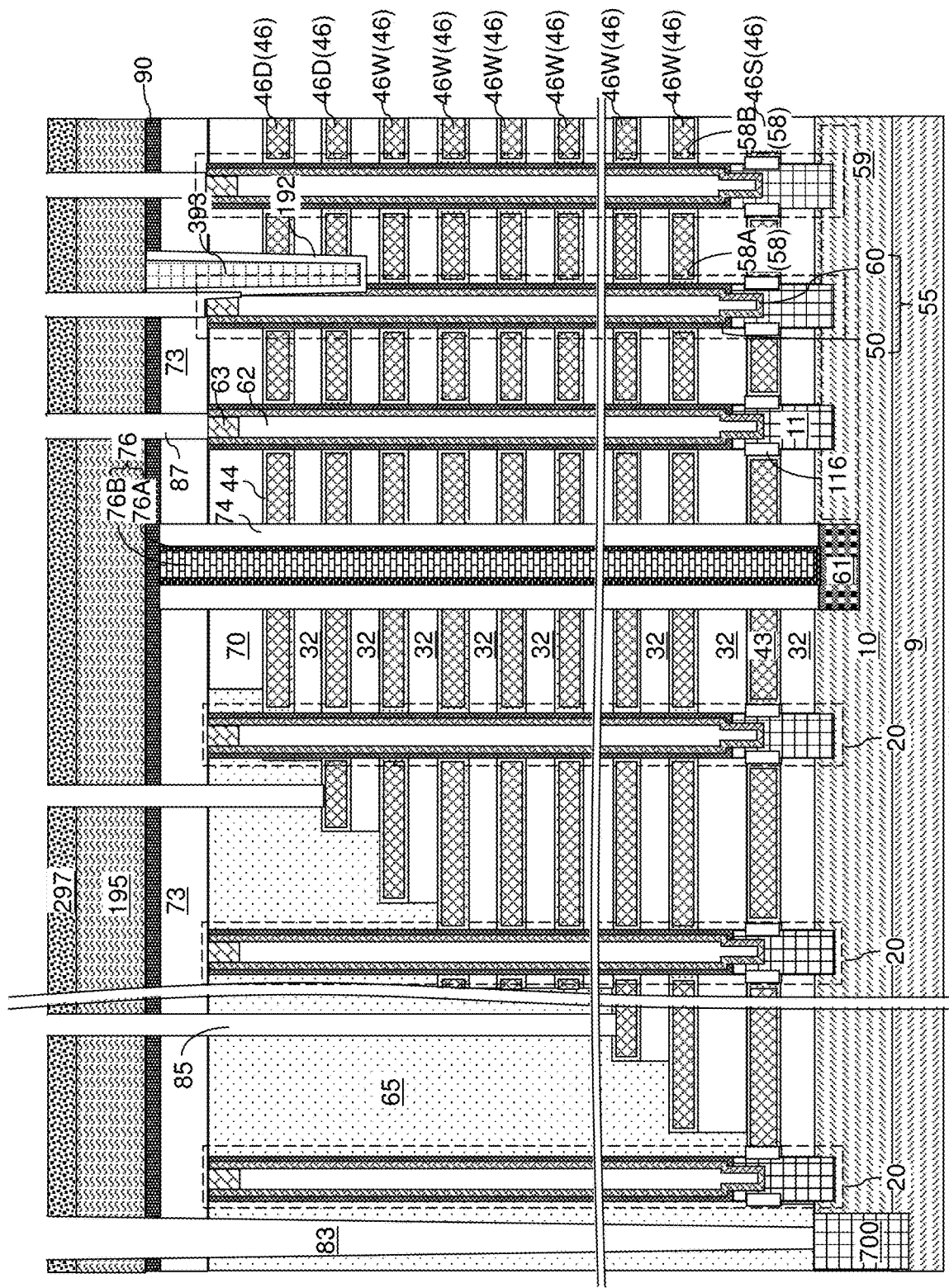
FIG. 37 is a schematic vertical cross-sectional view of the fourth exemplary structure after formation of contact via cavities according to the fourth embodiment of the present disclosure.

Referring to FIG. 37, the masking layer 297 can be lithographically patterned to form opening in areas of the drain regions 63, areas of the stepped surfaces of the electrically conductive layers 46, and areas of electrical nodes of the at least one semiconductor devices 700. An anisotropic etch process can be performed to etch unmasked portions of the sacrificial matrix layer 195, the hard mask dielectric layer 90, and the contact-level dielectric layer 73 and underlying dielectric material portions, if any, thereby forming various via cavities (87, 85, 7P). The various via cavities (87, 85, 7P) can include drain contact via cavities 87, layer contact via cavities 85, and peripheral contact via cavities 7P. The drain regions 63, the electrically conductive layers 46, and the electrical nodes of the at least one semiconductor device 700 may be employed as etch stop structures for the anisotropic etch process. In some embodiments, at least one of the drain contact via cavities 87 may have a non-zero overlay variation, and may etch into a portion of a sacrificial drain-select-level trench fill structure 393 and physically expose a sidewall of a first memory opening fill structure 58A such as a sidewall of a drain region 63. In one embodiment, a portion of a dielectric liner 192 may be collaterally recessed in case one of the drain contact via cavities 87 overlying a drain region 63 protrudes downward below the top surface of the drain region 63. The masking layer 297 can be subsequently removed, for example, by ashing and/or selective etching.

Figure 38:
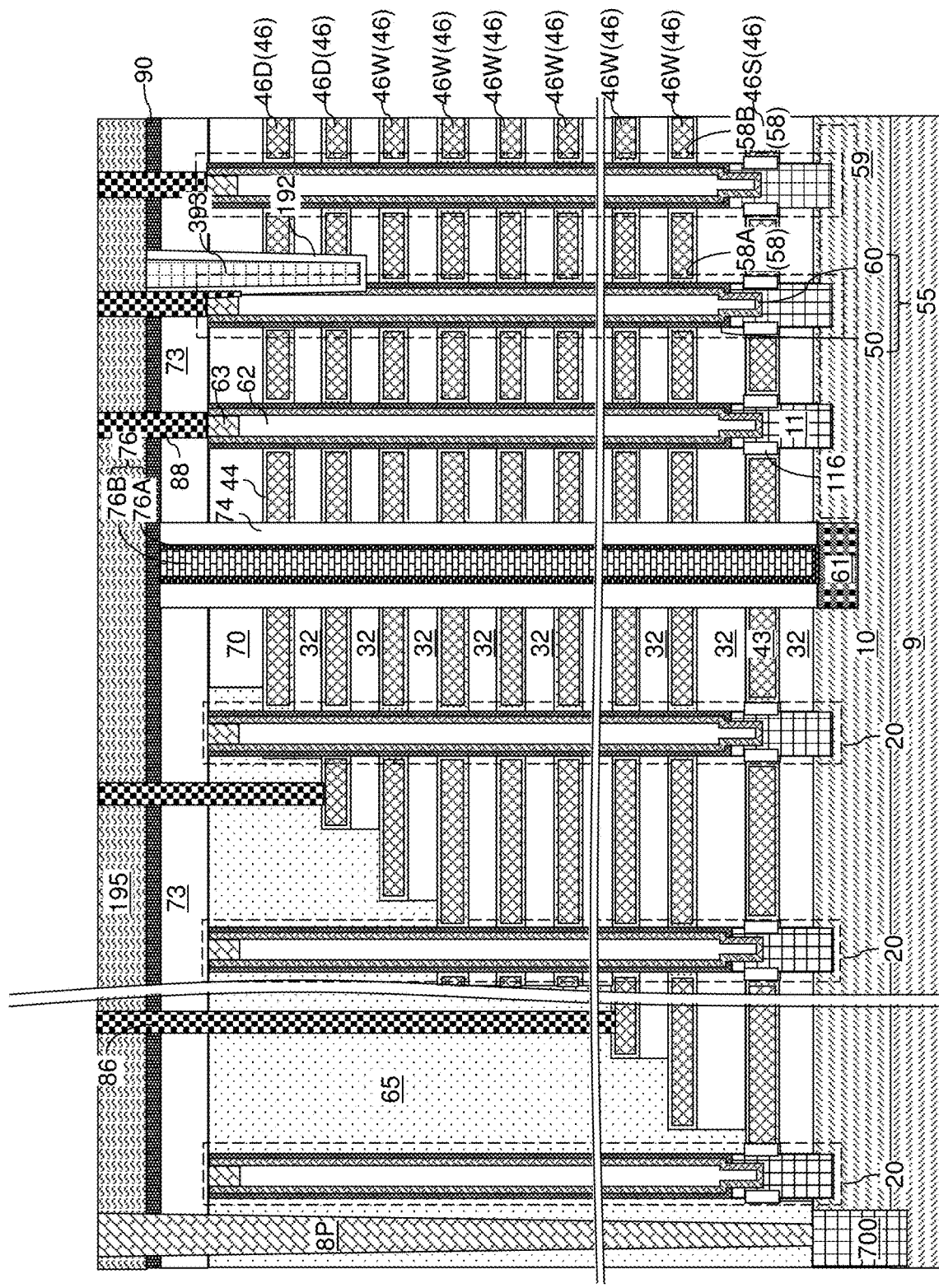
FIG. 38 is a schematic vertical cross-sectional view of the fourth exemplary structure after formation of contact via structures according to the fourth embodiment of the present disclosure.

Referring to FIG. 38, at least one conductive material can be conformally deposited in the various via cavities (87, 85, 7P). For example, the at least one conductive material may include a metallic barrier liner including a conductive metallic nitride (e.g., TiN, TaN, or WN) or a conductive metallic carbide (TiC, TaC, or WC), and a metallic fill material such as W, Ti, Ta, Mo, Ru, Co, Cu, etc. Excess portions of the at least one conductive material can be removed from above the horizontal plane including the top surface of the sacrificial matrix layer 195 by a planarization process, which may include a chemical mechanical polishing process and/or a recess etch process. Each remaining portion of the at least one conductive material contacting a respective one of the drain regions 63 constitutes a drain region 88. Each remaining portion of the at least one conductive material contacting a respective one of the electrically conductive layers 46 constitutes a layer contact via structure 86. Peripheral device contact via structures 8P can be formed through the retro-stepped dielectric material portion 65 directly on respective nodes of the at least one semiconductor device 700. The drain contact via structures 88 can be formed through the sacrificial matrix layer 195, the hard mask dielectric layer 90, and the contact-level dielectric layer 73 on top surfaces of the drain regions 63. In one embodiment, a subset of the drain contact via structures comprises a respective vertically straight and laterally convex sidewall that contacts a vertically straight and laterally concave sidewall segment of the drain-select-level isolation structure.

In one embodiment, one of the drain contact via structures 88 may comprise a bottom surface contacting a top surface of one of the drain regions 63 and a downward-protruding portion contacting a planar sidewall of the one of the drain regions 63 of one of the first memory opening fill structures 58A. The downward-protruding portion protrudes downward from a horizontal plane including the top surfaces of the drain regions 63 and contacts a sidewall of one of the drain regions 62, and the downward-protruding portion may contact a recessed surface of the dielectric liner 192.

Figure 39:
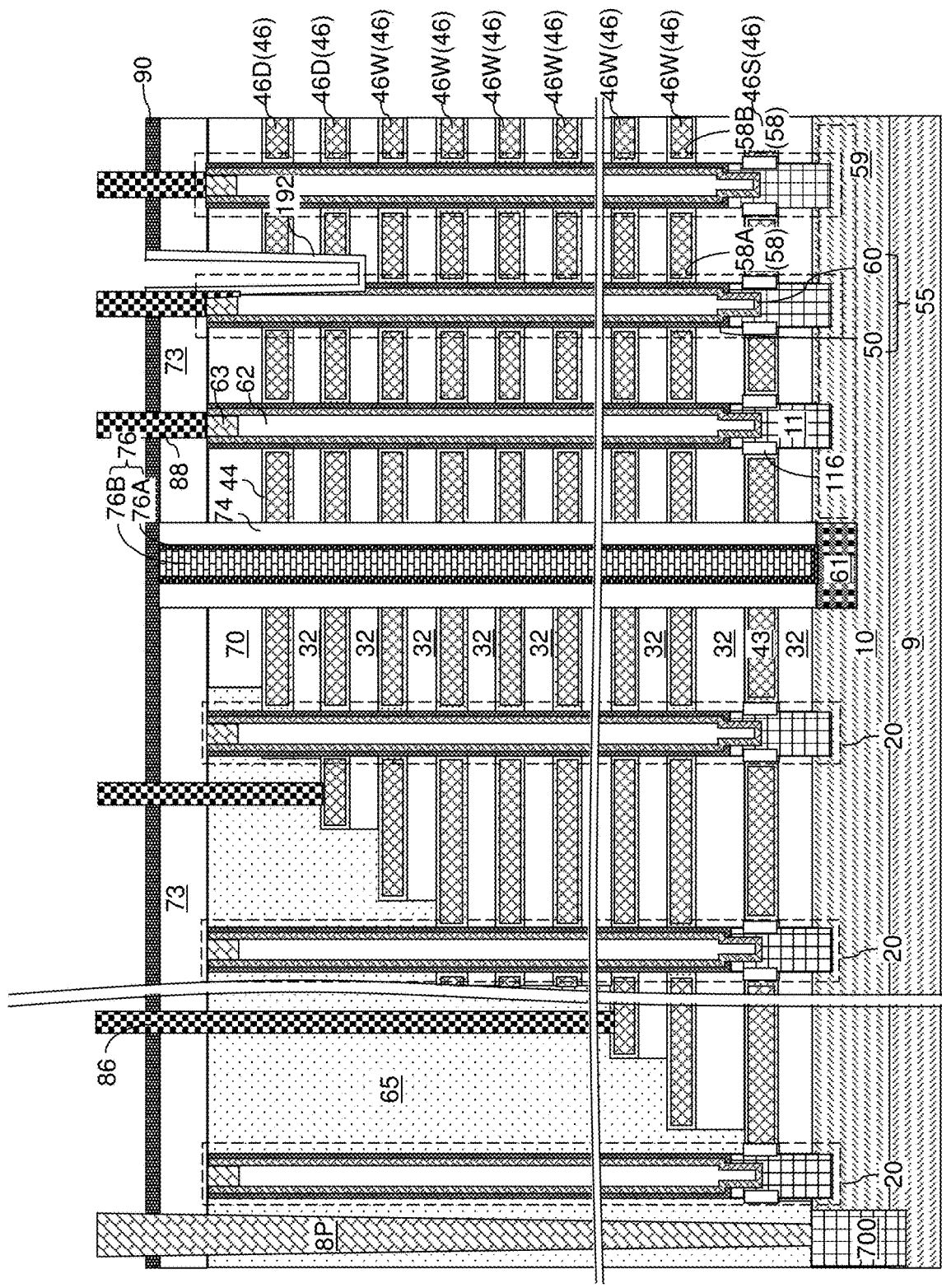
FIG. 39 is a schematic vertical cross-sectional view of the fourth exemplary structure after removal of the sacrificial matrix layer and the sacrificial drain-select-level trench fill structures according to the fourth embodiment of the present disclosure.

Referring to FIG. 39, the sacrificial matrix layer 195 and the sacrificial drain-select-level trench fill structures 393 can be removed selective to the materials of the hard mask dielectric layer 90, the dielectric liners 192, and the various contact via structures (88, 86, 8P). In one embodiment, the sacrificial matrix layer 195 may comprise borosilicate glass and/or organosilicate glass. The sacrificial matrix layer 195 can be removed selective to the hard mask dielectric layer 90, and the sacrificial fill material of the sacrificial drain-select-level trench fill structures 393 can be removed selective to the hard mask dielectric layer 90, the dielectric liners 192, and the various contact via structures (88, 86, 8P). In case the sacrificial matrix layer 195 comprises borosilicate glass and/or organosilicate glass, a dry HF vapor etch process or a wet etch process employing dilute hydrofluoric acid may be performed to remove the sacrificial matrix layer 195. In case the sacrificial drain-select-level trench fill structures 393 comprise amorphous silicon, a wet etch process using hot trimethyl-2 hydroxyethyl ammonium hydroxide ("hot TMY") or tetramethyl ammonium hydroxide (TMAH) may be used to remove the sacrificial drain-select-level trench fill structures 393.

Figure 40:
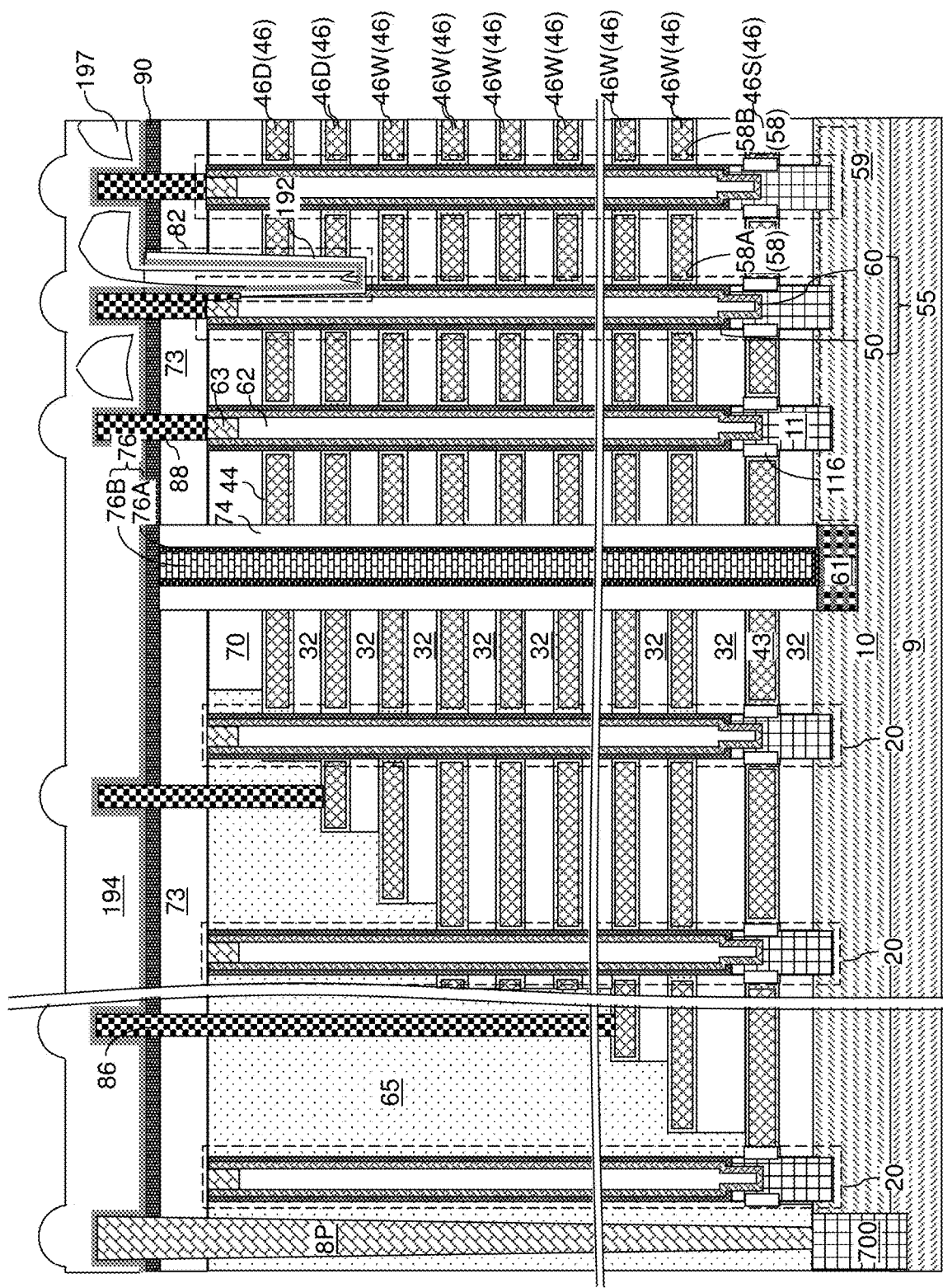
FIG. 40 is a schematic vertical cross-sectional view of the fourth exemplary structure after formation of a capping dielectric material layer according to the fourth embodiment of the present disclosure.

Referring to FIG. 40, a dielectric fill material can be anisotropically deposited to form a capping dielectric material layer 194. The dielectric fill material can be anisotropically deposited within the volume of the drain-select-level isolation trenches 71 on the dielectric liners 192, and over the hard mask dielectric layer 90. The capping dielectric material layer 194 can include a horizontally-extending portion overlying the alternating stack (32, 46) and the hard mask dielectric layer 90, and dielectric fill material portions that are deposited in the volumes of the drain-select-level isolation trenches 71. Material portions that are formed within the volumes of the drain-select-level isolation trenches 71 constitute drain-select-level isolation structures 82. Each dielectric fill material portion of the capping dielectric material layer 194 that protrudes downward into a volume of a drain-select-level isolation trench 71 is a portion of a drain-select-level isolation structure, and may embed a respective encapsulated cavity (i.e., air gap) 197 and may be laterally surrounded by a respective dielectric liner 192.

In one embodiment, the dielectric fill material may be anisotropically deposited over the drain contact via structures 88. The drain contact via structures 88 protrude above the horizontal plane including the top surface of the contact-level dielectric layer 73. In one embodiment, the capping dielectric material layer 194 embeds at least one encapsulated cavity 197 including a lower portion located within a respective drain-select-level isolation structure 82 and an upper portion located above the horizontal plane including the top surface of the contact-level dielectric layer 73. In one embodiment, the upper portion of an encapsulated cavity 197 may be located above the horizontal plane including the top surface of the hard mask dielectric layer 90.

In one embodiment, each drain-select-level isolation structure 82 may vertically extend through the drain-select-level electrically conductive layers 46D between two rows of first memory opening fill structures 58A of the array of memory opening structures 58, and may laterally extend along a first horizontal direction hd1. Each drain-select-level isolation structure 82 may comprise a dielectric liner 192, a dielectric fill material portion (which is a cavity-containing downward-protruding portion of the capping dielectric material layer 194) contained within the dielectric liner 192, and a volume of an encapsulated cavity 197 that is free of any solid phase material. In one embodiment, the encapsulated cavity 197 may comprise an additional volume embedded within the horizontally-extending portion of the capping dielectric material layer 194 and connected to the volume of the encapsulated cavity 197 within the drain-select-level isolation structure 82.

In one embodiment, the capping dielectric material layer 194 comprises a horizontally-extending portion that overlies the top surface of the contact-level dielectric layer 73. Each dielectric fill material portion of a drain-select-level isolation structure 82 may comprise a vertically-extending portion of the capping dielectric material layer 194. In one embodiment, top surfaces of the drain contact via structures 88 cam be located below a horizontal plane including a top surface of the capping dielectric material layer 194.

In one embodiment, a hard mask dielectric layer 90 can be located between the contact-level dielectric layer 73 and the capping dielectric material layer 194. Each dielectric liner 192 can contact a respective sidewall of the hard mask dielectric layer 90. In one embodiment, the capping dielectric material layer 194 can contact a top surface of the hard mask dielectric layer 90. In one embodiment, each dielectric liner 192 may comprise a top surface contacting a bottom surface of the horizontally-extending portion of the capping dielectric material layer 194. In one embodiment, each encapsulated cavity 197 may be laterally surrounded by a respective dielectric fill material portion that is a portion of the capping dielectric material layer 194, and may be spaced from a dielectric liner 192 by the dielectric fill material portion.

Figure 41:
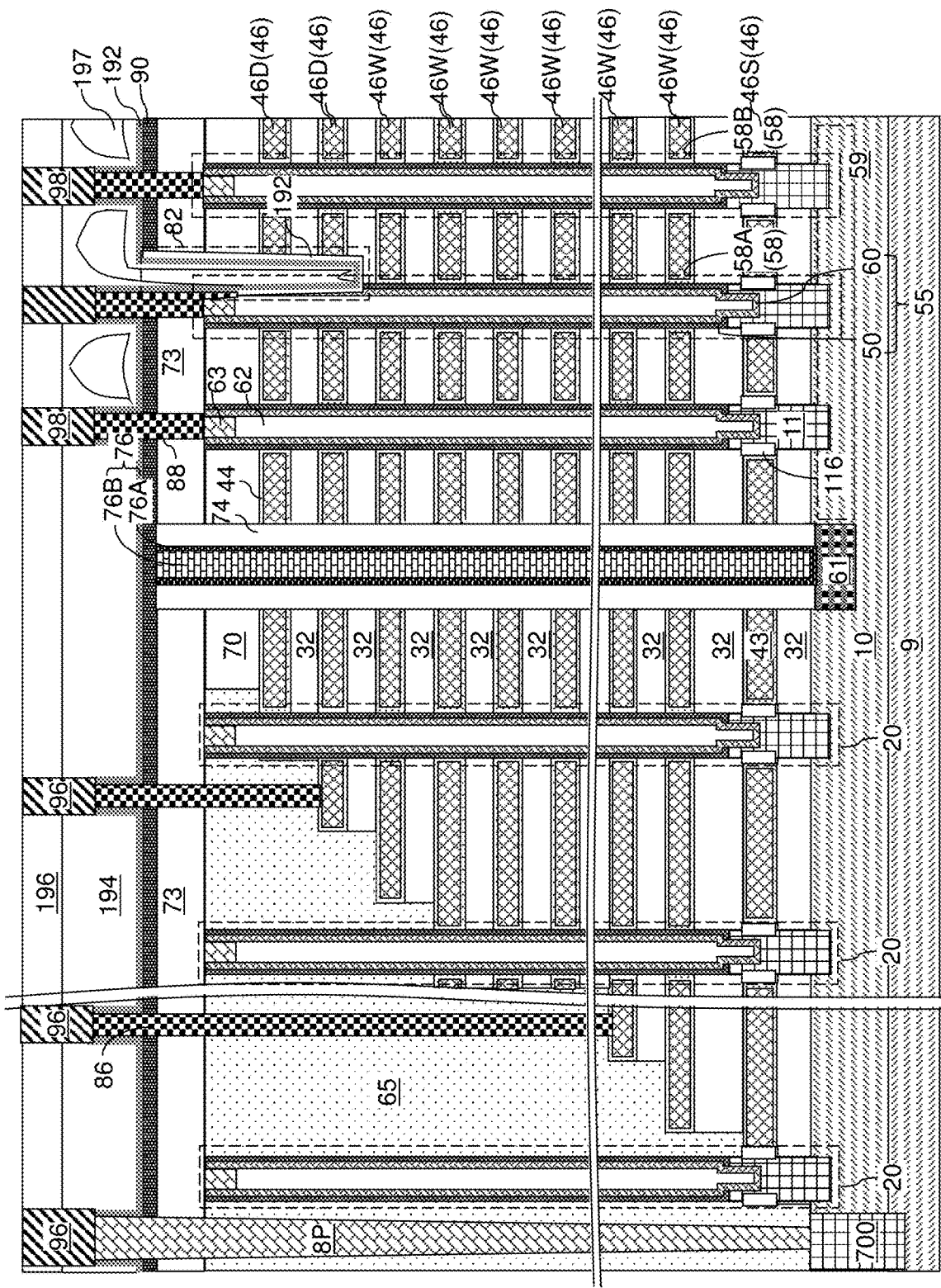
FIG. 41 is a schematic vertical cross-sectional view of the fourth exemplary structure after formation of a line-level dielectric layer and metal line structures according to the fourth embodiment of the present disclosure.

Referring to FIG. 41, a line-level dielectric layer 196 can be deposited over the capping dielectric material layer 194. Metal line structures (98, 96) can be formed in the line-level dielectric layer on a top surface of a respective one of the contact via structures (88, 86, 8P). The metal line structures (98, 96) may include, for example, bit lines 98 contacting a respective subset of the drain contact via structures 88 and laterally extending along the second horizontal direction hd2. Further, the metal line structures (98, 96) may include interconnection metal lines 96 that are formed on a respective subset of the layer contact via structures 86 and the peripheral device contact via structures 8P.

Figure 42:
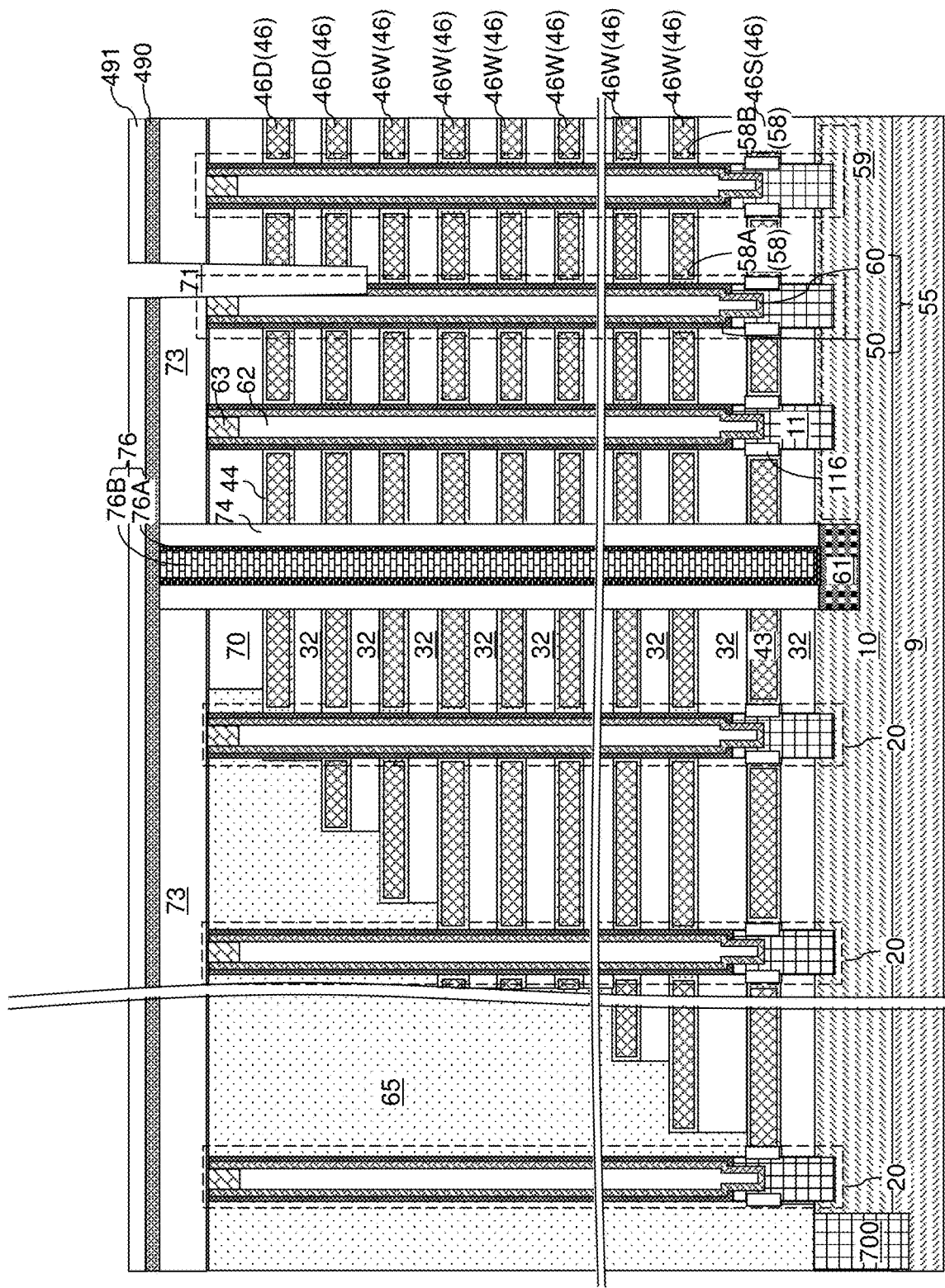
FIG. 42 is a schematic vertical cross-sectional view of a fifth exemplary structure after formation of a hard mask dielectric layer, a sacrificial dielectric pad layer, and drain-select-level isolation trenches according to a fifth embodiment of the present disclosure.

Referring to FIG. 42, a fifth exemplary structure according to the fifth embodiment of the present disclosure can be derived from the first exemplary structure illustrated in FIGS. 12A and 12B by forming a first sacrificial pad layer 490 and an optional second sacrificial pad layer 491, and by forming drain-select-level isolation trenches 71.

The first sacrificial pad layer 490 includes a dielectric material that may be employed as a hard mask during a subsequent planarization process (such as a chemical mechanical polishing process or an etch back process) or a subsequent etch process. For example, the first sacrificial pad layer 490 may include silicon nitride, silicon oxynitride, silicon carbide, silicon carbide nitride, or a stack thereof. The thickness of the layer 490 may be in a range from 10 nm to 100 nm, although lesser and greater thicknesses may also be employed.

The second sacrificial pad layer 491 includes a sacrificial dielectric material that can be removed during a subsequent planarization process. For example, the second sacrificial pad layer 491 can include undoped silicate glass or a doped silicate glass. The thickness of the second sacrificial pad layer 491 can be in a range from 10 nm to 200 nm, although lesser and greater thicknesses may also be employed.

A photoresist layer can be applied over the second sacrificial pad layer 491, and can be lithographically patterned in the same pattern as the pattern of the openings in the photoresist layer employed to pattern the drain-select-level isolation trenches 71 at the processing steps of FIGS. 13A and 13B. Subsequently, an anisotropic etch process can be performed to transfer the pattern of the openings in the photoresist layer through the second sacrificial pad layer 491, the first sacrificial pad layer 490, the contact-level dielectric layer 73, and underlying portions of the first memory opening fill structures 58, the drain-select-level electrically conductive layers 46D, and the drain-select-level insulating layers 32. Generally, the processing steps of FIGS. 13A and 13B may be performed with a modification in the anisotropic etch process so that unmasked portions of the second sacrificial pad layer 491 and the first sacrificial pad layer 490 are etched prior to etching the unmasked portions of the contact-level dielectric layer 73.

According to an aspect of the present disclosure, the array of memory opening fill structures 58 located between a neighboring pair of backside trench fill structures (74, 76) can be arranged as a two-dimensional periodic array, and the drain-select-level isolation trenches 71 can cut through peripheral portions of some neighboring pairs of first memory opening fill structures 58A. A planar straight sidewall of each of the first memory opening fill structures 58A is physically exposed upon formation of the drain-select-level isolation trenches 71 by the anisotropic etch process. In one embodiment, each of the first memory opening fill structures 58A has a respective horizontal cross-sectional shape after the anisotropic etch process that has an arc-shaped periphery that is adjoined to a straight periphery that is parallel to the first horizontal direction hd1. The straight periphery is a horizontal line contained within a planar sidewall of one of the drain-select-level isolation trenches 71.

Figure 43:
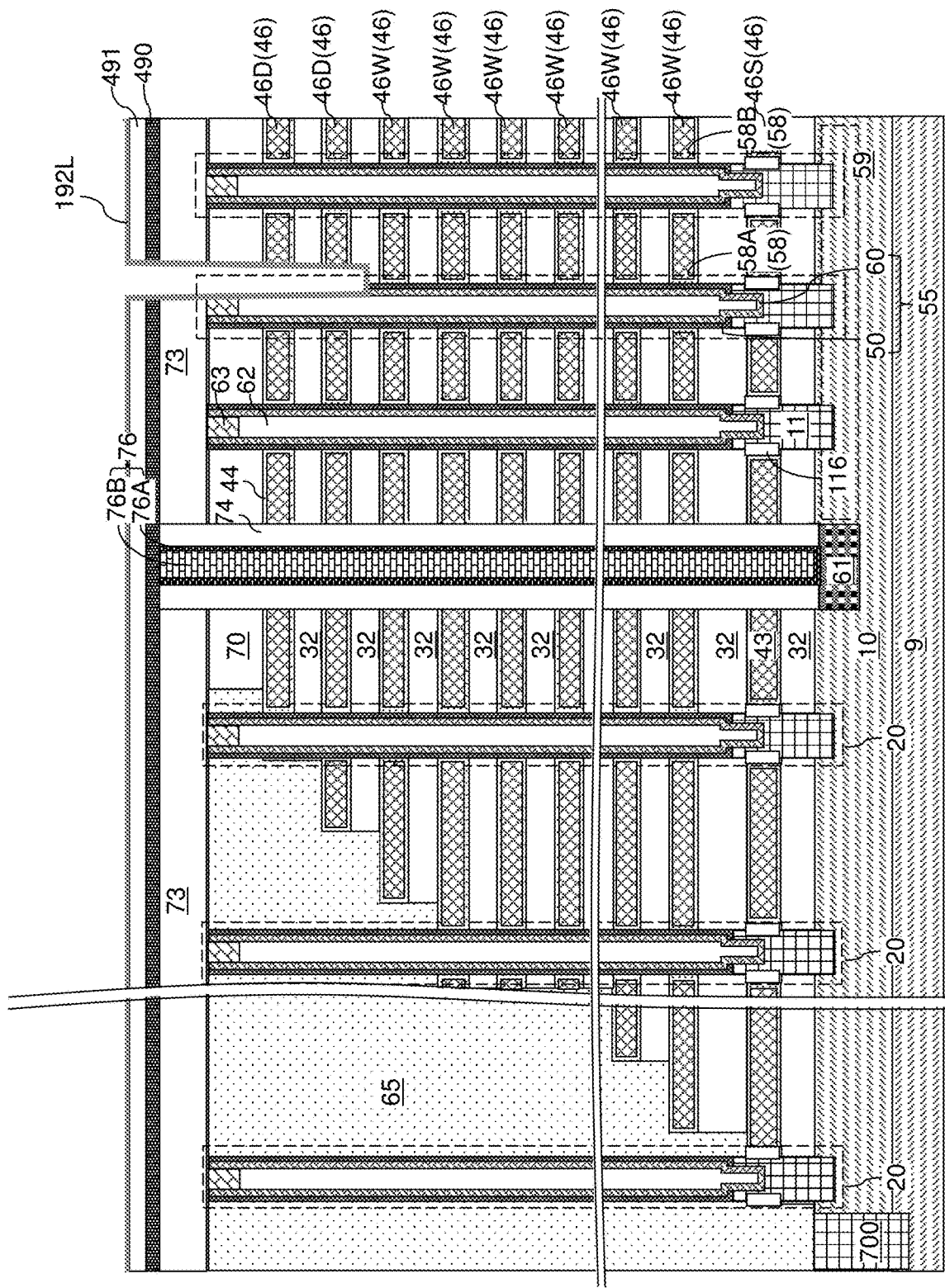
FIG. 43 is a schematic vertical cross-sectional view of the fifth exemplary structure after formation of a dielectric liner in each drain-select-level isolation trench according to the fifth embodiment of the present disclosure.

Referring to FIG. 43, a dielectric liner layer 192L can be conformally deposited on the sidewalls and the bottom surfaces of the drain-select-level isolation trenches 71 and over the second sacrificial pad layer 491. The dielectric liner layer 192L includes a dielectric material such as silicon oxide or a dielectric metal oxide (e.g., aluminum oxide), and can have a thickness in a range from 1 nm to 20 nm, such as from 1.5 nm to 10 nm, although lesser and greater thicknesses may also be employed.

Figure 44:
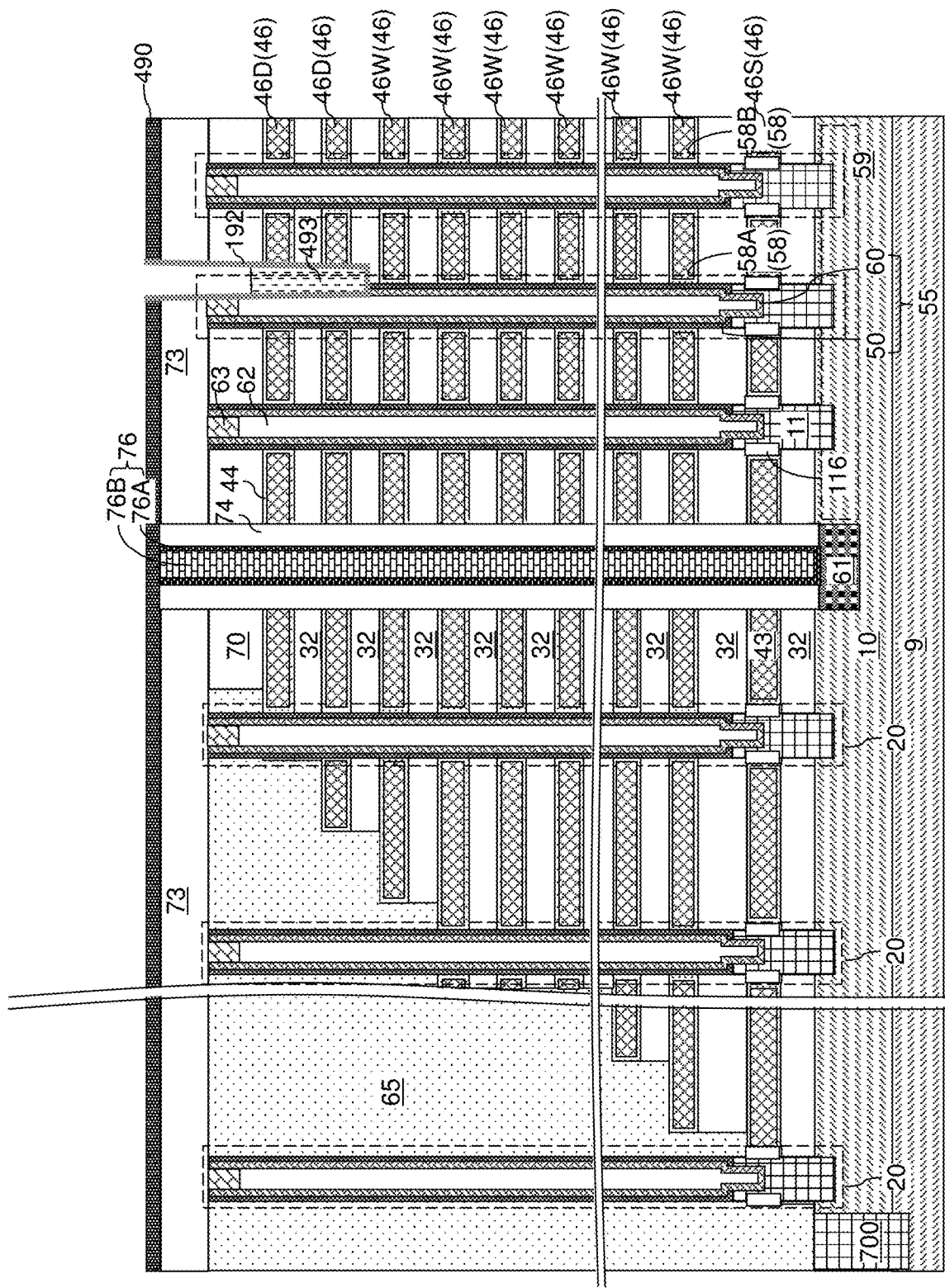
FIG. 44 is a schematic vertical cross-sectional view of the fifth exemplary structure after formation of a sacrificial drain-select-level trench fill structure in each drain-select-level isolation trench according to the fifth embodiment of the present disclosure.

Referring to FIG. 44, a sacrificial trench fill material layer 493 including a sacrificial fill material can be deposited on the physically exposed surfaces of the dielectric liner layer 192L. The sacrificial trench fill material layer 493 can be deposited in remaining unfilled volumes of the drain-select-level isolation trenches 71. The sacrificial fill material comprises a material that can be removed selective to the material of the dielectric liner layer 192L. For example, if the dielectric liner layer 192L includes undoped silicate glass or a dielectric metal oxide, the sacrificial trench fill material layer 493 may include amorphous carbon that can be ashed, or may include borosilicate glass which has an etch rate in HF vapor that is higher than the etch rate of the dielectric liner layer 192L in HF vapor.

The sacrificial trench fill material layer 493 can be vertically recessed such that each remaining portion of the sacrificial trench fill material layer has a respective top surface located below the horizontal plane including the top surface of the contact-level dielectric layer 73. Each remaining portion of the sacrificial trench fill material layer constitutes a sacrificial drain-select-level trench fill structure 493. The top surface of each sacrificial drain-select-level trench fill structure 493 can be located below the horizontal plane including the top surface of the contact-level dielectric layer 73, and may be located below the horizontal plane including the bottom surface of the contact-level dielectric layer 73. Portions of the dielectric liner layer 192L overlying the first sacrificial pad layer 490 can be removed during, or after, recessing the sacrificial trench fill material layer. The second sacrificial pad layer 491 can be removed during, or after, recessing the sacrificial trench fill material layer. Each patterned portion of the dielectric liner layer 192L constitutes a dielectric liner 192.

Figure 45:
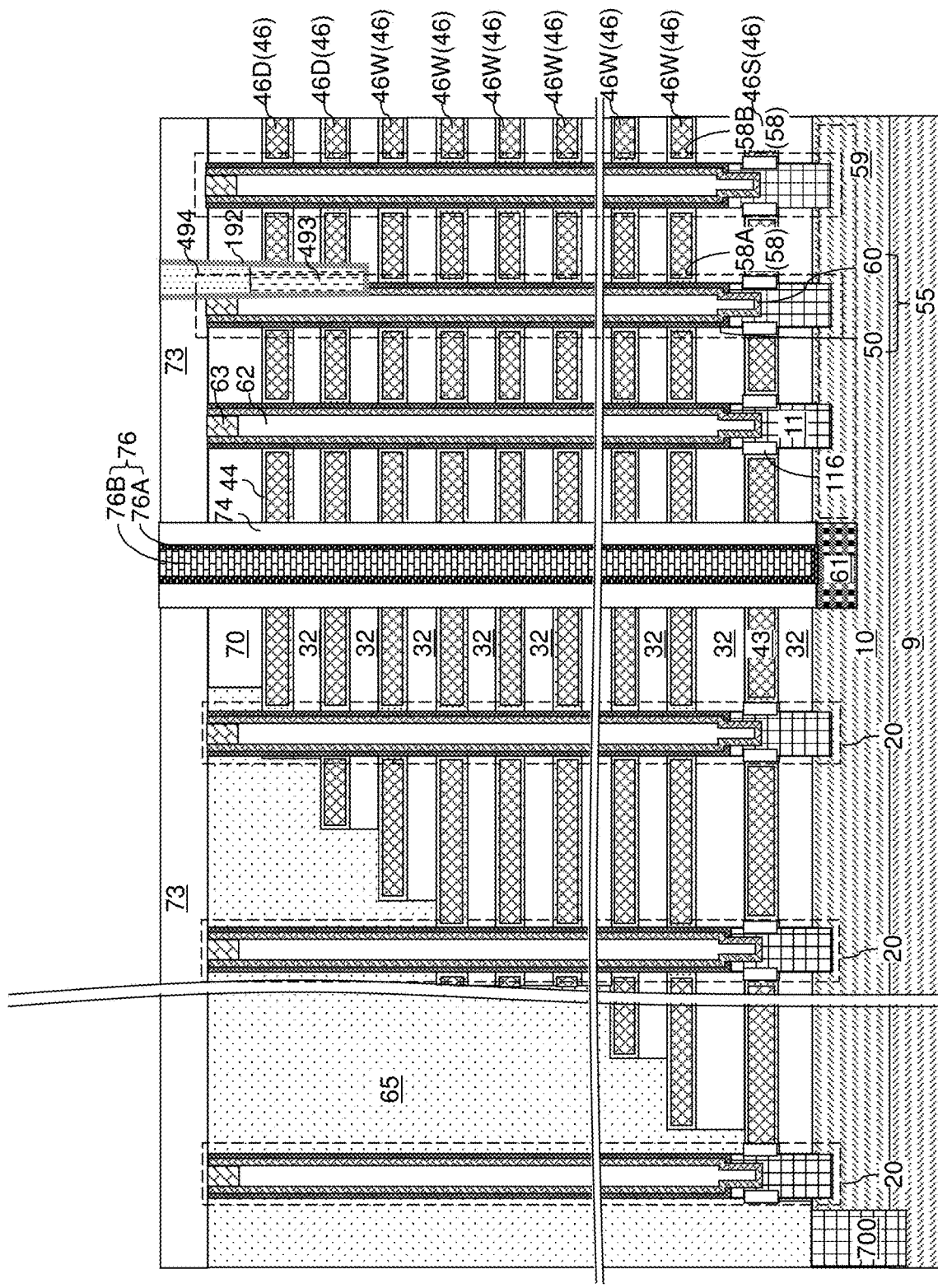
FIG. 45 is a schematic vertical cross-sectional view of the fifth exemplary structure after formation of a capping trench fill structure in each drain-select-level isolation trench according to the fifth embodiment of the present disclosure.

Referring to FIG. 45, a dielectric fill material 494 can be deposited over the sacrificial drain-select-level trench fill structure 493 within the remaining volumes of the drain-select-level isolation trenches 71. The dielectric fill material 494 comprises a material that is different from the material of the sacrificial drain-select-level trench fill structures 493, and may comprise silicon oxide (e.g., undoped silicate glass). A planarization process such as a chemical mechanical polishing (CMP) process can be performed to remove excess portions of the dielectric fill material from above the horizontal plane including the top surface of the first sacrificial pad layer 490. Optionally, remaining portions of the dielectric fill material may be vertically recessed below the horizontal plane including the top surface of the first sacrificial pad layer 490. Each remaining portion of the dielectric fill material constitutes a capping trench fill structure 494. In one embodiment, a combination of a dielectric liner 192 including silicon oxide, a sacrificial drain-select-level trench fill structure 493 including amorphous carbon, and a capping trench fill structure 494 including silicon oxide can be formed within each drain-select-level isolation trench 71. The first sacrificial pad layer 490 can be subsequently removed selective to the contact-level dielectric layer 73 and the capping trench fill structures 494.

Figure 46:
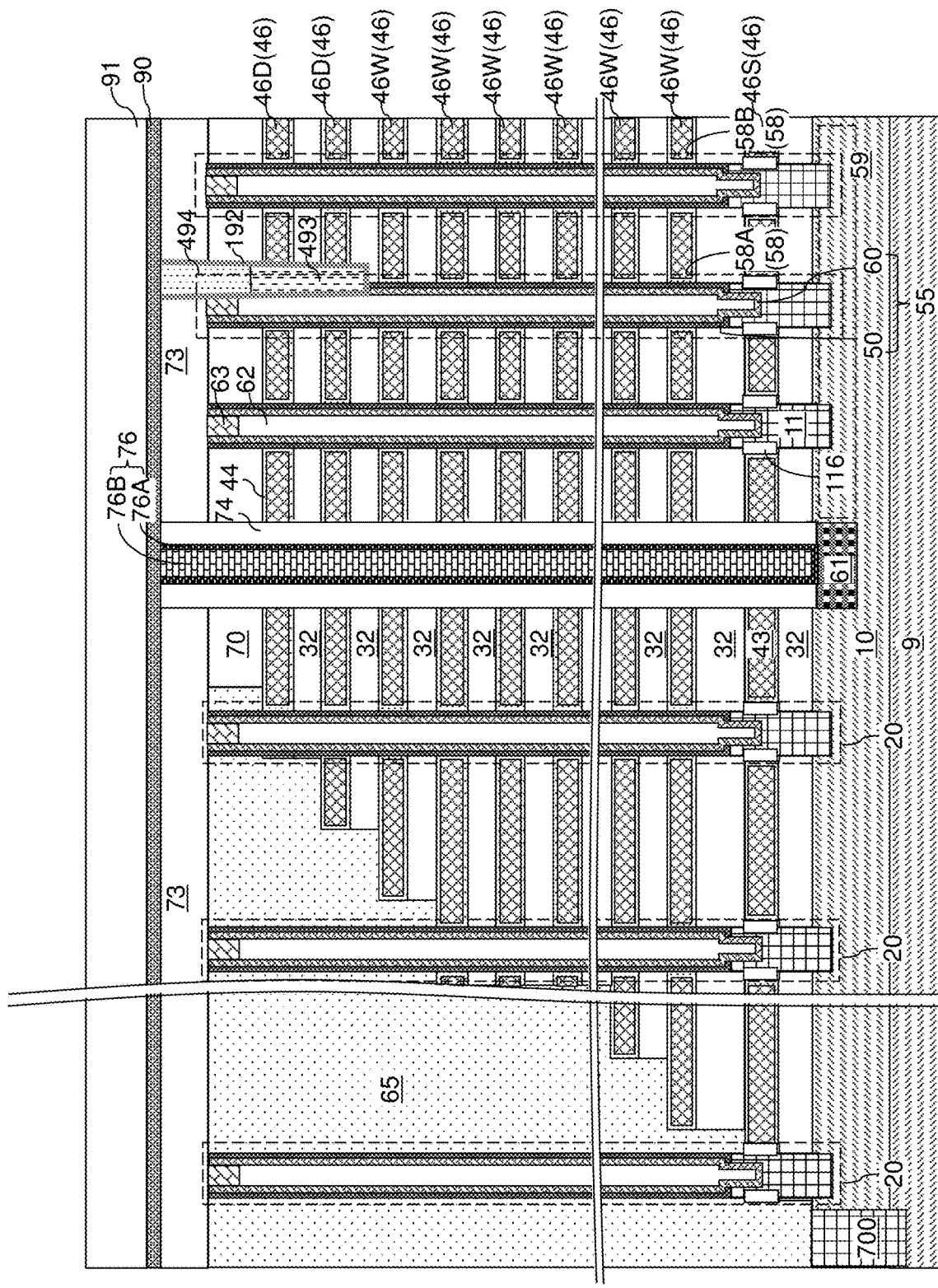
FIG. 46 is a schematic vertical cross-sectional view of the fifth exemplary structure after formation of a hard mask dielectric layer and a capping dielectric material layer according to the fifth embodiment of the present disclosure.

Referring to FIG. 46, a hard mask dielectric layer 90 and a capping dielectric material layer 91 can be deposited over the contact-level dielectric layer 73. The hard mask dielectric layer 90 includes a dielectric material such as silicon nitride, silicon oxynitride, silicon carbide, silicon carbide nitride, or a stack thereof. The thickness of the hard mask dielectric layer 90 may be in a range from 10 nm to 100 nm, although lesser and greater thicknesses may also be employed. In an alternative embodiment, if the first sacrificial pad layer 490 is not removed at the processing steps of FIG. 45, and then it may be employed as the hard mask dielectric layer 90. The capping dielectric material layer 91 includes a dielectric material such as silicon oxide. The thickness of the capping dielectric material layer 91 may be in a range from 100 nm to 600 nm, although lesser and greater thicknesses may also be employed.

Figure 47:
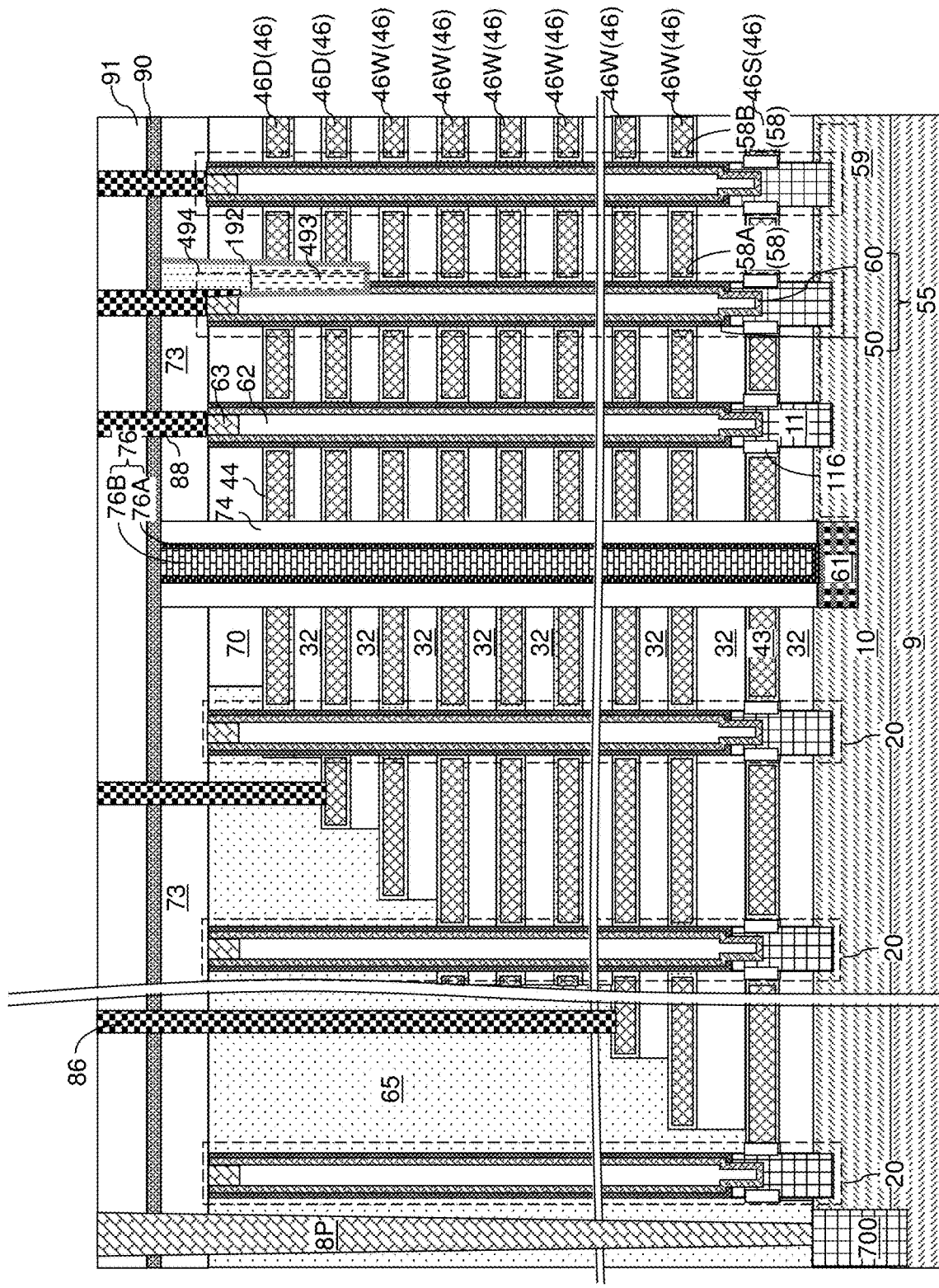
FIG. 47 is a schematic vertical cross-sectional view of the fifth exemplary structure after formation of contact via structures according to the fifth embodiment of the present disclosure.

Referring to FIG. 47, a photoresist layer (not shown) can be applied over the capping dielectric material layer 91, and can be lithographically patterned to form opening in areas of the drain regions 63, areas of the stepped surfaces of the electrically conductive layers 46, and areas of electrical nodes of the at least one semiconductor devices 700. An anisotropic etch process can be performed to etch unmasked portions of the capping dielectric material layer 91, the hard mask dielectric layer 90, and the contact-level dielectric layer 73 and underlying dielectric material portions, if any, thereby forming various via cavities. The drain regions 63, the electrically conductive layers 46, and the electrical nodes of the at least one semiconductor device 700 may be employed as etch stop structures for the anisotropic etch process. In some embodiments, at least one of the via cavities extending to a drain region 63 may have a non-zero overlay variation, and may etch into a portion of a capping trench fill structures 494 and physically expose a sidewall of a first memory opening fill structure 58A such as a sidewall of a drain region 63. In one embodiment, a portion of a dielectric liner 192 may be collaterally recessed in case one of the via cavities overlying a drain region 63 protrudes downward below the top surface of the drain region 63. The photoresist layer can be subsequently removed, for example, by ashing.

At least one conductive material can be conformally deposited in the various via cavities. For example, the at least one conductive material may include a metallic barrier liner including a conductive metallic nitride (e.g., TiN, TaN, or WN) or a conductive metallic carbide (TiC, TaC, or WC), and a metallic fill material such as W, Ti, Ta, Mo, Ru, Co, Cu, etc. Excess portions of the at least one conductive material can be removed from above the horizontal plane including the top surface of the capping dielectric material layer 91 by a planarization process, which may include a chemical mechanical polishing process and/or a recess etch process. Each remaining portion of the at least one conductive material contacting a respective one of the drain regions 63 constitutes a drain region 88. Each remaining portion of the at least one conductive material contacting a respective one of the electrically conductive layers 46 constitutes a layer contact via structure 86. Peripheral device contact via structures 8P can be formed through the retro-stepped dielectric material portion 65 directly on respective nodes of the at least one semiconductor device 700. The drain contact via structures 88 can be formed through the capping dielectric material layer 91, the hard mask dielectric layer 90, and the contact-level dielectric layer 73 on top surfaces of the drain regions 63. In one embodiment, a subset of the drain contact via structures comprises a respective vertically straight and laterally convex sidewall that contacts a vertically straight and laterally concave sidewall segment of the drain-select-level isolation structure.

In one embodiment, one of the drain contact via structures 88 may comprise a bottom surface contacting a top surface of one of the drain regions 63 and a downward-protruding portion contacting a planar sidewall of the one of the drain regions 63 of one of the first memory opening fill structures 58A. The downward-protruding portion protrudes downward from a horizontal plane including the top surfaces of the drain regions 63 and contacts a sidewall of one of the drain regions 62, and the downward-protruding portion may contact a recessed surface of the dielectric liner 192.

Figure 48A:
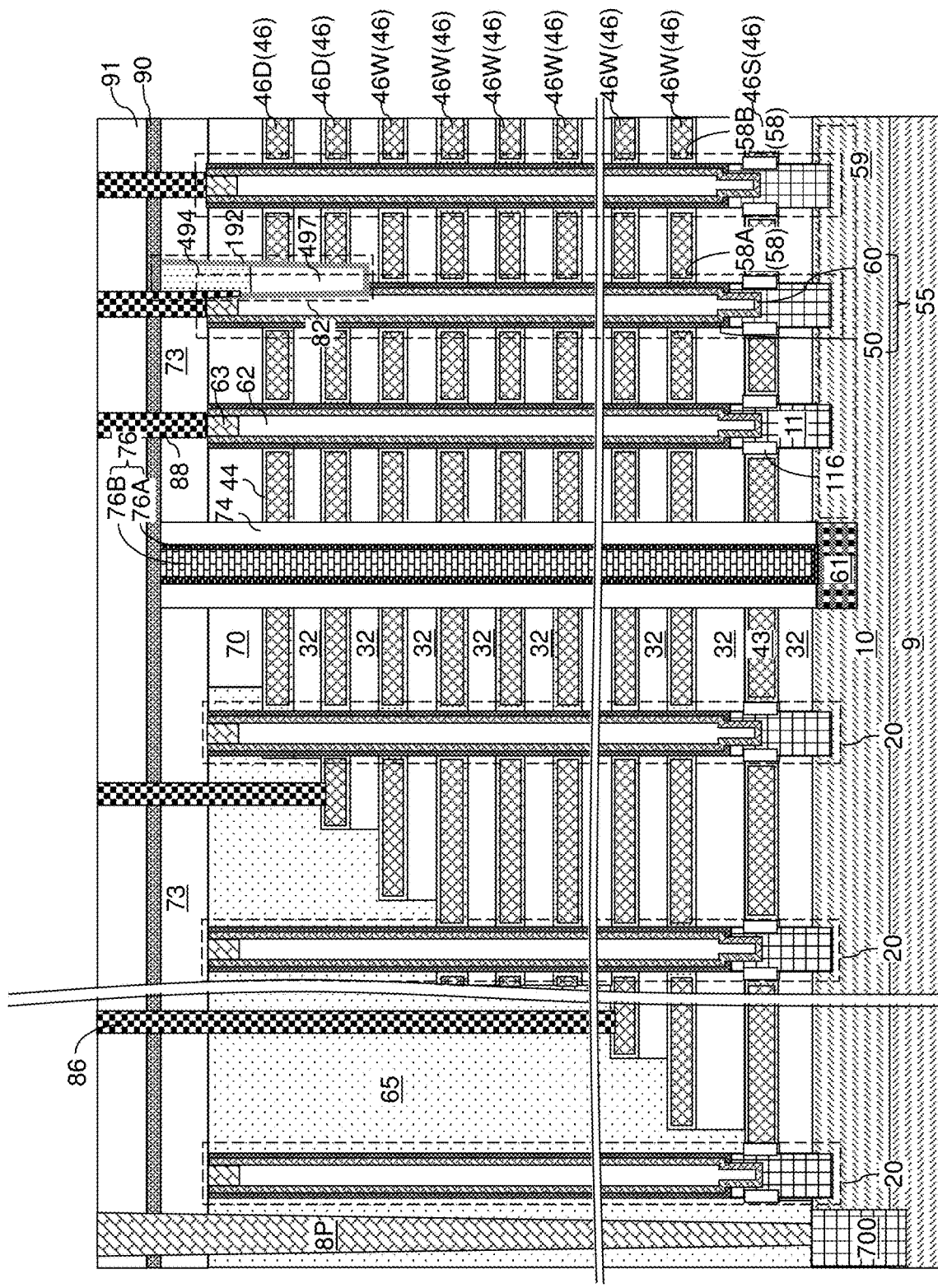
FIG. 48A is a schematic vertical cross-sectional view of the fifth exemplary structure after formation of access cavities, removal of the sacrificial drain-select-level trench fill structures, and deposition of dielectric plugs according to the fifth embodiment of the present disclosure.
Figure 48B:
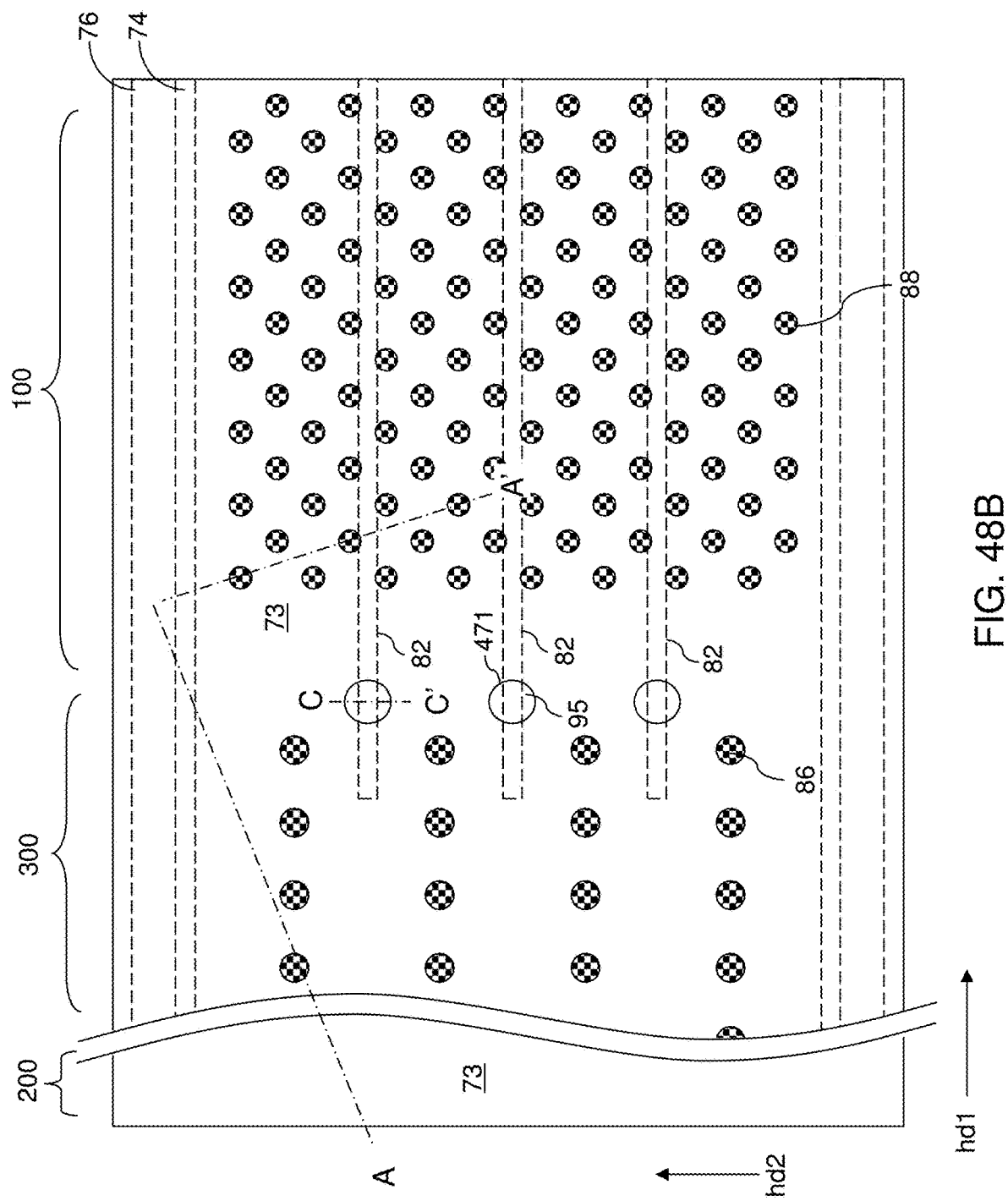
FIG. 48B is a top-down view of the fifth exemplary structure of FIG. 48A. The vertical plane A-A' is the plane of the schematic vertical cross-sectional view of FIG. 48A.
Figure 48C:
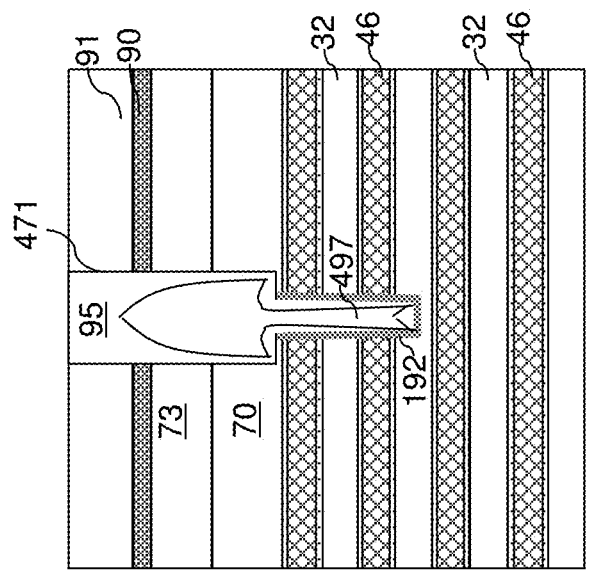
FIG. 48C is a vertical cross-sectional view of a region of the fifth exemplary structure along the vertical plane C-C' of FIG. 48B.

Referring to FIGS. 48A-48C, access via cavities 471 can be formed through the capping dielectric material layer 91 and through a portion of the capping trench fill structures 494 (which includes a dielectric fill material), for example, by applying a photoresist layer over the capping dielectric material layer 91, by lithographically patterning the photoresist layer to form openings therein, and by transferring the pattern of the openings in the photoresist layer through the capping dielectric material layer 91, the hard mask dielectric layer 90, and the capping trench fill structures 494. Surfaces of the sacrificial drain-select-level trench fill structures 493 can be physically exposed at the bottom of each access via cavity.

The material of the sacrificial drain-select-level trench fill structures 493 can be subsequently isotropically removed underneath the capping trench fill structures 494 through the access via cavities 471. For example, if the sacrificial drain-select-level trench fill structures 493 comprise amorphous carbon, an ashing process can be performed, in which oxygen can be provided into the access via cavities 471 and can oxidize and volatilize the amorphous carbon of the sacrificial drain-select-level trench fill structures 493 in an ashing process. Alternatively, if the sacrificial drain-select-level trench fill structures 493 comprise borosilicate glass or organosilicate glass, a wet etch process employing dilute hydrofluoric acid or a dry etch employing HF vapor can be performed through the access via cavities 471 to etch the material of the sacrificial drain-select-level trench fill structures 493 selective to the materials of the capping dielectric material layer 91, the hard mask dielectric layer 90, and the capping trench fill structures 494. Generally, an isotropic etch process or an ashing process can be performed to remove the sacrificial fill material of the sacrificial drain-select-level trench fill structures 493 selective to the dielectric fill material of the capping trench fill structures 494 by introducing an etchant or an oxidant through the access via cavities 471.

A dielectric material such as silicon oxide can be anisotropically deposited in the access via cavities to form dielectric plugs 95. An encapsulated cavity (i.e., air gap) 497 can be formed in each volume from which a sacrificial drain-select-level trench fill structure 493 is removed and is not filled with the dielectric material of the dielectric plugs 95. In one embodiment, each encapsulated cavity 497 may underlie a dielectric fill material portion (comprising the capping trench fill structure 494), and may comprise a boundary that coincides within an inner sidewall of a dielectric liner 192 as illustrated in FIG. 48A. A contiguous combination of a dielectric liner 192, a capping trench fill structure 494, and an encapsulated cavity 497 constitutes a drain-select-level isolation structure 82, which has an effective dielectric constant that is less than 3.9.

Figure 49:
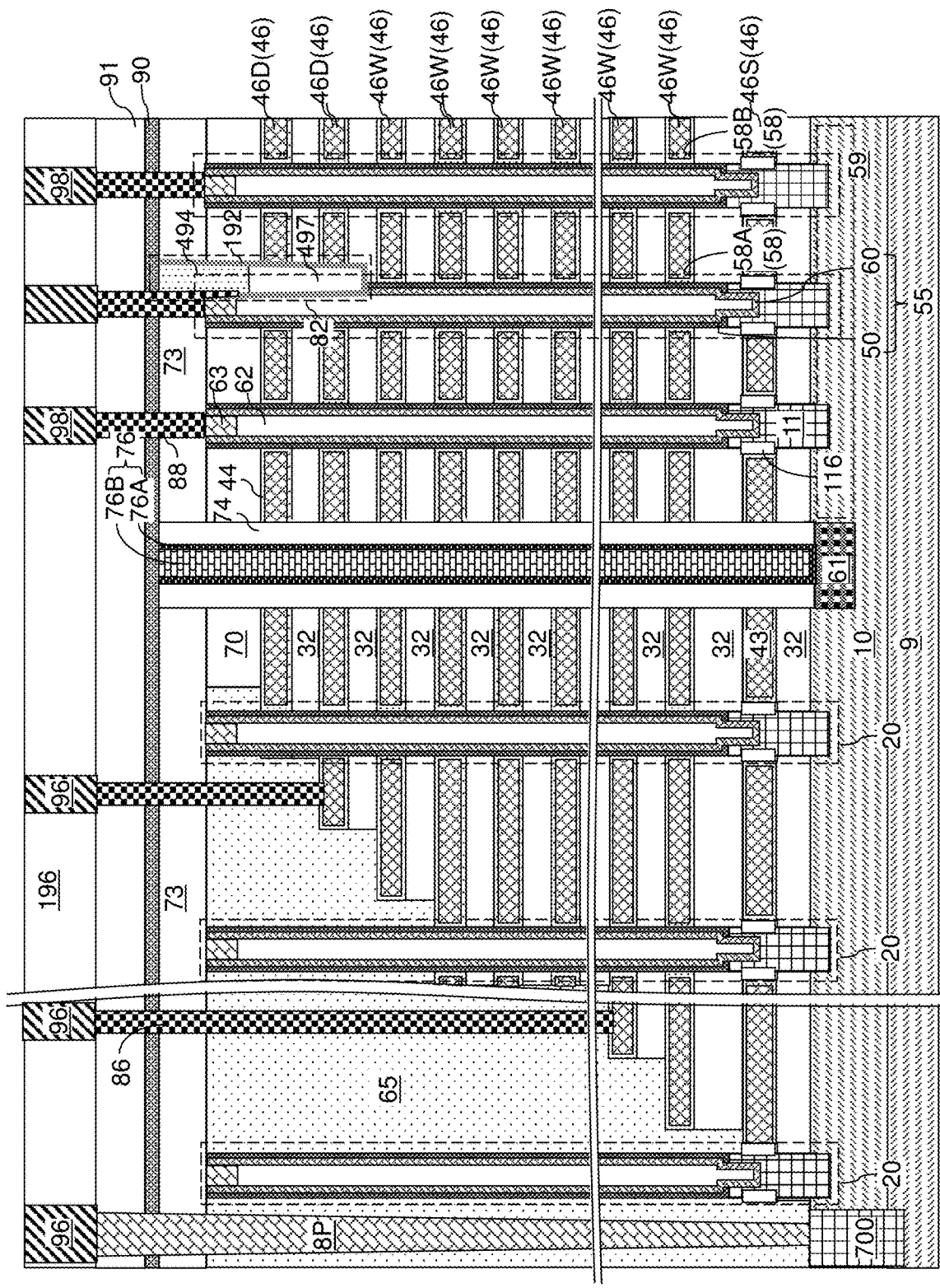
FIG. 49 is a schematic vertical cross-sectional view of the fifth exemplary structure after formation of a line-level dielectric layer and metal line structures according to the fifth embodiment of the present disclosure.

Referring to FIG. 49, a line-level dielectric layer 196 can be deposited over the capping dielectric material layer 91. Metal line structures (98, 96) can be formed in the line-level dielectric layer on a top surface of a respective one of the contact via structures (88, 86, 8P). The metal line structures (98, 96) may include, for example, bit lines 98 contacting a respective subset of the drain contact via structures 88 and laterally extending along the second horizontal direction hd2. Further, the metal line structures (98, 96) may include interconnection metal lines 96 that are formed on a respective subset of the layer contact via structures 86 and the peripheral device contact via structures 8P.

Referring to all drawings and according to various embodiments of the present disclosure, a three-dimensional memory device is provided, which comprises: an alternating stack of insulating layers 32 and electrically conductive layers 46 located over a substrate (9, 10), wherein the electrically conductive layers 46 comprise word-line-level electrically conductive layers 46W and drain-select-level electrically conductive layers 46D overlying the word-line-level electrically conductive layers 46W; an array of memory opening fill structures 58 located within an array of memory openings 49 vertically extending through the alternating stack (32, 46); and a drain-select-level isolation structure 82 vertically extending through the drain-select-level electrically conductive layers 46D and having an effective dielectric constant that is less than 3.9, wherein: the array of memory opening fill structures 58 comprises two rows of first memory opening fill structures 58A that are arranged along a first horizontal direction hd1; and each of the first memory opening fill structures 58A comprises a respective planar straight sidewall in contact with a respective portion of a pair of straight sidewalls of the drain-select-level isolation structure 82.

In one embodiment, the respective planar straight sidewall of each of the first memory opening fill structures 58A is in direct contact with a dielectric material of the respective portion of the pair of straight sidewalls of the drain-select-level isolation structure 82, and the respective planar straight sidewall of each of the first memory opening fill structures 58A does not contact an electrically conductive material at the levels of the drain-select-level electrically conductive layers 46D.

In one embodiment, each of the first memory opening fill structures 58A comprises a respective cylindrical outer sidewall vertically extending through each of the word-line-level electrically conductive layers 46W. In one embodiment, the drain-select-level isolation structure 82 does not vertically extend through the word-line-level electrically conductive layers 46W.

In one embodiment, the three-dimensional memory device comprises: a contact-level dielectric layer 73 overlying the alternating stack (32, 46) and the array of memory opening fill structures 58; and drain contact via structures 88 vertically extending through the contact-level dielectric layer 73 and contacting a top surface of a respective one of the memory opening fill structures 58.

In one embodiment, the three-dimensional memory device comprises: a first backside trench fill structure (74, 76) laterally extending along the first horizontal direction hd1 and contacting first sidewalls of each layer within the alternating stack (32, 46); and a second backside trench fill structure (74, 76) laterally extending along the first horizontal direction hd1 and laterally spaced from the first backside trench fill structure (74, 76) and contacting second sidewalls of each layer within the alternating stack (32, 46), wherein top surfaces of the first backside trench fill structure (74, 76) and the second backside trench fill structure (74, 76) are located within a horizontal plane including a top surface of the contact-level dielectric layer 73.

In one embodiment, the drain contact via structures 88 protrude above the horizontal plane including the top surface of the contact-level dielectric layer 73. In one embodiment, the three-dimensional memory device comprises a capping dielectric material layer (80, 194) comprising a horizontally-extending portion that overlies the top surface of the contact-level dielectric layer 73, wherein the drain-select-level isolation structure 82 comprises a vertically-extending portion of the capping dielectric material layer (80, 194).

In one embodiment, top surfaces of the drain contact via structures 88 are located within a horizontal plane including a top surface of the capping dielectric material layer 80. In one embodiment, a subset of the drain contact via structures 88 comprises a respective vertically straight and laterally convex sidewall that contacts a vertically straight and laterally concave sidewall segment of the drain-select-level isolation structure 82. In one embodiment, one of the drain contact via structures 88 comprises a bottom surface contacting a top surface of one of the drain regions 63 and a downward-protruding portion contacting a planar sidewall of the one of the drain regions 63.

In one embodiment, the drain-select-level isolation structure 82 comprises an air gap 197 encapsulated by a dielectric material portion of the capping dielectric material layer (80, 194). In one embodiment, the capping dielectric material layer 80 comprises organosilicate glass.

In one embodiment, top surfaces of the drain contact via structures 88 are located below a horizontal plane including a top surface of the capping dielectric material layer (80, 194) and above a horizontal plane including the top surface of the contact-level dielectric layer 73. In one embodiment, the capping dielectric material layer (80, 194) embeds an air gap including a lower portion located within the drain-select-level isolation structure 82 and an upper portion located above the horizontal plane including the top surface of the contact-level dielectric layer 73. In another embodiment shown in FIGS. 16A-16C, the entire drain-select-level isolation structure 82 consists essentially of a solid dielectric material having the effective dielectric constant that is less than 3.9.

According to another aspect of the present disclosure, a three-dimensional memory device is provided, which comprises: an alternating stack of insulating layers 32 and electrically conductive layers 46 located over a substrate (9, 10), wherein the electrically conductive layers 46 comprise word-line-level electrically conductive layers 46W and drain-select-level electrically conductive layers 46D overlying the word-line-level electrically conductive layers 46W; an array of memory opening fill structures 58 located within an array of memory openings 49 vertically extending through the alternating stack (32, 46); and a drain-select-level isolation structure 82 vertically extending through the drain-select-level electrically conductive layers 46D between two rows of memory opening fill structures 58 of the array of memory opening structures 58 and laterally extending along a first horizontal direction hd1, and comprising a dielectric liner 192, a dielectric fill material portion (comprising a portion of a capping dielectric material layer 194 or as a capping trench fill structure 494) contained within the dielectric liner 192, and an air gap (197, 497).

In one embodiment, each of the memory opening fill structures 58 comprises a respective vertical semiconductor channel 60, a respective memory film 50, and a respective drain region 63 contacting a top end of the respective vertical semiconductor channel 60.

In one embodiment, the three-dimensional memory device comprises: a contact-level dielectric layer 73 overlying the alternating stack (32, 46) and the array of memory opening fill structures 58; and drain contact via structures 88 vertically extending through the contact-level dielectric layer 73 and contacting a top surface of a respective one of the drain regions 63.

In one embodiment, the three-dimensional memory array comprises: a first backside trench fill structure (74, 76) laterally extending along the first horizontal direction hd1 and contacting first sidewalls of each layer within the alternating stack (32, 46); and a second backside trench fill structure (74, 76) laterally extending along the first horizontal direction hd1 and laterally spaced from the first backside trench fill structure (74, 76) and contacting second sidewalls of each layer within the alternating stack (32, 46), wherein top surfaces of the first backside trench fill structure (74, 76) and the second backside trench fill structure (74, 76) are located within a horizontal plane including a top surface of the contact-level dielectric layer 73. In one embodiment, the drain contact via structures 88 protrude above the horizontal plane including the top surface of the contact-level dielectric layer 73. In one embodiment, the three-dimensional memory device comprises a capping dielectric material layer 194 comprising a horizontally-extending portion that overlies the top surface of the contact-level dielectric layer 73, wherein the dielectric fill material portion comprises a vertically-extending portion of the capping dielectric material layer 194.

In one embodiment, top surfaces of the drain contact via structures 88 are located below a horizontal plane including a top surface of the capping dielectric material layer 194. In one embodiment, the air gap 197 comprises an additional volume embedded within the horizontally-extending portion of the capping dielectric material layer 194 and connected to the volume of the air gap 197 within the drain-select-level isolation structure 82.

In one embodiment, the three-dimensional memory device comprises a hard mask dielectric layer 90 located between the contact-level dielectric layer 73 and the capping dielectric material layer (194, 91), wherein the dielectric liner 192 contacts a sidewall of the hard mask dielectric layer 90. the capping dielectric material layer contacts a top surface of the hard mask dielectric layer 90.

In one embodiment, the dielectric liner 192 comprises a top surface contacting a bottom surface of the horizontally-extending portion of the capping dielectric material layer 194. In one embodiment, one of the drain contact via structures 88 comprises a downward-protruding portion that protrudes downward from a horizontal plane including the top surfaces of the drain regions 63 and contacts a sidewall of one of the drain regions 63; and the downward-protruding portion contacts a recessed surface of the dielectric liner 192.

In one embodiment, the air gap 197 is laterally surrounded by the dielectric fill material portion, and is spaced from the dielectric liner 192 by the dielectric fill material portion.

In one embodiment, the air gap 497 underlies the dielectric fill material portion (as embodied as the capping trench fill structure 494) and comprises a boundary that coincides within an inner sidewall of the dielectric liner 192.

In one embodiment, the memory opening fill structures 58 within the two rows of memory opening fill structures 58 comprise a respective planar straight sidewall in contact with a respective portion of a pair of straight sidewalls of the drain-select-level isolation structure 82.

The various embodiments of the present disclosure provide drain-select-level isolation structures 82 having an effective dielectric constant that is less than 3.9. Nearest neighbor interference from adjacent drain-select-level electrically conductive layers 46D on vertical semiconductor channels 60 can be minimized due to the low effective dielectric constant of the drain-select-level isolation structures 82. The low-k isolation structures 82 also reduce capacitance between adjacent contact via structures 88. Finally, the liner 192 prevents or reduces the openings 87 from exposing the air gaps 197 during the processing, which prevents or reduces the likelihood that the contact via structures 88 will fill the air gaps 197.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate, wherein the electrically conductive layers comprise word-line-level electrically conductive layers and drain-select-level electrically conductive layers overlying the word-line-level electrically conductive layers;
    an array of memory opening fill structures located within an array of memory openings vertically extending through the alternating stack; and
    a drain-select-level isolation structure vertically extending through the drain-select-level electrically conductive layers between two rows of memory opening fill structures of the array of memory opening structures and laterally extending along a first horizontal direction, and comprising a dielectric liner, a dielectric fill material portion contained within the dielectric liner, and an air gap.

2. The three-dimensional memory device of claim 1, wherein each of the memory opening fill structures comprises a respective vertical semiconductor channel, a respective memory film, and a respective drain region contacting a top end of the respective vertical semiconductor channel.

3. The three-dimensional memory device of claim 2, further comprising:
    a contact-level dielectric layer overlying the alternating stack and the array of memory opening fill structures; and
    drain contact via structures vertically extending through the contact-level dielectric layer and contacting a top surface of a respective one of the drain regions.

4. The three-dimensional memory array of claim 3, further comprising:
    a first backside trench fill structure laterally extending along the first horizontal direction and contacting first sidewalls of each layer within the alternating stack; and
    a second backside trench fill structure laterally extending along the first horizontal direction and laterally spaced from the first backside trench fill structure and contacting second sidewalls of each layer within the alternating stack,
    wherein top surfaces of the first backside trench fill structure and the second backside trench fill structure are located within a horizontal plane including a top surface of the contact-level dielectric layer.

5. The three-dimensional memory device of claim 4, wherein the drain contact via structures protrude above the horizontal plane including the top surface of the contact-level dielectric layer.

6. The three-dimensional memory device of claim 3, further comprising a capping dielectric material layer comprising a horizontally-extending portion that overlies the top surface of the contact-level dielectric layer, wherein the dielectric fill material portion comprises a vertically-extending portion of the capping dielectric material layer.

7. The three-dimensional memory device of claim 6, wherein top surfaces of the drain contact via structures are located below a horizontal plane including a top surface of the capping dielectric material layer.

8. The three-dimensional memory device of claim 6, wherein the air gap comprises an additional volume embedded within the horizontally-extending portion of the capping dielectric material layer and connected to the volume of the air gap within the drain-select-level isolation structure.

9. The three-dimensional memory device of claim 6, further comprising a hard mask dielectric layer located between the contact-level dielectric layer and the capping dielectric material layer, wherein the dielectric liner contacts a sidewall of the hard mask dielectric layer.

10. The three-dimensional memory device of claim 9, wherein the capping dielectric material layer contacts a top surface of the hard mask dielectric layer.

11. The three-dimensional memory device of claim 6, wherein the dielectric liner comprises a top surface contacting a bottom surface of the horizontally-extending portion of the capping dielectric material layer.

12. The three-dimensional memory device of claim 1, wherein the air gap is laterally surrounded by the dielectric fill material portion, and is spaced from the dielectric liner by the dielectric fill material portion.

13. The three-dimensional memory device of claim 1, wherein the air gap underlies the dielectric fill material portion and comprises a boundary that coincides within an inner sidewall of the dielectric liner.

14. The three-dimensional memory device of claim 1, wherein the memory opening fill structures within the two rows of memory opening fill structures comprise a respective planar straight sidewall in contact with a respective portion of a pair of straight sidewalls of the drain-select-level isolation structure.

\* \* \* \* \*